(12) United States Patent
Kamino et al.

(10) Patent No.: US 10,115,751 B2
(45) Date of Patent: Oct. 30, 2018

(54) SEMICONDUCTOR DEVICE

(71) Applicant: Renesas Electronics Corporation, Tokyo (JP)

(72) Inventors: Takeshi Kamino, Ibaraki (JP); Yotaro Goto, Ibaraki (JP)

(73) Assignee: Renesas Electronics Corporation, Koutou-ku, Tokyo (JP)

( * ) Notice: Subject to any disclaimer, the term of this patent is extended or adjusted under 35 U.S.C. 154(b) by 0 days.

(21) Appl. No.: 15/365,344

(22) Filed: Nov. 30, 2016

(65) Prior Publication Data

US 2017/0213862 A1 Jul. 27, 2017

(30) Foreign Application Priority Data

Jan. 22, 2016 (JP) .................................. 2016-010987

(51) Int. Cl.
*H01L 27/146* (2006.01)

(52) U.S. Cl.
CPC .... *H01L 27/14605* (2013.01); *H01L 27/1463* (2013.01); *H01L 27/14636* (2013.01); *H01L 27/14643* (2013.01)

(58) Field of Classification Search
CPC .................................................. H01L 27/4605
USPC ......................................................... 257/231
See application file for complete search history.

(56) References Cited

U.S. PATENT DOCUMENTS

| 8,779,482 | B2 | 7/2014 | Yamaguchi | |
| 2006/0033129 | A1* | 2/2006 | Mouli | H01L 27/14609 257/291 |
| 2008/0153193 | A1* | 6/2008 | Lyu | H01L 27/14603 438/59 |
| 2014/0319588 | A1* | 10/2014 | Yamaguchi | H01L 31/0352 257/292 |

FOREIGN PATENT DOCUMENTS

JP     2014-007316 A     1/2014

* cited by examiner

*Primary Examiner* — Moazzam Hossain
*Assistant Examiner* — Warren H Kilpatrick
(74) *Attorney, Agent, or Firm* — Sughrue Mion, PLLC

(57) ABSTRACT

An improvement is achieved in the performance of a semiconductor device. A semiconductor device includes a pixel including a first active region where a photodiode and a transfer transistor are formed and a second active region for supplying a grounding potential. Over a p-type semiconductor region in the second active region, a plug for supplying the grounding potential is disposed. In an n-type semiconductor region for a drain region of the transfer transistor formed in the first active region, a gettering element is introduced. However, in the p-type semiconductor region in the second active region, the gettering element is not introduced.

20 Claims, 45 Drawing Sheets

SEMICONDUCTOR DEVICE

CROSS-REFERENCE TO RELATED APPLICATIONS

The disclosure of Japanese Patent Application No. 2016-010987 filed on Jan. 22, 2016 including the specification, drawings and abstract is incorporated herein by reference in its entirety.

BACKGROUND

The present invention relates to a semiconductor device and can be used appropriately for, e.g., a semiconductor device including a solid-state image sensing element.

As a solid-state image sensing element, a solid-state image sensing element (CMOS image sensor) using a CMOS (Complementary Metal Oxide Semiconductor) has been intensively developed. The CMOS image sensor is comprised of a plurality of pixels each having a photodiode and a transfer transistor.

Japanese Unexamined Patent Publication No. 2014-7316 describes the placement of a gettering region in an active region where a contact portion to which a grounding potential is applied is disposed in a CMOS image sensor.

RELATED ART DOCUMENT

Patent Document

[Patent Document 1] Japanese Unexamined Patent Publication No. 2014-7316

SUMMARY

There has been a semiconductor device having a photoelectric conversion element and it is desired that even such a semiconductor device shall have maximally improved performance.

Other problems and novel features of the present invention will become apparent from a statement in the present specification and the accompanying drawings.

According to an embodiment, a semiconductor device includes a pixel including a first active region where a photodiode and a transfer transistor are formed and a second active region for supplying a grounding potential. Over a p-type semiconductor region in the second active region, a metal silicide layer is formed and, over the metal silicide layer, a contact portion for supplying the grounding potential is disposed. In an n-type semiconductor region for a drain region of the transfer transistor formed in the first active region, a gettering element is introduced. However, in the p-type semiconductor region in the second active region, the gettering element is not introduced.

Alternatively, according to the embodiment, the semiconductor device includes a pixel including a first active region where a photodiode and a transfer transistor are formed, a second active region for supplying a grounding potential, and a third active region where a pixel transistor is formed. Over a p-type semiconductor region in the second active region, a metal silicide layer is formed and, over the metal silicide layer, a contact portion for supplying the grounding potential is disposed. In an n-type semiconductor region for a source or drain region of the pixel transistor formed in the third active region, a gettering element is introduced. However, in the p-type semiconductor region in the second active region, the gettering element is not introduced.

According to the embodiment, it is possible to improve the performance of the semiconductor device.

DETAILED DESCRIPTION

Figure 1:
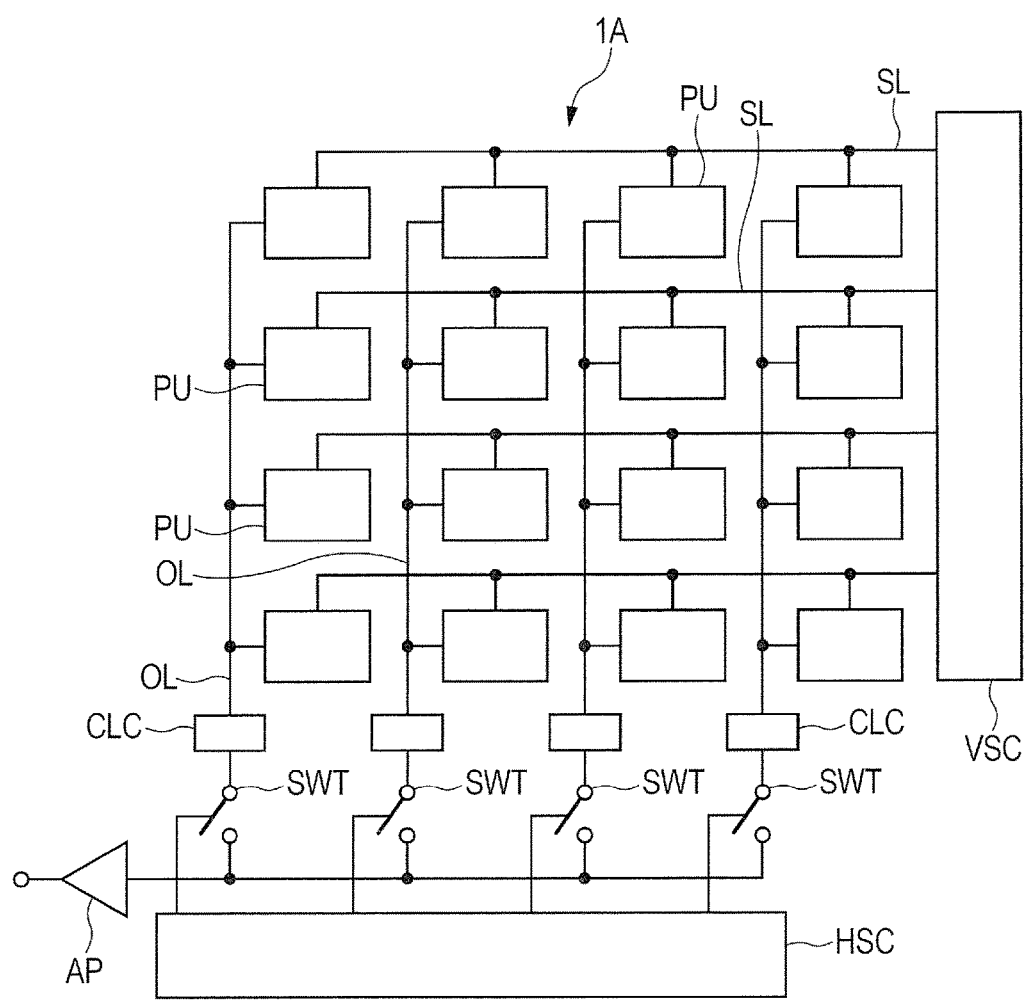
FIG. 1 is a circuit block diagram showing an example of a configuration of a semiconductor device in an embodiment.

In each of the following embodiments, if necessary for the sake of convenience, the embodiment will be described by being divided into a plurality of sections or embodiments. However, they are by no means irrelevant to each other unless particularly explicitly described otherwise, but are in relations such that one of the sections or embodiments is a modification, details, supplementary explanation, and so forth of part or the whole of the others. Also, in the following embodiments, when the number and the like (including the number, numerical value, amount, range, and the like) of elements are referred to, they are not limited to specific numbers unless particularly explicitly described otherwise or unless they are obviously limited to specific numbers in principle. The number and the like of the elements may be not less than or not more than specific numbers. Also, in the following embodiments, it goes without saying that the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are referred to in the following embodiments, the shapes and the like are assumed to include those substantially proximate or similar thereto and the like unless particularly explicitly described otherwise or unless it can be considered that they obviously do not in principle. The same shall apply in regard to the foregoing numerical value and range.

The following will describe the embodiments in detail on the basis of the drawings. Note that, throughout all the drawings for illustrating the embodiments, members having the same functions are designated by the same reference numerals, and a repeated description thereof is omitted. In the following embodiments, a description of the same or like parts will not be repeated in principle unless particularly necessary.

In the drawings used in the embodiments, hatching may be omitted even in a cross section for improved clarity of illustration, while even a plan view may be hatched for improved clarity of illustration.

Embodiment 1

Referring to the drawings, a detailed description will be given of a structure of a semiconductor device in Embodiment 1 and the manufacturing process thereof. In Embodiment 1, a description will be given of an example in which the semiconductor device is a CMOS image sensor as a top-illuminated image sensor in which light is incident on the top surface of a semiconductor substrate.

<Configuration of Semiconductor Device>

Figure 2:
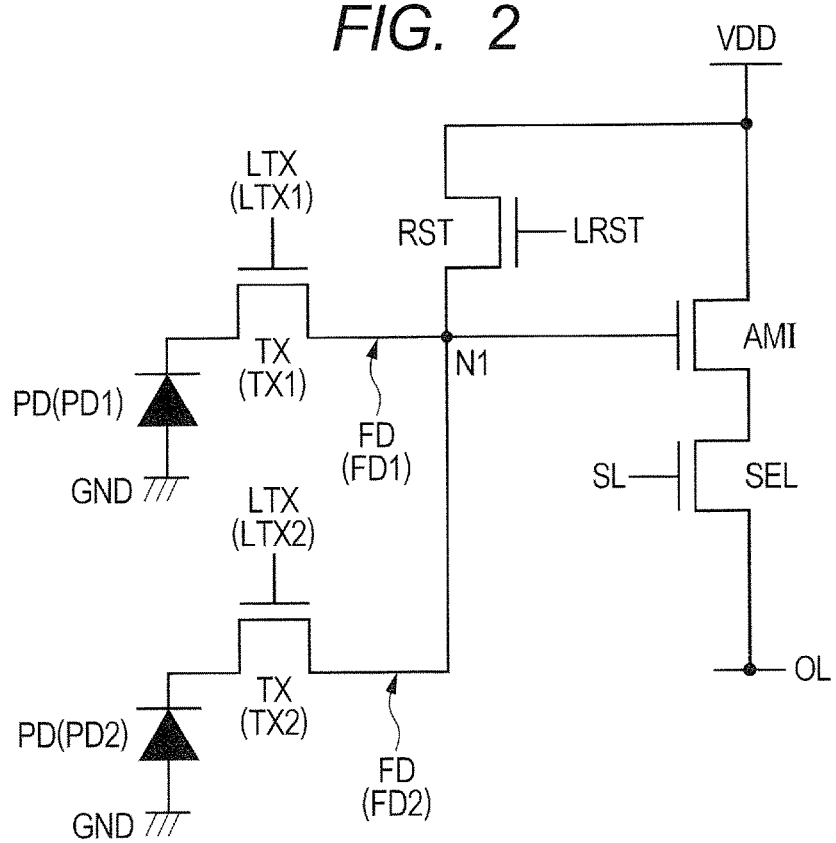
FIG. 2 is a circuit diagram showing an example of a configuration of a pixel.

FIG. 1 is a circuit block diagram showing an example of a configuration of the semiconductor device in Embodiment 1. FIG. 2 is a circuit diagram showing an example of a configuration of a pixel. FIG. 1 shows 16 pixels arranged in the form of an array (a matrix) of 4 rows and 4 columns (4×4), but the respective numbers of the rows and the columns in which the pixels are arranged are not limited thereto and can variously be changed. For example, the number of the pixels actually used in an electronic device such as a camera may be several millions.

In a pixel region 1A shown in FIG. 1, a plurality of pixels PU are arranged in the form of an array. Around the pixels PU, drive circuits such as a vertical scanning circuit VSC and a horizontal scanning circuit HSC are disposed. The pixels (cells or pixel units) PU are disposed at respective points of intersection of selection lines SL and output lines (output signal lines) OL. The selection lines SL are coupled to the vertical scanning circuit VSC. The output lines OL are coupled to respective column circuits CLC. The column circuits CLC are coupled to an output amplifier AP via switches SWT. Each of the switches SWT is coupled to the horizontal scanning circuit HSC and controlled by the horizontal scanning circuit HSC.

For example, an electric signal read from the pixel PU selected by the vertical scanning circuit VSC and the horizontal scanning circuit HSC is output via the output line OL and the output amplifier AP.

Figure 3:
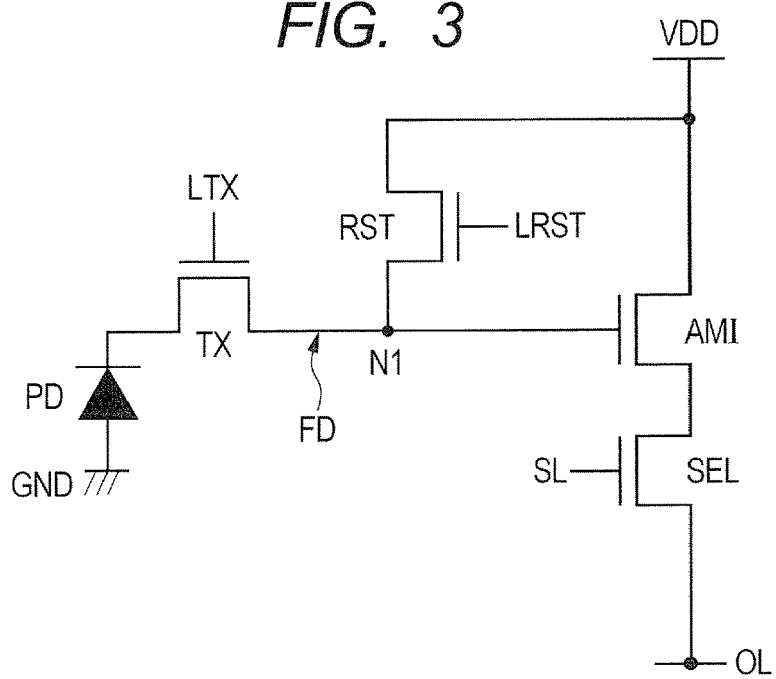
FIG. 3 is a circuit diagram showing another example of the configuration of the pixel.

As shown in, e.g., FIG. 2 or 3, each of the pixels PU includes a photodiode PD and transistors RST, TX, SEL, and AMI. These transistors RST, TX, SEL, and AMI are formed of respective n-channel MISFETs (Metal Insulator Semiconductor Field Effect Transistors). Among them, the transistor RST is a reset transistor (transistor for resetting), the transistor TX is a transfer transistor (transistor for transfer), the transistor SEL is selection transistor (transistor for selection), and the transistor AMI is an amplification transistor (transistor for amplification). Note that the transfer transistor TX is the transistor for transfer which transfers charges generated by the photodiode PD. The transfer transistor TX, the reset transistor RST, the selection transistor SEL, and the amplification transistor AMI are provided on a per-pixel basis and therefore can be regarded as pixel transistors (transistors for pixel). In addition to these transistors, another transistor or an element such as a capacitive element may also be included in the pixel PU. A form in which these transistors are coupled to each other has various modifications and applications.

FIG. 2 shows an example of a circuit configuration of the two pixels PU. That is, FIG. 2 shows the example of the circuit configuration of the total of two pixels PU including the pixel PU having a photodiode PD1 and the pixel PU having a photodiode PD2.

Note that FIG. 2 shows a circuit example in the case where the two pixels PU share the amplification transistor AMI, the selection transistor SEL, and the reset transistor RST. In this case, the one transfer transistor TX is provided for each one of the photodiodes PD while, a set of the amplification transistor AMI, the selection transistor SEL, and the reset transistor RST is provided for the two photodiodes PD (PD1 and PD2). The transfer transistor TX provided for the photodiode PD1 is a transfer transistor TX1, while the transfer transistor TX provided for the photodiode PD2 is a transfer transistor TX2.

In the circuit example shown in FIG. 2, between a grounding potential (GND) and a node N1, the photodiode PD1 and the transfer transistor TX1 are coupled in series to each other and, between the grounding potential (GND) and the node N1, the photodiode PD2 and the transfer transistor TX2 are coupled in series to each other. The grounding potential (GND) can also be regarded as a ground potential. Among the photodiodes (PD1 and PD2) and the transfer transistors (TX1 and TX2), the photodiodes (PD1 and PD2) are coupled to the grounding potential (GND) and the transfer transistors (TX1 and TX2) are coupled to the node N1. A series circuit including the photodiode PD1 and the transfer transistor TX1 and a series circuit including the photodiode PD2 and the transfer transistor TX2 are coupled in parallel to each other between the grounding potential (GND) and the node N1. That is, the photodiode PD1 is coupled to the common node N1 via the transfer transistor TX1, while the photodiode PD2 is coupled to the common node N1 via the transfer transistor TX2. The photodiode PD is a PN junction diode and includes, e.g., a plurality of n-type or p-type impurity diffusion regions (semiconductor regions).

Between the node N1 and a power supply potential (power supply potential line) VDD, the reset transistor RST is coupled. The power supply potential VDD is a potential in the power supply potential line. Between the power supply potential VDD and the output line (output signal line) OL, the selection transistor SEL and the amplification transistor AMI are coupled in series to each other. The amplification transistor AMI is coupled to the power supply potential VDD, while the selection transistor SEL is coupled to the output line OL. The gate electrode of the amplification transistor AMI is coupled to the node N1. The gate electrode of the reset transistor RST is coupled to a reset line LRST. The gate electrode of the selection transistor SEL is coupled to the selection line SL, while the gate electrode of the transfer transistor TX is coupled to a transfer line (second selection line) LTX. Note that the gate elect rode of the transfer transistor TX1 is coupled to a transfer line LTX1 and the gate electrode of the transfer transistor TX2 is coupled to a transfer line LTX2.

For example, the transfer lines LTX (LTX1 and LTX2) and the reset line LRST are raised (to a HIGH level) to bring the transfer transistors TX (TX1 and TX2) and the reset transistor RST into an ON state. As a result, charges are removed from the photodiodes PD (PD1 and PD2) to deplete the photodiodes PD. Consequently, the reset transistor RST functions to release the charges from the photodiodes PD. Then, the transfer transistors TX (TX1 and TX2) are brought into an OFF state.

Then, when the mechanical shutter of an electronic device such as, e.g., a camera is opened, charges are generated in the photodiodes PD (PD1 and PD2) from incident light and accumulated therein. That is, the photodiodes PD (PD1 and PD2) receive the incident light to generate charges.

Then, after the shutter is closed, the reset line LRST is lowered (to a LOW level) to bring the reset transistor ST into the OFF state. Furthermore, the selection line SL and the transfer line LTX1 are raised (to the HIGH level) to bring the selection transistor SEL and the transfer transistor TX1 into the ON state. As a result, the charges generated by the photodiode PD1 are transferred to the end portion (floating diffusion FD1) of the transfer transistor TX which is coupled to the node N1. At this time, the potential of the floating diffusion FD1 changes to a value corresponding to the charges transferred from the photodiode PD1, which is amplified by the amplification transistor AMI to appear in the output line OL. Thus, the amplification transistor AMI functions to amplify an electric signal corresponding to the quantity of the charges transferred from the photodiode PD to a floating diffusion FD. The potential in the output line OL serves as the electric signal (received light signal), which is read as an output signal from the output amplifier AP via the column circuit CLC and the switch SWT.

By raising the transfer line LTX2 (to the HIGH level) with timing different from the timing of raising the transfer line LTX1 to bring the transfer transistor TX2 into the ON state, the charges generated by the photodiode PD2 are transferred to the end portion (floating diffusion D2) of the transfer transistor TX2 which is coupled to the node N1. In this case also, the potential of the floating diffusion FD2 is amplified by the amplification transistor API to appear in the output line OL. The potential in the output line OL serves as the electric signal (received light signal) to be read as the output signal from the output amplifier AP via the column circuit CLC and the switch SWT.

Each of the floating diffusions FD (FD1 and FD2) has the function of a charge accumulation portion or a floating diffusion layer and is formed of, e.g., an an-type impurity diffusion region (semiconductor region). The floating diffusion FD of the transfer transistor TX1 is the floating diffusion FD1. The floating diffusion FD of the transfer transistor TX2 is the floating diffusion FD2. In the case shown in FIG. 2, the floating diffusion FD1 of the transfer transistor TX1 and the floating diffusion FD2 of the transfer transistor TX2 are provided separately. However, it may also be possible to provide the floating diffusion FD1 of the transfer transistor TX1 and the floating diffusion FD2 of the transfer transistor TX2 as a common floating diffusion.

FIG. 3 shows an example of a circuit configuration of one of the pixels PU shown in FIG. 1.

Unlike in the case shown in FIG. 2 described above, in the case shown in FIG. 3, a set of the transfer transistor TX, the amplification transistor AMI, the selection transistor SEL, and the reset transistor RST is provided for the one photodiode PD. That is, in the case shown in FIG. 2, the amplification transistor AMI, the selection transistor SEL, and the rest transistor RST are shared by the two pixels PU. By contrast, in the case shown in FIG. 3, the amplification transistor AMI, the selection transistor SEL, and the rest transistor RST are not shared by the two pixels PU, but are provided for each one of the pixels PU. With regard to the coupling relations among the photodiode PD, the transfer transistor TX, the amplification transistor AMI, the selection transistor SEL, and the reset transistor RST, the respective functions thereof, and the respective operations thereof, the circuit configuration in the case shown in FIG. 3 is otherwise the same as in the case shown in FIG. 2 described above. Accordingly, a repeated description thereof is omitted herein.

Figure 4:
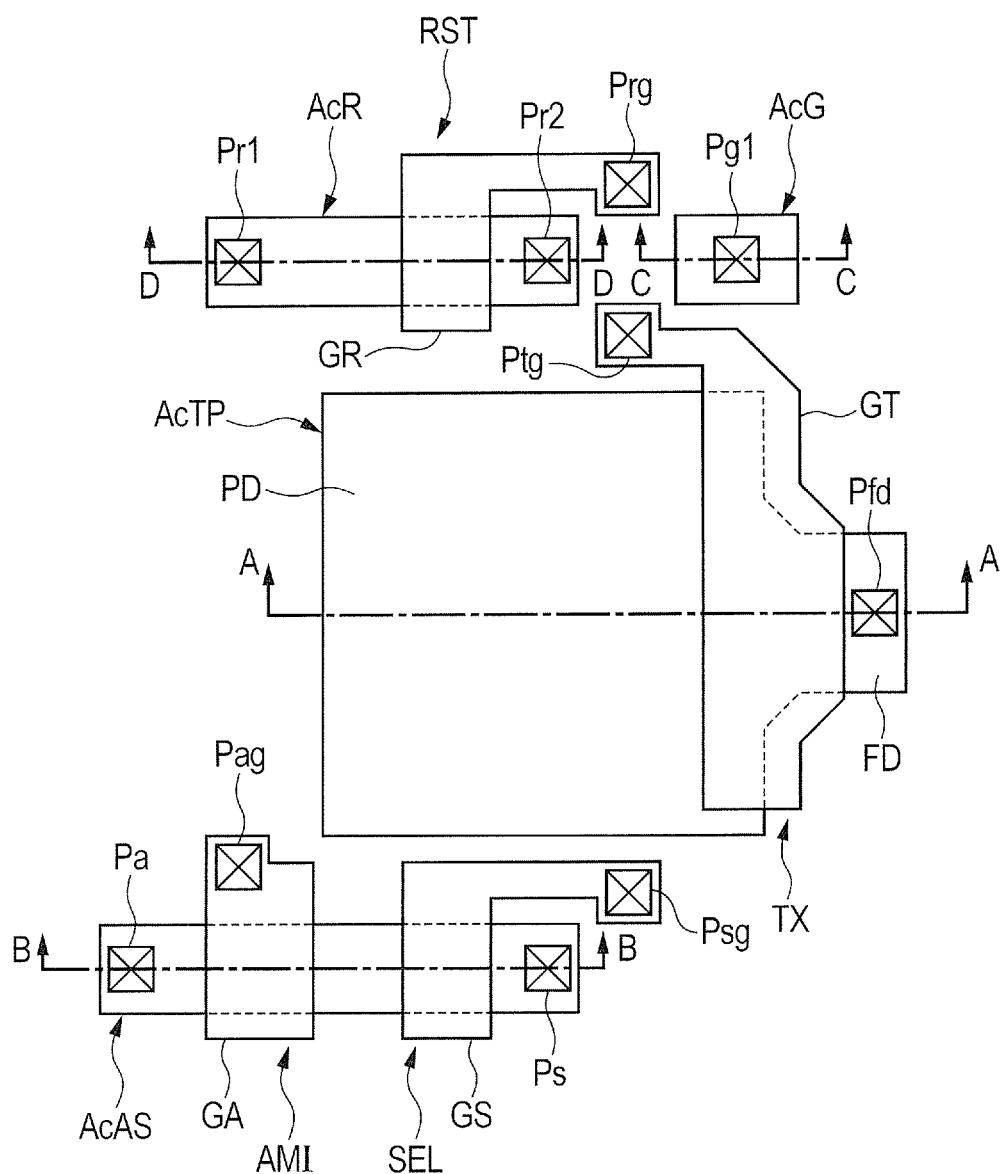
FIG. 4 is a plan view showing the pixel in the semiconductor device in the embodiment.
Figure 5:
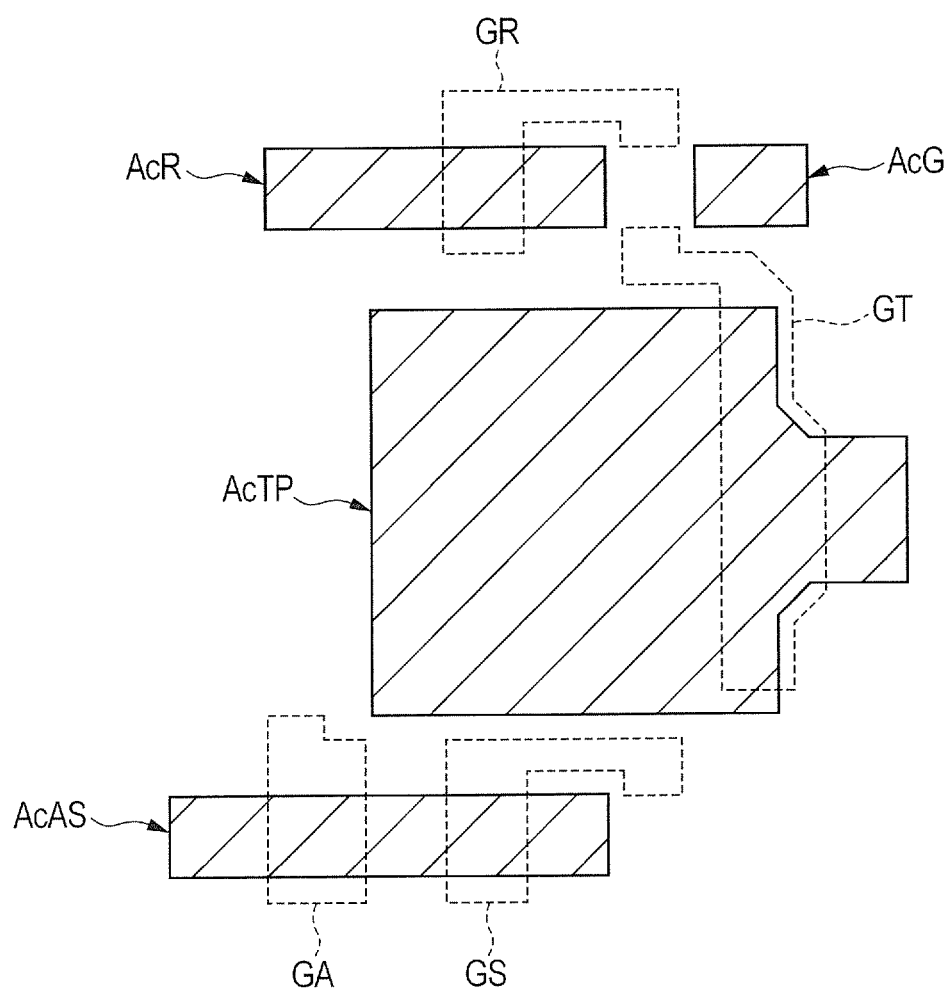
FIG. 5 is a plan view showing the pixel in the semiconductor device in the embodiment.
Figure 6:
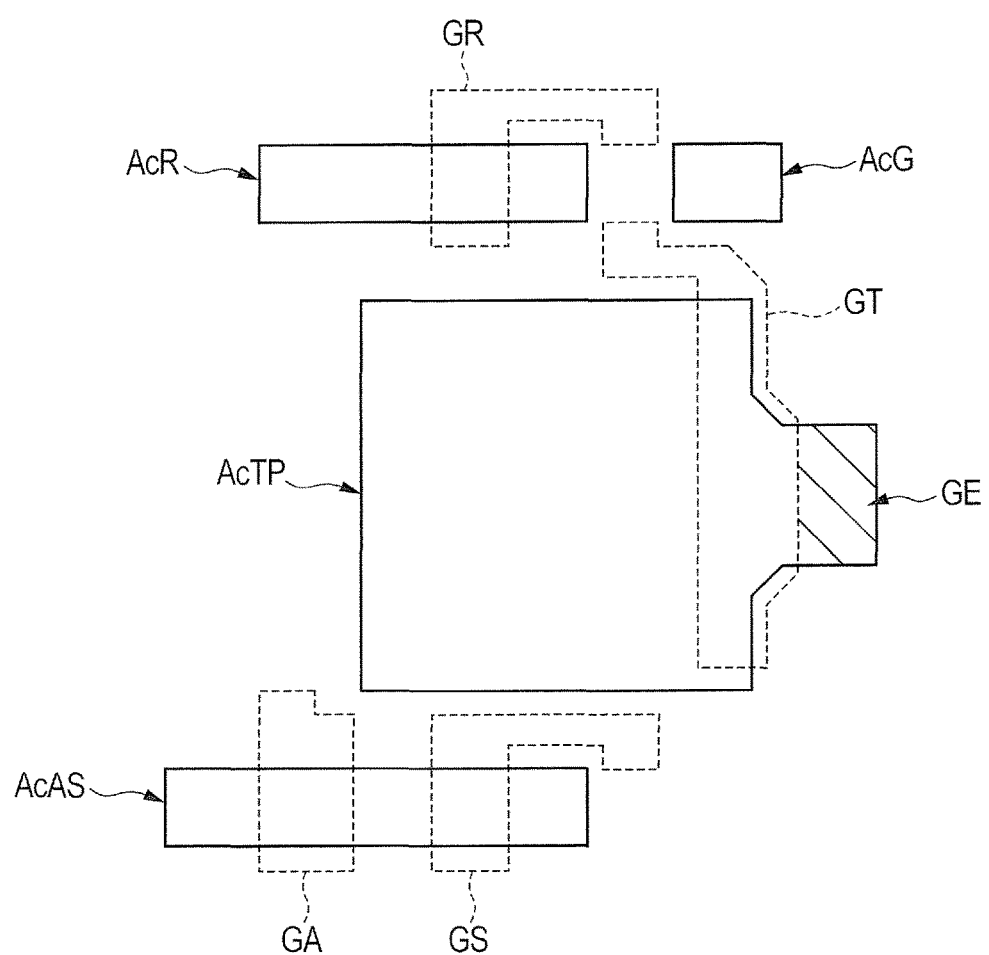
FIG. 6 is a plan view snowing the pixel in the semiconductor device in the embodiment.

FIGS. 4 to 6 are plan views each showing the pixels in the semiconductor device in Embodiment 1. FIGS. 4 to 6 show the same two-dimensional region.

FIG. 4 shows active regions (AcR, AcG, AcTP, and AcAS), gate electrodes (GR, GT, GA, and GS), and plugs (Pr1, Pr2, Prg, Pg1, Pfd, Pa, Ps, Pag, and Psg). In FIG. 4, the dotted lines show the respective outer peripheral positions of the active regions (AcTP, AcAS, and AcG) that are invisible under the gate electrodes (GR, GT, GA, and GS). In FIG. 5, oblique-line hatching shows the active regions (AcR, AcG, AcTP, and AcAS) and the dotted lines show the respective positions of the gate electrodes (GR, FT, GA, and GS). In the plan view of FIG. 5, in the region other than the regions (active regions AcR, AcG, AcTP, and AcAS) hatched with oblique lines, an isolation region ST described later is formed. In FIG. 6, the solid lines show the respective outer peripheral positions of the active regions (AcR, AcG, AcTP, and AcAS), oblique-line hatching shows the region (corresponding to the region denoted by a reference mark GE) where a gettering element is introduced, and the dotted lines show the respective positions of the gate electrodes (GR, GT, GA, and GS). The plugs (Pr1, Pr2, Prg, Pg1, Pfd, Pa, Ps, Pag, and Psg) are shown in FIG. 4, but the illustration thereof is omitted in FIGS. 5 and 6.

As shown in FIGS. 4 to 6, each of the pixels PU (see FIG. 1) in the semiconductor device in Embodiment 1 includes the active region AcTP where the photodiode PD and the transfer transistor TX are disposed and the active region AcR where the reset transistor RST is disposed. The pixel PU also includes the active region AcAS where the selection transistor SEL and the amplification transistor AMI are disposed and the active region AcG where the plug Pg1 coupled to the grounding potential line (line for supplying the grounding potential) is disposed.

In the active region AcR, the gate electrode GR is disposed. Over the source/drain regions on both sides thereof, the plugs Pr1 and Pr2 are disposed. The gate electrode GR and the source/drain regions form the reset transistor RST. The source/drain regions of the reset transistor RST are formed in the semiconductor substrate in the active region AcR.

Over the active region AcTP, the gate electrode GT is disposed. In plan view, on one of both sides of the gate electrode GT, the photodiode PD is disposed. On the other side of the gate electrode GT, the floating diffusion FD is disposed. The photodiode PD and the floating diffusion FD are formed in the semiconductor substrate in the active region AcTP. The photodiode PD is the PN-junction diode and includes, e.g., a plurality of n-type or p-type impurity diffusion regions (semiconductor regions). The floating diffusion FD has the function of the charge accumulation portion or the floating diffusion layer and is formed of, e.g., an n-type impurity diffusion region (semiconductor region). Over the floating diffusion FD, the plug Pfd is disposed.

Over the active region AcAs, the gate electrodes GA and GS are disposed. In the end portion of the active region AcAS which is closer to the gate electrode GA, the plug Pa is disposed. In the end portion of the active region AcAS which is closer to the gate electrode GS, the plug Ps is disposed. On both sides of each of the gate electrodes GA and GS, the source/drain regions are provided. The gate electrodes GA and GS and the source/drain regions form the selection transistor SEL and the amplification transistor AMI which are coupled in series to each other. The respective source/drain regions of the selection transistor SEL and the amplification transistor AMI are formed in the semiconductor substrate in the active region AcAS.

Over the active region AcG, the plug Pg1 is disposed. The plug Pg1 is coupled to the grounding potential line (line for supplying the grounding potential). Therefore, the active region AcG is a power supply region for applying a grounding potential GND to the semiconductor substrate (well region). That is, the active region AcG is intended to supply the grounding potential.

Over the gate electrodes GR, GT, GA, and GS, the plugs Prg, Ptg, Pag, and Psg are respectively disposed.

The foregoing plugs Pr1, Pr2, Pg1, Pfd, Pa, Ps, Prg, Ptg, Pag, and Psg are coupled as necessary to each other via a plurality wiring layers (e.g., wires M1 to M3 shown in FIGS. 38 to 40 described later). This allows the circuit shown in FIG. 2 or 3 described above to be formed.

Figure 7:
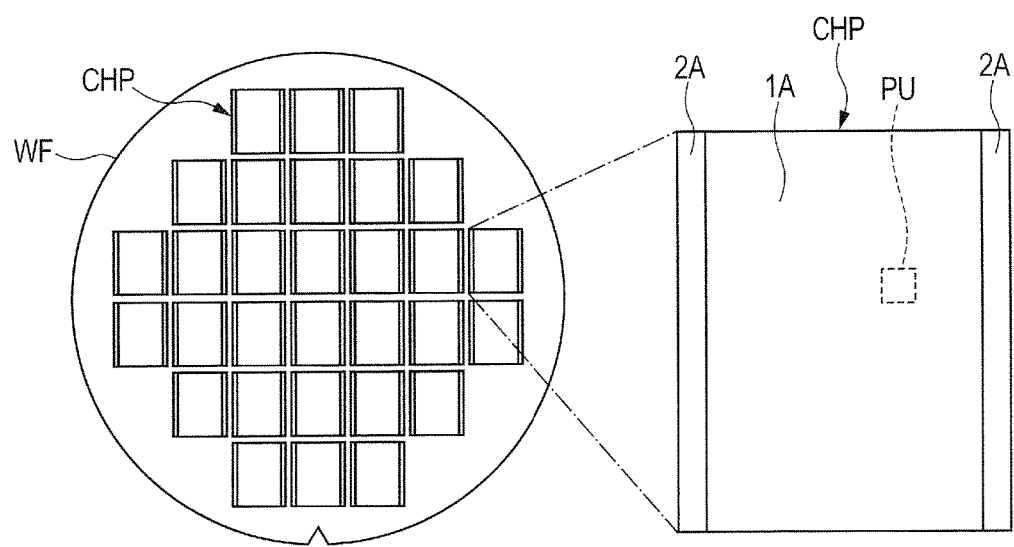
FIG. 7 is a plan view showing a semiconductor wafer and chip regions thereof where the semiconductor devices in the embodiment are formed.

FIG. 7 is a plan view showing a semiconductor wafer and chip regions thereof where the semiconductor devices in Embodiment 1 are formed. As shown in FIG. 7, a semiconductor wafer WF (semiconductor wafer equivalent to a semiconductor substrate SB described later) has a plurality of chip regions CHP. The pixel region 1A shown in FIG. 1 is formed together with peripheral circuit regions 2A in each one of the chip regions CHP. As described above, in the pixel region 1A of each of the chip regions CHP, the plurality of pixels PU are disposed (arranged) in the form of an array. In each of the peripheral circuit regions 2A of the chip regions CHP, a logic circuit (logic circuitry) is disposed. The logic circuit performs, e.g., an arithmetic operation on an output signal output from the pixel region 1A and image data is output on the basis of the result of the arithmetic operation. Each of the chip regions CHP is a region from which one semiconductor chip is obtained. In each of the chip regions CHP of the semiconductor wafer WF, the same configuration (pixel region 1A and peripheral circuit regions 2A) is formed. The semiconductor wafer WF is cut later by dicing and the individual singulated chip regions CHP serve as semiconductor chips.

Figure 8:
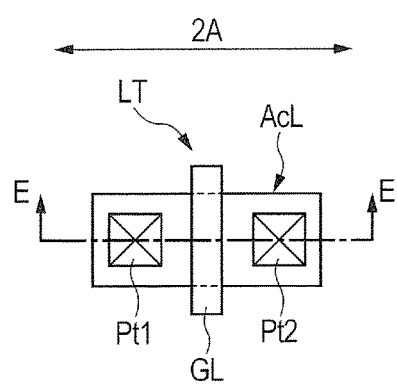
FIG. 8 is a plan view showing a transistor formed in a peripheral circuit region in the semiconductor device in the embodiment.

FIG. 8 is a plan view showing a transistor formed in each of the peripheral circuit regions of the semiconductor device in Embodiment 1.

As shown in FIG. 8, in the peripheral circuit region 2A, a peripheral transistor LT as the logic transistor is disposed. Actually, in the peripheral circuit region 2A, a plurality of n-channel MISFETs and a plurality of p-channel MISFETs are formed as transistors forming the logic circuit. However, in FIG. 8, one of the n-channel MISFETs among the transistors forming the logic circuit is shown as the peripheral transistor LT.

As shown in FIG. 8, in the peripheral circuit region 2A, an active region AcL is formed. In the active region AcL, a gate electrode GL of the peripheral transistor LT is disposed. In the active region AcL, the source/drain regions of the peripheral transistor LT are formed on both sides of the gate electrode GL. Over the source/drain regions of the peripheral transistor LT, plugs Pt1 and Pt2 are respectively disposed.

FIG. 8 shows only the one peripheral transistor LT but, in an actual situation, a plurality of the transistors are disposed in the peripheral circuit region 2A. By coupling the plugs over the respective source/drain regions of the plurality of transistors or the plugs over the respective gate electrodes thereof to each other with the plurality of wiring layers (wires M1 to M3 described later), the logic circuit can be configured. There may also be a case where elements other than the MISFETs such as, e.g., a capacitive element, a transistor having another configuration, or the like is included in the logic circuit.

Note that the following will describe an example in which the peripheral transistor LT is an n-channel MISFET. However, the peripheral transistor LT may also be a p-channel MISFET or both of an n-channel MISFET and a p-channel MISFET.

Figure 9:
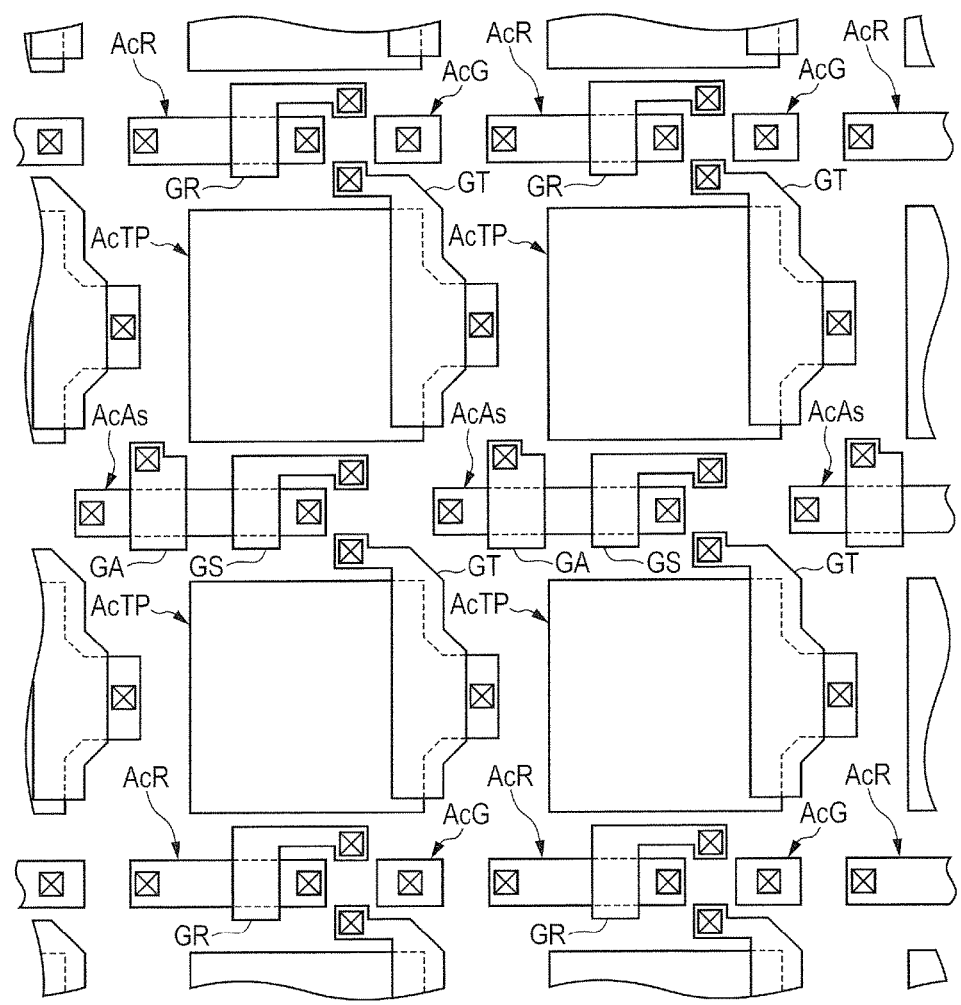
FIG. 9 is a plan view showing a plurality of the pixels formed in a pixel region in the semiconductor device in the embodiment.
Figure 10:
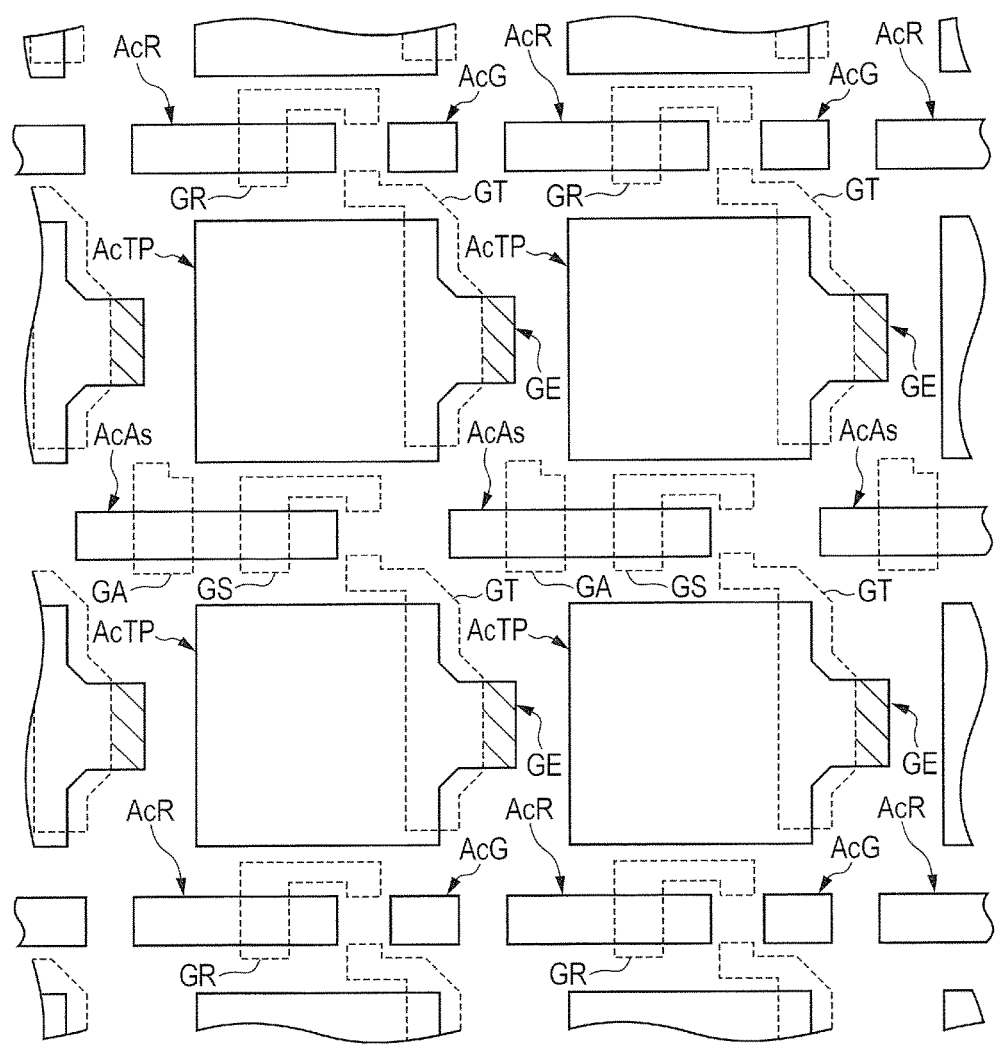
FIG. 10 is a plan view showing the plurality of pixels formed in the pixel region in the semiconductor device in the embodiment.

FIGS. 9 and 10 are plan views each showing the plurality of pixels formed in the pixel region of the semiconductor device in Embodiment 1. Each of FIGS. 9 and 10 shows the same two-dimensional region. Note that FIG. 9 shows the same elements as shown in FIG. 4 described above. In FIG. 9, the dotted lines show the respective outer peripheral positions of the active regions (AcTP, AcAS, and AcR) that are invisible under the gate electrodes (GR, GT, GA, and GS). FIG. 10 shows the same elements as shown in FIG. 6 described above. In FIG. 10, the solid lines show the respective outer peripheral positions of the active regions (AcR, AcG, AcTP, and AcAS), oblique-line hatching shows the region (corresponding to the region denoted by the reference mark GE) where the gettering element is introduced, and the dotted lines show the respective positions of the gate electrodes (GR, GT, GA, and GS).

As shown in FIGS. 9 and 10, in the pixel region 1A, the plurality of pixels PU each shown in FIG. 3 are arranged in an X-direction and in a Y-direction to form a pixel array. By way of example, each of FIGS. 9 and 10 shows the total of four pixels PU in a 2×2 arrangement. However, the respective numbers of the rows and the columns in which the pixels are arranged can variously be changed. In the case shown in each of FIGS. 9 and 10, the circuit configuration in FIG. 2 described above is used. In FIGS. 9 and 10, the two vertically arranged pixels share the set of the amplification transistor AMI, the selection transistor SEL, and the reset transistor RST. Each of FIGS. 9 and 10 shows a layout of the pixel transistors (TX, RST, SEL, and AMI) in the case of using the circuit configuration shown in FIG. 2 described above. However, in the case of using the circuit configuration shown in FIG. 3 described above, the number of the pixel transistors located between the vertically adjacent photodiodes PD in FIGS. 9 and 10 is larger than that in the case shown in FIGS. 9 and 10.

<Element Structures in Pixel Region and Peripheral Circuit Region>

Referring to the cross-sectional views (FIGS. 11 to 16) of the semiconductor device in Embodiment 1, a structure of the semiconductor device in Embodiment 1 will be described.

FIGS. 11 to 16 are main-portion cross-sectional views of the semiconductor device in Embodiment 1. However, in FIGS. 11 to 16, the illustration of the structure above the interlayer insulating film IL1 and the wires M1 is omitted. The structure above the interlayer insulating film IL1 and the wires M1 is shown in FIGS. 38 to 40 described later.

Figure 11:
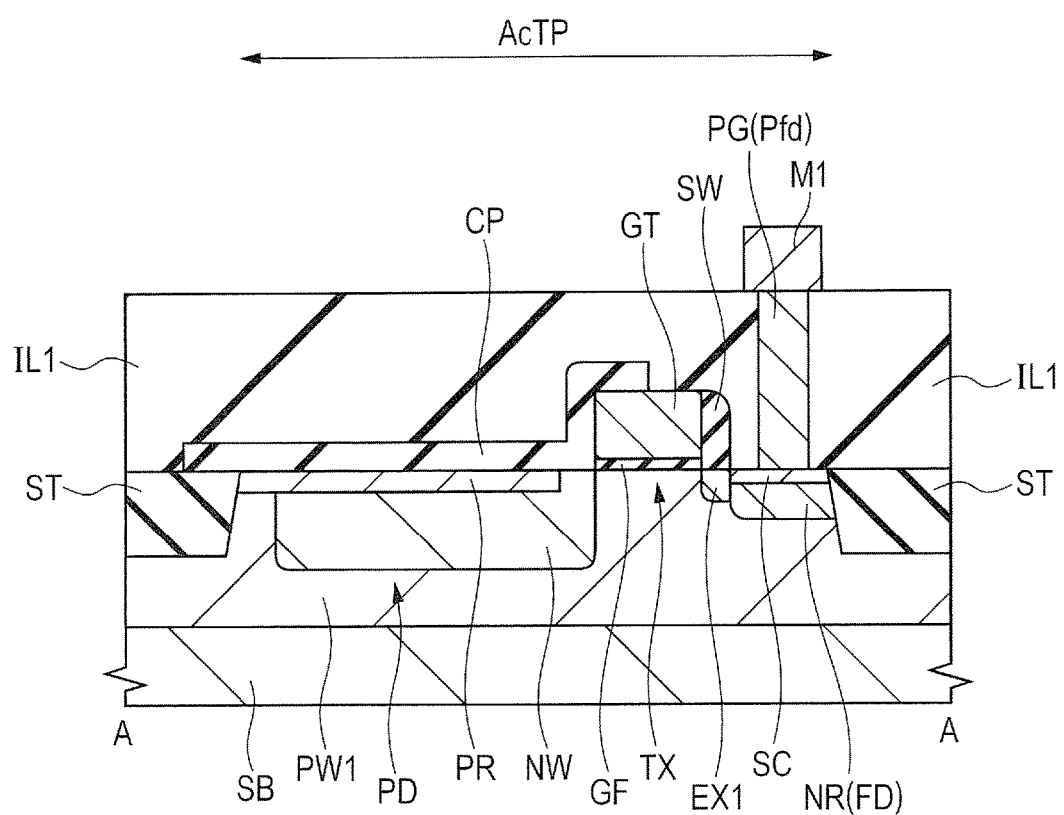
FIG. 11 is a main-portion cross-sectional view of the semiconductor device in the embodiment.
Figure 12:
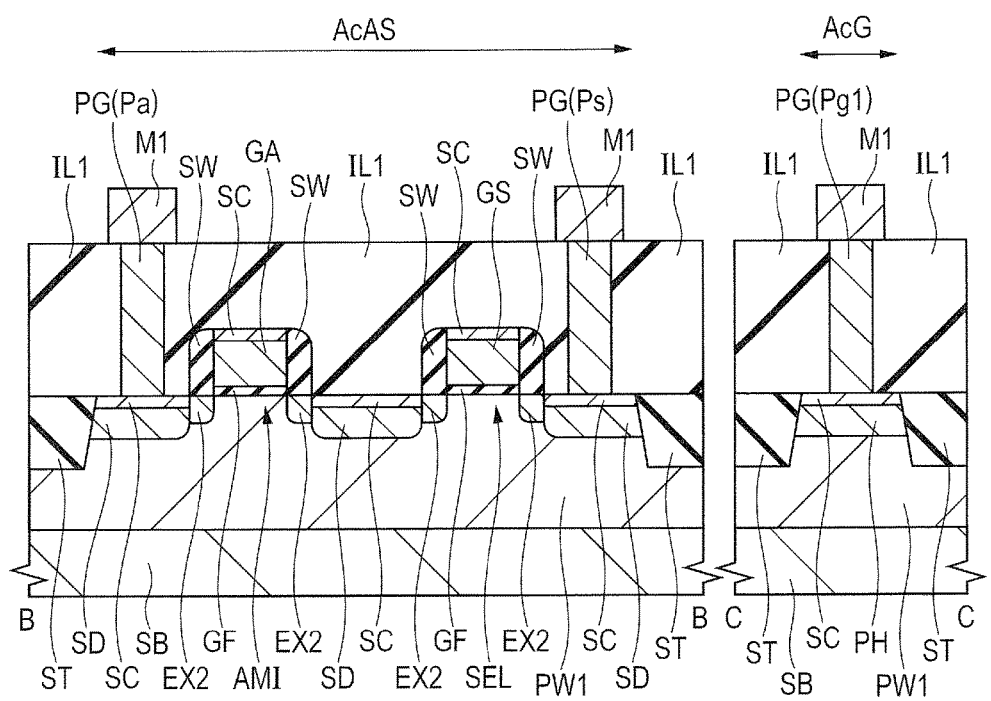
FIG. 12 is a main-portion cross-sectional view of the semiconductor device in the embodiment.
Figure 13:
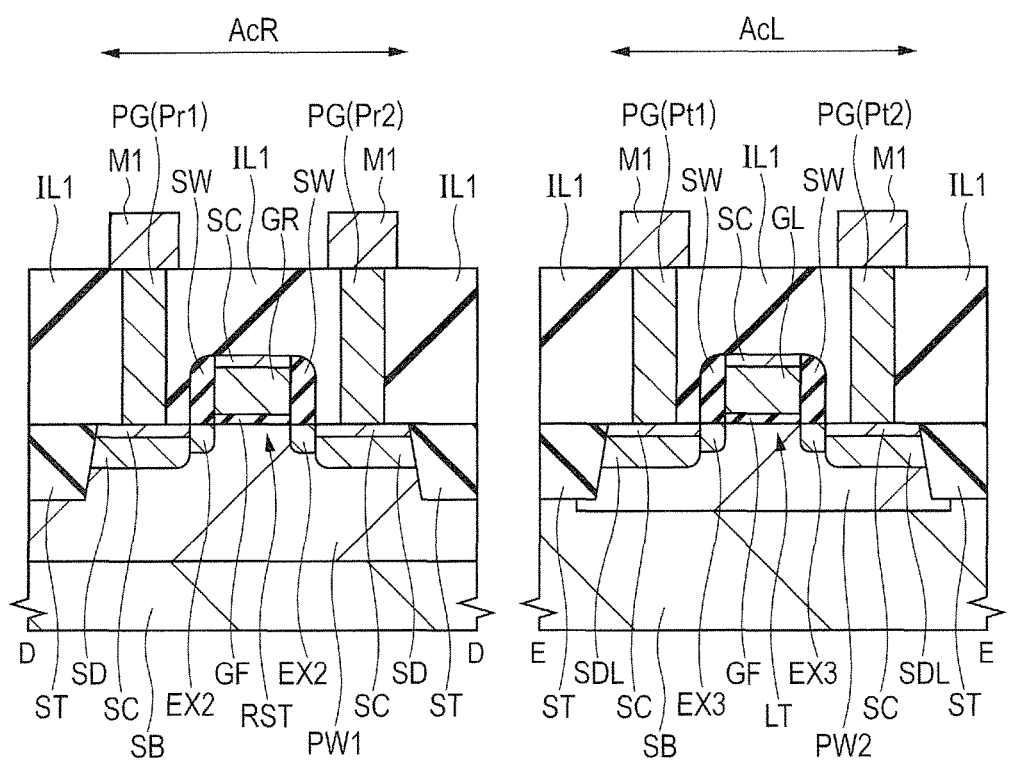
FIG. 13 is a main-portion cross-sectional view of the semiconductor device in the embodiment.
Figure 14:
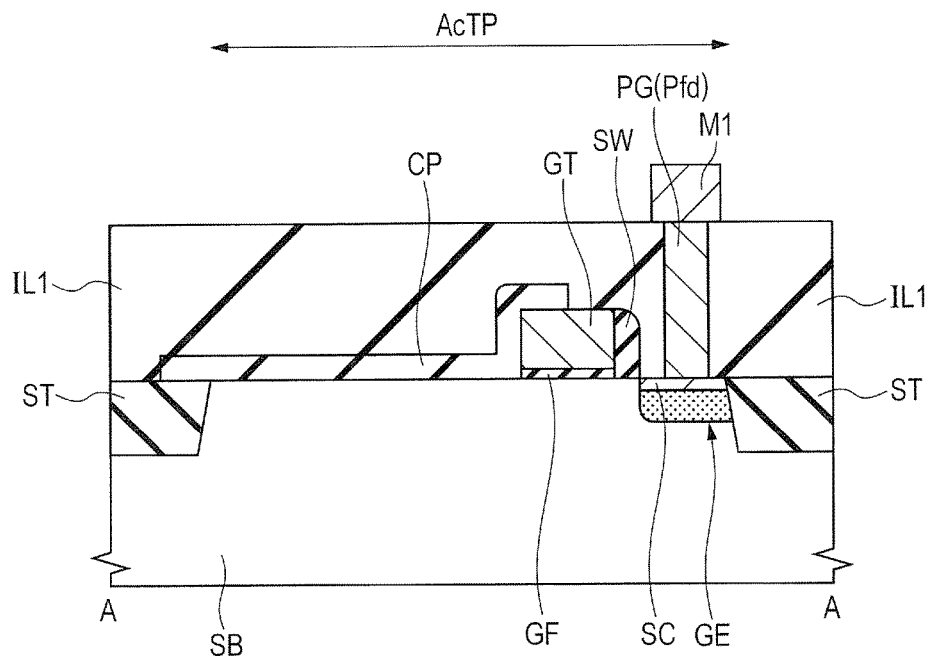
FIG. 14 is a main-portion cross-sectional view of the semiconductor device in the embodiment.
Figure 15:
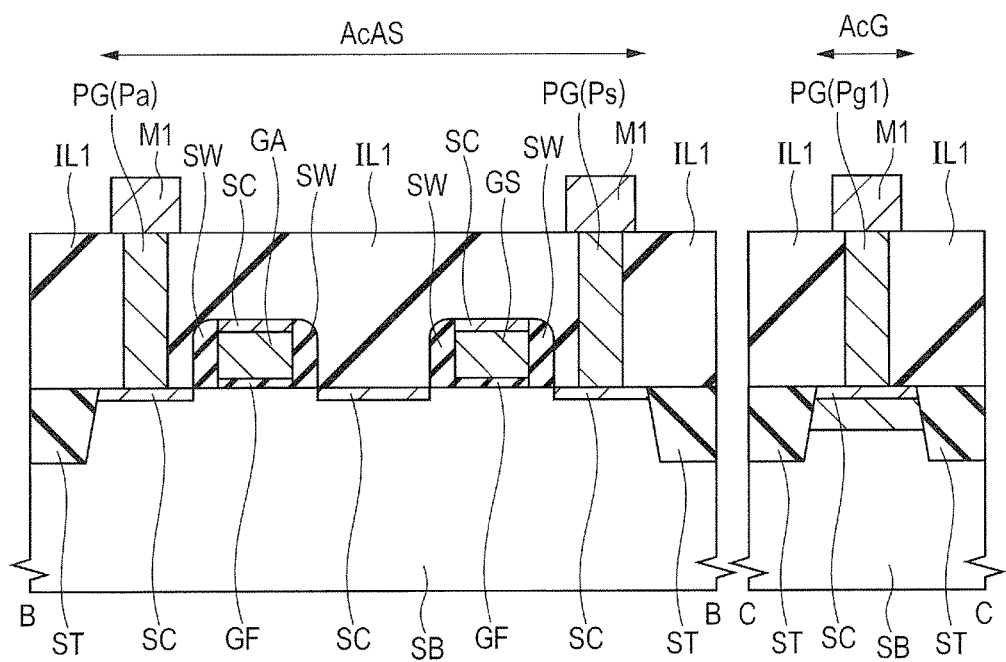
FIG. 15 is a main-portion cross-sectional view of the semiconductor device in the embodiment.
Figure 16:
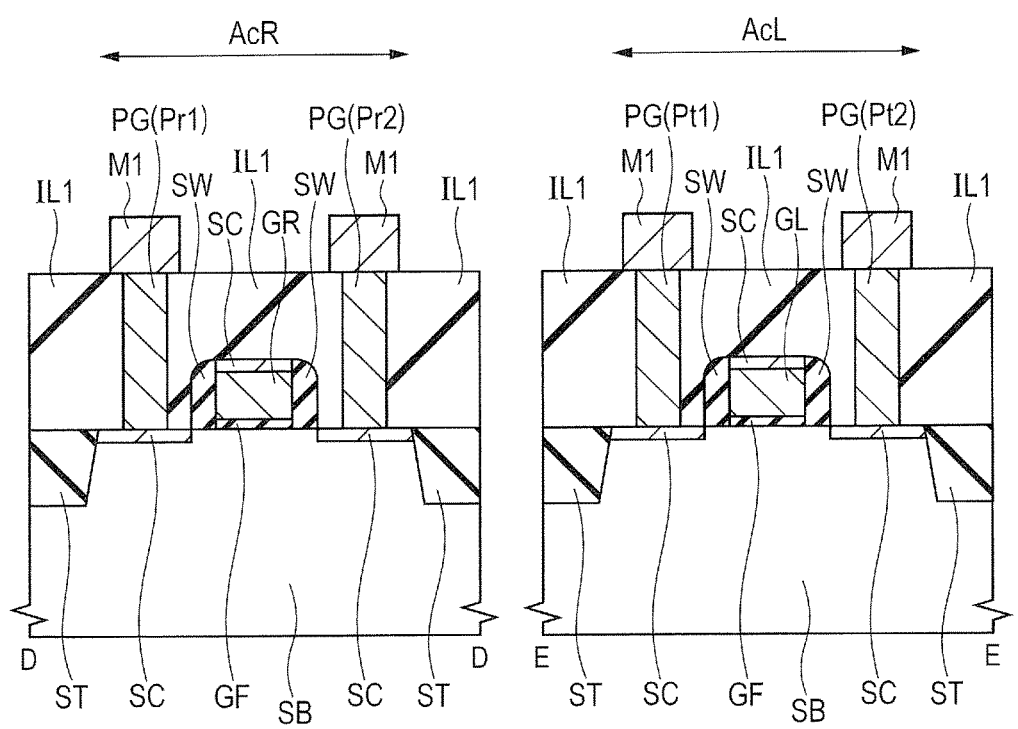
FIG. 16 is a main-portion cross-sectional view of the semiconductor device in the embodiment.

The cross-sectional view of FIG. 11 substantially corresponds to a cross section along the line A-A in FIG. 4 described above. The cross-sectional view in the left-hand part of FIG. 12 substantially corresponds to a cross-sectional view along the line B-B in FIG. 4 described above. The cross-sectional view in the right-hand part of FIG. 12 substantially corresponds to a cross-sectional view along the line C-C n FIG. 4 described above. The cross sectional view in the left-hand part of FIG. 13 substantially corresponds to a cross-sectional view along the line D-D in FIG. 4 described above. The cross-sectional view in the right-hand part of FIG. 13 substantially corresponds to a cross-sectional view along the line E-E in FIG. 8 described above. Accordingly, the cross-sectional view of FIG. 11, the cross-sectional view in the left-hand part of FIG. 12, the cross-sectional view in the right-hand part of FIG. 12, and the cross-sectional view in the left-hand part of FIG. 13 are main-portion cross-sectional views of the pixel region 1A (see FIG. 7). On the other hand, the cross-sectional view in the right-hand part of FIG. 13 is a main-portion cross-sectional view of the peripheral circuit region 2A (see FIG. 7 described above). FIG. 14 shows the same cross section as shown in FIG. 11. FIG. 15 shows the same cross section as shown in FIG. 12. FIG. 16 shows the same cross section as shown in FIG. 13. For easier understanding of the characteristic features of Embodiment 1, in FIGS. 14 to 16, oblique-line hatching in each of the semiconductor substrate SB and the semiconductor regions formed in the semiconductor substrate SB shown in FIGS. 11 to 13 is omitted, while the region (corresponding to the region shown by the reference mark GE) where a gettering element is introduced is hatched with dots. By referring to FIGS. 11 to 13 and 14 to 16 in combination, it is possible to easily understand the region of the semiconductor substrate SB where the gettering element is introduced.

As shown in FIG. 11, in the active region AcTP in the pixel region 1A of the semiconductor substrate SB, the photodiode PD and the transfer transistor TX are formed. The photodiode PD includes a p-type well PW1 formed in the semiconductor substrate SB, an n-type semiconductor region (n-type well) NW, and a p$^+$-type semiconductor region PR. As shown in FIG. 12, in the active region AcAS in the pixel region 1A of the semiconductor substrate SB, the selection transistor SEL and the amplification transistor AMI are formed. As shown in FIG. 13, in the active region AcR in the pixel region 1A of the semiconductor substrate SB, the reset transistor RST is formed. As also shown in FIG. 13, in the active region AcL in the peripheral circuit region 2A of the semiconductor substrate SB, the peripheral transistor LT is formed.

The semiconductor substrate SB is made of n-type monocrystalline silicon in which an n-type impurity (donor) such as, e.g., phosphorus (P) or arsenic (As) is introduced. In another form, the semiconductor substrate SB can also be a so-called epitaxial wafer. In the case where the semiconductor substrate SB is the epitaxial wafer, the semiconductor substrate SB can be formed by growing an epitaxial layer made of n$^-$-type monocrystalline silicon in which an n-type impurity is introduced over the main surface of, e.g., an n$^+$-type monocrystalline silicon substrate in which an n-type impurity is introduced or a p$^+$-type monocrystalline silicon substrate in which a p-type impurity is introduced.

Around the outer periphery of each of the active regions AcTP, AcR, AcAS, AcG, and AcL, the isolation region ST made of an insulator is disposed. That is, each of the active regions AcTP, AcR, AcAS, AcG, and AcL is surrounded by the isolation region ST in plan view. The exposed regions of the semiconductor substrate SB which are each surrounded by the isolation region ST serve as active regions such as the active regions AcTP, AcR, AcAS, AcG, and AcL.

Note that the wording "in plan view" or "when two-dimensionally viewed" is used in the case where an object is viewed in a plane parallel with the main surface of the semiconductor substrate SB included in the semiconductor device.

Each of the p-type well (p-type semiconductor region) PW1 and a p-type well (p-type semiconductor region) PW2 is formed to a predetermined depth from the main surface of the semiconductor substrate SB. The p-type well PW1 is formed in each of the active regions AcTP, AcR, AcAS, and AcG. That is, the p-type well PW1 is formed over substantially the entire pixel region 1A. Accordingly, the active regions AcTP, AcR, AcAS, and AcG are included in the p-type well PW1 in plan view. On the other hand, the p-type well PW2 is formed in the active region AcL. That is, the p-type well PW2 is formed in the region (active region) of the peripheral circuit region 2A where the n-channel MISFET is formed. Each of the p-type wells PW1 and PW2 is a p-type semiconductor region where a p-type impurity such as boron (B) is introduced.

The p-type well PW1 can be formed of one p-type semiconductor region but, in another form, the p-type well PW1 can also be formed of a plurality of the p-type semiconductor regions (e.g., a plurality of the p-type semiconductor regions having different p-type impurity concentrations) which are continuously connected and electrically coupled to each other. Accordingly, a p-type semiconductor region PH described later can also be regarded as a part of the p-type well PW1.

As shown in FIG. 11, in the semiconductor substrate SB in the active region AcTP, the n-type semiconductor region (n-type well) NW is formed so as to be included in the p-type well PW1. The n-type semiconductor region NW is an n-type semiconductor region where an n-type impurity such as phosphorus (P) or arsenic (As) is introduced. The n-type semiconductor region NW has, e.g., a generally rectangular two-dimensional shape.

The n-type semiconductor region NW is an n-type semiconductor region for forming the photodiode PD. The source region of the transfer transistor TX is also formed of the n-type semiconductor region NW. That is, the n-type semiconductor region NW is formed mainly in the region where the photodiode PD is formed. However, the n-type semiconductor region NW has a portion formed at such a position which two-dimensionally overlaps the gate electrode GT of the transfer transistor TX. The n-type semiconductor region NW is formed such that the depth thereof (bottom surface thereof) is shallower than the depth of the p-type well PW1 (bottom surface thereof) and so as to be included in the p-type well PW1.

In a portion of the top surface of the n-type semiconductor region NW, the p$^+$-type semiconductor region PR is formed. The p$^+$-type semiconductor region PR is a p$^+$-type semiconductor region where a p-type impurity such as boron (B) is introduced (or which is doped with a p-type impurity such as boron (B)) at a higher concentration. The impurity concentration (p-type impurity concentration) of the p$^+$-type semiconductor region PR is higher than the impurity concentration (p-type impurity concentration) of the p-type well PW1. Accordingly, the conductivity (electric conductivity) of the p$^+$-type semiconductor region PR is higher than the conductivity (electric conductivity) of the p-type well PW1.

The depth of the p$^+$-type semiconductor region PR (bottom surface thereof) is shallower than the depth of the n-type semiconductor region NW (bottom surface thereof). The p$^+$-type semiconductor region PR is formed mainly in the top layer portion (top surface portion) of the n-type semiconductor region NW. Accordingly, when the semiconductor substrate SB is viewed in the thickness direction thereof, the n-type semiconductor region NW is present under the p-type semiconductor region PR in the uppermost layer, while the p-type well PW1 is present under the n-type semiconductor region NW.

In the region where the n-type semiconductor region NW is not formed, the p$^+$-type semiconductor region PR has portions in contact with the p-type well PW1. In other words, the p$^+$-type semiconductor region PR has the portion in contact with the n-type semiconductor region NW which is present immediately under the p$^+$-type semiconductor region PR and the portion in contact with the p-type well PW1 which is present immediately under the p+-type semiconductor region PR.

Between the p-type well PW1 and the n-type semiconductor region NW, a PN junction is formed. Also, between the p+-type semiconductor region PR and the n-type semiconductor region NW, a PN junction is formed. The p-type well PW1 (p-type semiconductor region), the n-type semiconductor region NW, and the p+-type semiconductor region PR form the photodiode (PN junction diode) PD.

The photodiode (PN-junction diode) PD is formed mainly of the n-type semiconductor region NW and the p-type well PW1 (i.e., the PN junction between the n-type semiconductor region NW and the p-type well PW1).

The p+-type semiconductor region PR is formed to suppress the generation of electrons based on a large number of interface states formed at the top surface of the semiconductor substrate SB. That is, in the top surface region of the semiconductor substrate SB, under the influence of the interface states, electrons may be generated even in the absence of light illumination to cause an increase in dark current. Accordingly, by forming the p+-type semiconductor region PR having holes (positive holes) as majority carriers in the top surface of the n-type semiconductor region NW having electrons as majority carriers, it is possible to suppress the generation of electrons in the absence of light illumination and suppress an increase in dark current. Therefore, the p+-type semiconductor region PR has the function of recombining the electrons generated from the uppermost surface of the photodiode with the holes in the p+-type semiconductor region PR and reducing the dark current.

The photodiode PD is a light receiving element. The photodiode PD can also be regarded as a photoelectric conversion element. The photodiode PD has the function of photoelectrically converting input light to generate charges and accumulating the generated charges. The transfer transistor TX has the function of a switch when the charges accumulated in the photodiode PD are transferred from the photodiode PD.

The gate electrode GT is formed so as to two-dimensionally overlap a portion of the n-type semiconductor region NW in plan view. The gate electrode GT is the gate electrode of the transfer transistor TX which is formed (disposed) over the semiconductor substrate SB via a gate insulating film GF. Over the side wall of the gate electrode GT, a sidewall spacer (side-wall insulating film) SW is formed as the side-wall insulating film.

In the semiconductor substrate SB (p-type well PW1) in the active region AcTP, on one of both sides of the gate electrode GT, the foregoing n-type semiconductor region NW is formed and, on the other side, an n-type semiconductor region NR is formed. The n-type semiconductor region NR is an n+-type semiconductor region where an n-type impurity such as phosphorus (P) or arsenic (As) is introduced (which is doped with an n-type impurity such as phosphorus (P) or arsenic (As)) at a high concentration. The n-type semiconductor region NR serves as the floating diffusion (floating diffusion layer) FD and serves also as the drain region of the transfer transistor TX. The n-type semiconductor region NR is formed in the p-type well PW1.

The n-type semiconductor region NR serves as the drain region of the transfer transistor TX, but can also be regarded as the floating diffusion (floating diffusion layer) FD. The n-type semiconductor region NW is the component of the photodiode PD, but can also function as the source region of the transfer transistor TX. That is, the source region of the transfer transistor TX is formed of the n-type semiconductor region NW. Accordingly, The n-type semiconductor region NW and the gate electrode GT preferably have a positional relationship therebetween such that a portion (closer to the source) of the gate electrode GT two-dimensionally (in plan view) overlaps a portion of the n-type semiconductor region NW. The n-type semiconductor regions NW and NR are formed so as to be spaced part from each other with the region (corresponding to the substrate region immediately under the gate electrode GT) where the channel of the transfer transistor TX is formed being interposed therebetween. Note that, between the gate electrode GT and the region where the channel of the transfer transistor TX is formed, the gate insulating film GF is interposed.

The photodiode PD and the transfer transistor TX are paired and formed in the common active region AcTP. That is, the photodiode PD and the transfer transistor TX are formed in the same active region AcTP to be adjacent to each other. Consequently, the n-type semiconductor regions NW and NR are formed in the same active region AcTP. In plan view, between the n-type semiconductor regions NW and NR, the isolation region ST is not interposed.

Over the top surface of the photodiode PD, i.e., over the respective top surfaces of the n-type semiconductor region NW and the p+-type semiconductor region PR, a cap insulating film CP is formed. The cap insulating film CP can also function as a protective film and can function to hold the top surface property, i.e., interface property of the semiconductor substrate SB excellent. The cap insulating film CP may also have the function of an antireflection film. The cap insulating film CP can also have a portion (end portion) lying over the gate electrode GT.

As also shown in the two-dimensional view of FIG. 4 described above and the cross-sectional views of FIGS. 12 and 13, in the pixel region 1A, the reset transistor RST is formed in the active region AcR peripherally surrounded by the isolation region ST, while the selection transistor SEL and the amplification transistor AMI are formed in the active region AcAS peripherally surrounded by the isolation region ST.

That is, in the active region AcR, as shown in FIG. 13, the gate electrode GR for the reset transistor RST is formed over the semiconductor substrate SB (p-type well PW1) via the gate insulating film GF. In the semiconductor substrate SB (p-type well PW1) located on both sides of the gate electrode GR, source/drain regions (n-type semiconductor regions) SD for the reset transistor RST are formed. Note that the "source/drain regions" can also be shown as "source-drain regions" and correspond to "source or drain semiconductor regions". As shown in FIG. 12, in the active region AcAS, the gate electrode GA for the amplification transistor AMI and the gate electrode GS for the selection transistor SEL are formed over the semiconductor substrate SB (p-type well PW1) via the respective gate insulating films GE. Also, in the active region AcAS, as shown in FIG. 12, the source/drain regions SD for the amplification transistor AMI are formed in the semiconductor substrate SB (p-type well PW1) located on both sides of the gate electrode GA, while the source/drain regions DS for the selection transistor SEL are formed in the semiconductor substrate (p-type well PW1) located on both sides of the gate electrode GS. Note that the selection transistor SEL and the amplification transistor AMI, which are coupled in series to each other, share one of the source/drain regions SD. Over the respective side walls of the gate electrodes GR, GA, and GS, the sidewall spacers SW are formed as side-wall insulating films. Each of the source drain regions SD is made of an n-type semiconductor region, but can also have a LDD (Lightly Doped Drain) structure.

The active region AcG is a power supply region for supplying (applying) the grounding potential (GND) to the semiconductor substrate SB (p-type well PW1), which is peripherally surrounded by the isolation region ST in plan view. As shown in FIG. 12, in the top surface (top layer portion) of the active region AcG, a metal silicide layer SC is formed.

Under the metal silicide layer SC in the active region AcG, the p-type semiconductor region PH is present. Under the p-type semiconductor region PH, the p-type well PW1 is present. Consequently, the metal silicide layer SC in the active region AcG is electrically coupled to the p-type semiconductor region PH, while the p-type semiconductor region PH is electrically coupled to the p-type well PW1. The impurity concentration (p-type impurity concentration) of the p-type semiconductor region PH is higher than the impurity concentration (p-type impurity concentration) of the p-type well PW1.

Over the metal silicide layer SC in the active region AcG, a plug PG for supplying the grounding potential (GND), i.e., the plug Pg1 is disposed. The bottom surface of the plug Pg1 is in contact with and electrically coupled to the metal silicide layer SC in the top surface in the active region AcG. Consequently, the plug Pg1 is electrically coupled to the semiconductor substrate SB (p-type well PW1) in the active region AcG via each of the metal silicide layer SC in the top surface of the active region AcG and the p-type semiconductor region PH under the metal silicide layer SC. The plug Pg1 is electrically coupled to the wire (M1) for supplying the grounding potential among the wires M1. As a result, the grounding potential (GND) is applied from the plug Pg1 to the semiconductor substrate SB (p-type semiconductor region PH and p-type well PW1) via the metal silicide layer SC in the top surface of the active region AcG. This allows the grounding potential (GND) to be supplied from the plug Pg1 to the semiconductor substrate SB (p-type semiconductor region PH and p-type well PW1) in the pixel region 1A. The grounding potential supplied from the plug Pg1 to the semiconductor substrate SB (p-type semiconductor region PH and p-type well PW1) in the pixel region 1A is supplied also to the p-type well PW1 in each of the active regions AcTP, AcAS, and AcR.

Note that, in the case shown in FIG. 12, under the metal silicide layer SC in the active region AcG, the p-type semiconductor region PH is present. However, in another form, the formation of the p-type semiconductor region PH can also be omitted. In the case where the formation of the p-type semiconductor region PH is omitted, it follows that, under the metal silicide layer SC in the active region AcG, the p-type well PW1 is present. Even in the case where the p-type semiconductor region PH is formed, it is also possible to regard the entire combination of the p-type semiconductor region PH and the p-type well PW1 as a p-type semiconductor region. In either case, under the metal silicide layer SC in the active region AcG, the p-type semiconductor region (p-type semiconductor region PH or p-type well PW1) is present. In other words, the metal silicide layer SC in the active region AcG is formed in the top surface of the p-type semiconductor region (p-type semiconductor region PH or p-type well PW1).

Also, as shown in FIG. 11, in the active region AcTP, the metal silicide layer SC is formed also in the top surface (top layer portion) of the floating diffusion FD (n-type semiconductor region NR). As also shown in FIGS. 12 and 13, in the active regions AcR and AcAS, the metal silicide layer SC is formed even in the top surface (top layer portion) of each of the source/drain regions SD. In the case where the gate electrodes GA, GS, and GR are formed of silicon (polysilicon), the metal silicide layer SC may also be formed in the top surface (top layer portion) of each of the gate electrodes GA, GS, and GR.

As also shown in the plan view of FIG. 8 described above and the cross-sectional view in the right-hand part of FIG. 13, in the peripheral circuit region 2A, the peripheral transistor LT is formed in the active region AcL peripherally surrounded by the isolation region ST.

That is, in the active region AcL, as shown in FIG. 13, the gate electrode GL for the peripheral transistor LT is formed over the semiconductor substrate SB (p-type well PW2) via the gate insulating film GF. In the semiconductor substrate SB (p-type well PW2) located on both sides of the gate electrode GL, source/drain regions (n-type semiconductor region) SDL for the peripheral transistor LT are formed. Over the side walls of the gate electrode GL, the sidewall spacers SW are formed as side-wall insulating films. Each of the source/drain regions SDL of the peripheral transistor LT is made of an n-type semiconductor region and may also have an LDD structure.

Note that, in an actual situation, in the peripheral circuit region 2A, a plurality of n-channel MISFETs and a plurality of p-channel MISFETs are formed as the transistors included in a logic transistor. In FIG. 13, one of the n-channel MISFETs among the transistors included in the logic circuit is shown as the peripheral transistor LT.

As also shown in FIG. 13, in the active region AcL, the metal silicide layer SC is formed also in the top surface (top layer portion) of each of the source/drain regions SDL. In the case where the gate electrode GL is formed of silicon (polysilicon), the metal silicide layer SC may be formed also in the top surface (top layer portion) of the gate electrode GL.

In Embodiment 1, in the pixel region 1A, the photodiode PB and the transfer transistor TX are formed in the semiconductor substrate SB in the active region AcTP. In the semiconductor substrate SB in the active region AcTP, a gettering element such as carbon (C) is introduced in the n-type semiconductor region NR (floating diffusion FD). On the other hand, in the semiconductor substrate SB in the active region AcTP, a gettering element such as carbon (C) is not introduced in the region where the photodiode PD is formed. In other words, a gettering element such as carbon (C) is introduced in the portion (N-type semiconductor region NR) of the semiconductor substrate SB in the active region AcTP which is located on the one of both sides of the gate electrode GT which is adjacent to the drain, but is not introduced in the portion of the semiconductor substrate SB which is located on the other side adjacent to the source (adjacent to the photodiode PD). As a result, a gettering element such as carbon (C) is introduced neither in the n-type semiconductor region NW nor in the $p^+$-type semiconductor region PR.

Also, in the pixel region 1A, in the respective source/drain regions SD of the amplification transistor AMI, the selection transistor SEL, and the reset transistor RST, a gettering element such as carbon (C) is not introduced. From another perspective, in the pixel region 1A, a gettering element such as carbon (C) is introduced neither in the semiconductor substrate SB in the active region AcAS where the amplification transistor AMI and the selection transistor SEL are formed nor in the semiconductor substrate SB in the active region AcR where the reset transistor RST is formed.

Also, in the pixel region 1A, a gettering element such as carbon (C) is not introduced in the semiconductor substrate SB in the active region AcG for supplying the grounding potential (GND). That is, a gettering element such as carbon (C) is introduced neither in the p-type semiconductor region PH nor in the p-type well PW1 in the active region AcG.

On the other hand, in the peripheral circuit region 2A, a gettering element such as carbon (C) is not introduced in the source/drain regions (SDL) of the peripheral transistor (LT). From another perspective, in the peripheral circuit region 2A, a gettering element such as carbon (C) is not introduced in the semiconductor substrate SB in the active region (AcL) where the peripheral transistor (LT) is formed.

As will be described later in detail, a gettering element is provided so as to capture contaminant metal and suppress or prevent the diffusion of the contaminant metal into the photodiode PD. A gettering element is preferably carbon (C).

Next, referring to FIGS. 11 to 13, a description will be given of the interlayer insulating film and the wires which are formed over the semiconductor substrate SB.

As shown in FIGS. 11 to 13, over the entire main surface of the semiconductor substrate SB including the pixel region 1A and the peripheral circuit region 2A, the interlayer insulating film IL1 is formed so as to cover the gate electrodes GT, GR, GA, GS, and GL, the cap insulating film CP, and the sidewall spacers SW. The interlayer insulating film IL1 is formed over the entire main surface of the semiconductor substrate SB.

The interlayer insulating film Il1 is formed of, e.g., a silicon dioxide film made of TEOS (Tetra Ethyl Ortho Silicate) as a raw material. In the interlayer insulating film IL1, contact holes (penetration holes or through holes) are formed. In the respective contact holes, the conductive plugs (coupling conductor portions or contact portions) PG are embedded. The plugs PG are formed over, e.g., the n-type semiconductor region NR, the source/drain regions SD and SDL, the gate electrodes GT, GR, GA, GS, and GL, and the like. The plugs PG can be regarded as the contact portions.

The plug PG disposed over and electrically coupled to the gate electrode GT is the plug Pt in FIG. 4 described above. The plug PG disposed over and electrically coupled to the gate electrode GR is the plug Prg in FIG. 4 described above. The plug PG disposed over and electrically coupled to the gate electrode GA is the plug Pag in FIG. 4 described above. The plug PG disposed over and electrically coupled to the gate electrode GS is the plug Psg in FIG. 4 described above. The plug PG disposed over and electrically coupled to the n-type semiconductor region NR (floating diffusion FD) is the plug Pfd in FIG. 4 described above. The plug PG disposed over the active region AcG and electrically coupled to the semiconductor substrate SB (p-type well PW1) in the active region AcG is the plug Pg1 in FIG. 4 described above. The plug PG disposed over and electrically coupled to one of the source/drain regions SD (source/drain regions SD for the reset transistor RST) in the active region AcR is the plug Pr1 in FIG. 4 described above. The plug PG disposed over and electrically coupled to the other of the source/drain regions SD (source/drain regions SD for the reset transistor RST) in the active region AcR is the plug Pr2 in FIG. 4 described above. The plug PG disposed over and electrically coupled to the source or drain region SD for the amplification transistor AMI which is among the source/drain regions SD in the active region AcAs is the plug Pa in FIG. 4 described above. The plug PG disposed over and electrically coupled to the source or drain region SD for the selection transistor SEL which is among the source/drain regions SD in the active region AcAs is the plug Ps in FIG. 4 described above.

Over the interlayer insulating film IL1 in which the plugs PG are embedded, the wires M1 are formed. The wires M1 are wires in a first wiring layer. Over the respective plugs PG, the wires M1 are present. The plugs PG are electrically coupled to the wires M1 located thereover. The illustration and description of the structure above the interlayer insulating film IL1 and the wires M1 is omitted herein, but the structure above the interlayer insulating film Il1 and the wires M1 is shown in FIGS. 38 and 40 described later.

<Manufacturing Method of Semiconductor Device>

Next, referring to FIGS. 17 to 40, a description will be given of a method of manufacturing the semiconductor device in Embodiment 1.

FIGS. 17 to 40 are main-portion cross-sectional views of the semiconductor device in Embodiment 1 during the manufacturing process thereof. Among FIGS. 17 to 40, FIGS. 17, 20, 23, 26, 29, 32, 35, and 38 are cross-sectional views corresponding to FIG. 11 described above, i.e., cross-sectional views at a position corresponding to the line A-A in FIG. 4 described above. Also, among FIGS. 17 to 40, FIGS. 18, 21, 24, 27, 30, 33, 36, and 39 are cross-sectional views corresponding to FIG. 12 described above, i.e., cross-sectional views (in the left-hand part of each of the drawings) at a position corresponding to the line B-B in FIG. 4 described above and cross-sectional views (in the right-hand part of each of the drawings) at a position corresponding to the line C-C in FIG. 4 described above. Also, among FIGS. 17 to 40, FIGS. 19, 22, 25, 28, 31, 34, 37, and 40 are cross-sectional views corresponding to FIG. 13 described above, i.e., cross-sectional views (in the left-hand part of each of the drawings) at a position corresponding to the line D-D in FIG. 4 described above and cross-sectional views (in the right-hand part of each of the drawings) at a position corresponding to the line E-E in FIG. 7 described above.

Figure 17:
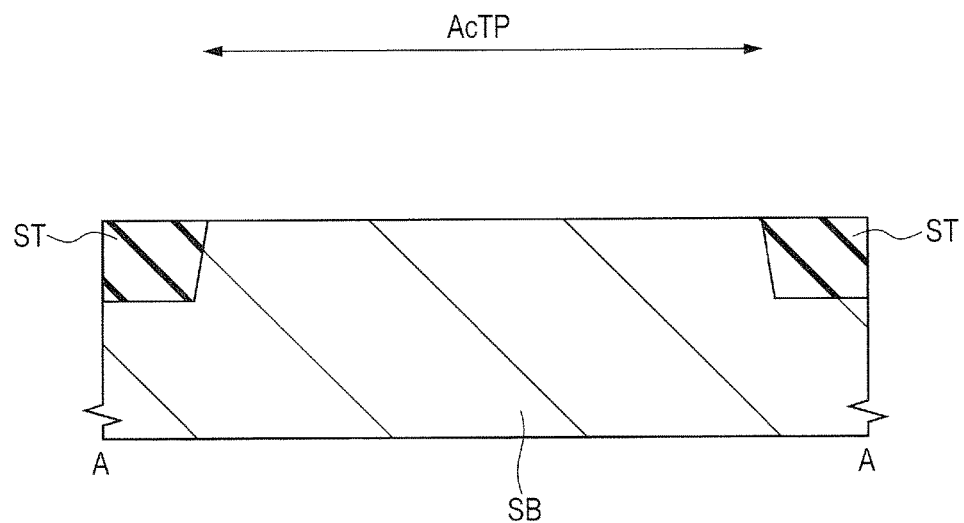
FIG. 17 is a main-portion cross-sectional view of the semiconductor device in the embodiment during the manufacturing process thereof.
Figure 18:
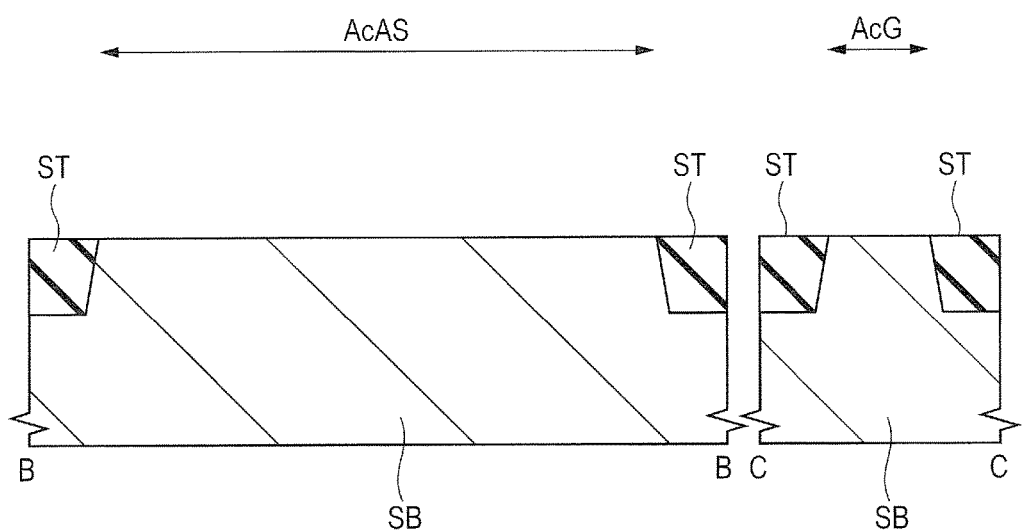
FIG. 18 is a main-portion cross-sectional view of the semiconductor device during the manufacturing process thereof, which is similar to FIG. 17.
Figure 19:
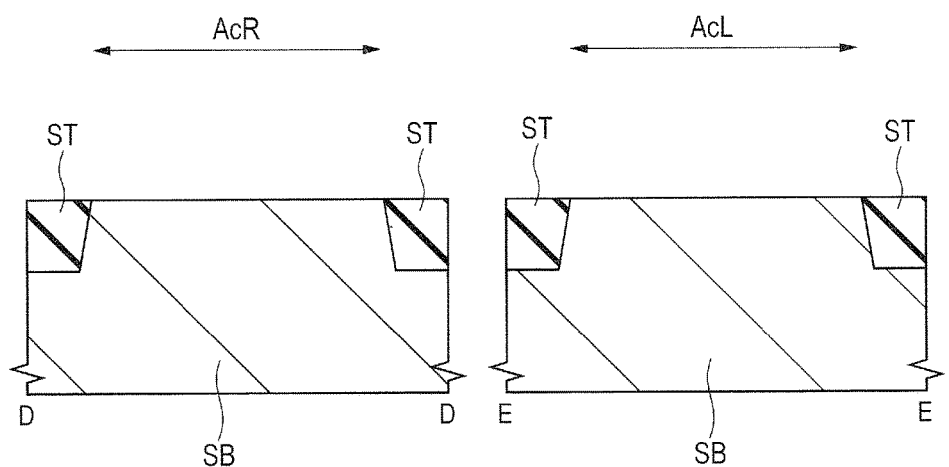
FIG. 19 is a main-portion cross-sectional view of the semiconductor device during the manufacturing process thereof, which is similar to FIG. 17.

To manufacture the semiconductor device in Embodiment 1, first, as shown in FIGS. 17 to 19, the semiconductor substrate (semiconductor wafer) SB is provided (prepared).

The semiconductor substrate SB is a semiconductor substrate (semiconductor wafer) made of n-type monocrystalline silicon in which an n-type impurity such as, e.g., phosphorus (P) or arsenic (As) is introduced or the like. In another form, the semiconductor substrate SB can also be a so-called epitaxial wafer.

Then, the isolation region ST is formed in the semiconductor substrate SB.

The isolation region ST is made of an insulating film such as a silicon dioxide film. The isolation region ST can be formed using a STI (Shallow Trench Isolation) method. In the case of using the STI method, the isolation region ST is made of an insulating film (e.g., silicon dioxide film) embedded in the trench in the semiconductor substrate SB.

That is, an isolation trench (trench for isolation) is formed in the main surface of the semiconductor substrate SB by etching or the like, and then an insulating film made of silicon dioxide (e.g., ozone TEOS oxide film) or the like is formed over the semiconductor substrate SB so as to be embedded in the isolation trench. Then, by polishing the insulating film using a CMP (Chemical Mechanical Polishing) method or the like, the unneeded insulating film located outside the isolation trench is removed, while the insulating film is left in the isolation trench to be able to form the isolation region ST made of an insulating film (insulator) embedded in the isolation trench. In another form, the isolation region ST can also be formed using a LOCOS (Local oxidation of silicon) method instead of the STI method.

The isolation region ST defines (demarcates) the active regions of the semiconductor substrate SB, such as the active regions AcTP, AcR, AcAS, AcG, and AcL. Note that the active regions AcTP, AcR, AcAS, and AcG are formed in the pixel region 1A, while the active region AcL is formed in the peripheral circuit region 2A.

Figure 20:
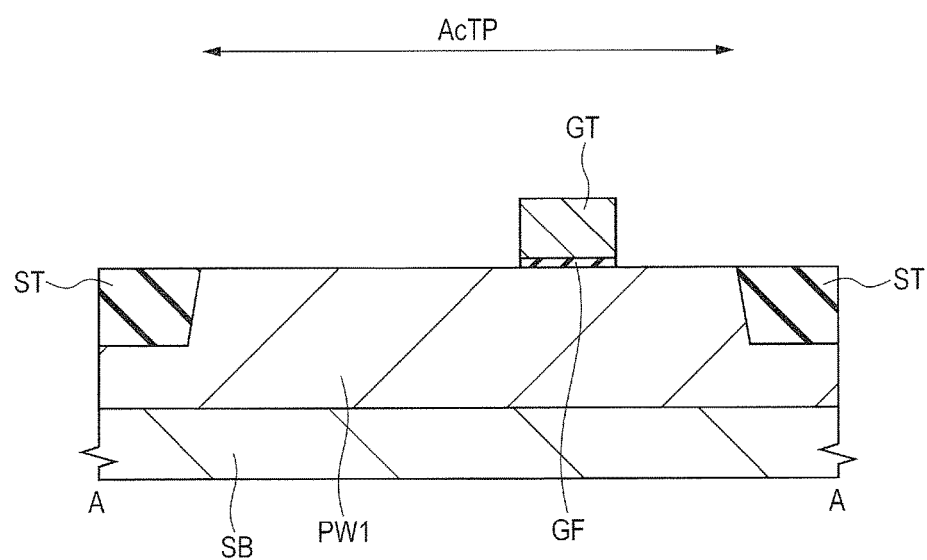
FIG. 20 is a main-portion cross-sectional view of the semiconductor device during the manufacturing process thereof, which is subsequent to FIG. 17.
Figure 21:
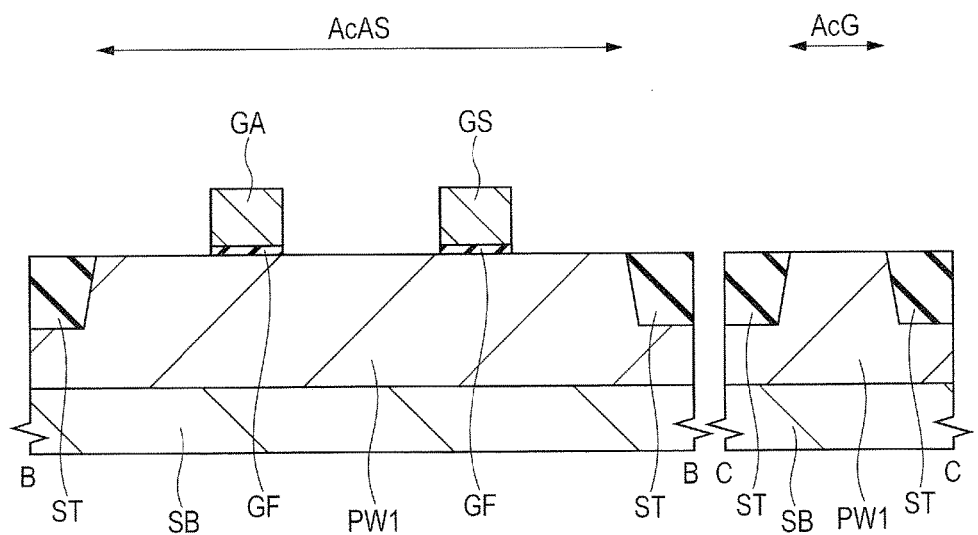
FIG. 21 is a main-portion cross-sectional view of the semiconductor device during the manufacturing process thereof, which is similar to FIG. 20.
Figure 22:
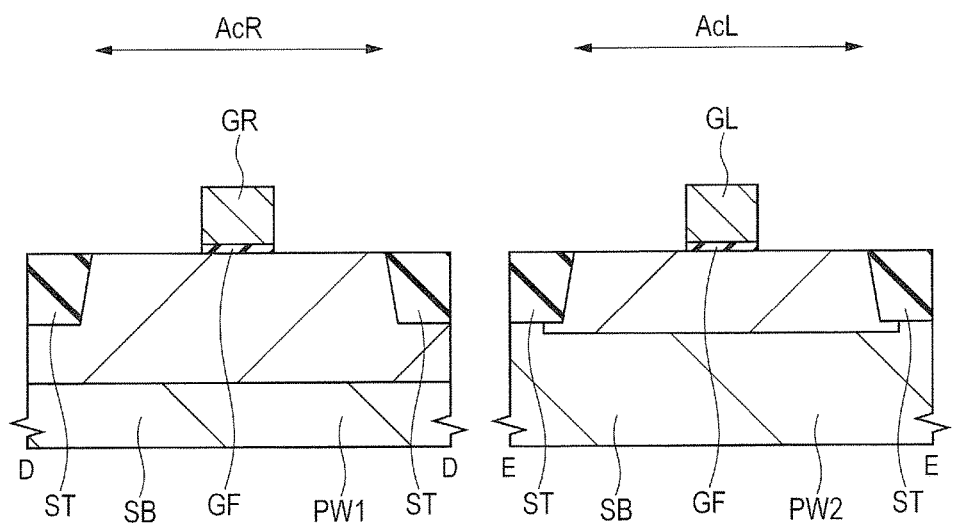
FIG. 22 is a main-portion cross-sectional view of the semiconductor device during the manufacturing process thereof, which is similar to FIG. 20.

Next, as shown in FIGS. 20 to 22, in the semiconductor substrate SB in the pixel region 1A, the p-type well (p-type semiconductor region) PW1 is formed. Also, in the semiconductor substrate SB in the peripheral circuit region 2A, the p-type well (p-type semiconductor region) PW2 is formed.

Each of the p-type wells PW1 and PW2 is formed to a predetermined depth from the main surface of the semiconductor substrate SB. The p-type wells PW1 and PW2 can be formed by ion-implanting a p-type impurity such as, e.g., boron (B) into the semiconductor substrate SB. Either of the p-type wells PW1 and PW2 may be formed first.

The p-type well PW1 is formed in substantially the entire pixel region 1A. Accordingly, in plan view, the active regions AcTP, AcR, AcAS, and AcG are included in the p-type well PW1, On the other hand, the p-type well PW2 is formed in the peripheral circuit region 2A.

Next, in the pixel region 1A, over the semiconductor substrate SB (p-type well PW1), the gate electrode GT for the transfer transistor TX, the gate electrode GR for the reset transistor RST, the gate electrode GS for the selection transistor SEL, and the gate electrode GA for the amplification transistor AMI are formed via the respective gate insulating films GF. Also, in the peripheral circuit region 2A, over the semiconductor substrate SB (p-type well PW2), the gate electrode GL for the peripheral transistor LT is formed via the gate insulating film GF.

Specifically, the gate electrodes can be formed as follows.

That is, first, the main surface of the semiconductor substrate SB is cleaned by cleaning treatment or the like. Then, over the main surface of the semiconductor substrate SB, an insulating film (e.g., silicon dioxide film) for the gate insulating films GF is formed. Then, over the semiconductor substrate SB, i.e., over the insulating film for the gate insulating films GF, a conductive film (e.g., polycrystalline silicon film) for the gate electrodes is formed using a CVD (Chemical Vapor Deposition) method or the like. Then, the conductive film for the gate electrodes is patterned using a photolithographic method and a dry etching method. In this manner, the gate electrodes GT, GR, GS, GA, and GL each made of the patterned conductive film (e.g., polycrystalline silicon film) can be formed. The insulating film for the gate insulating films GF remaining under the gate electrodes GT, GR, GS, GA, and GL serves as the gate insulating films GE.

Figure 23:
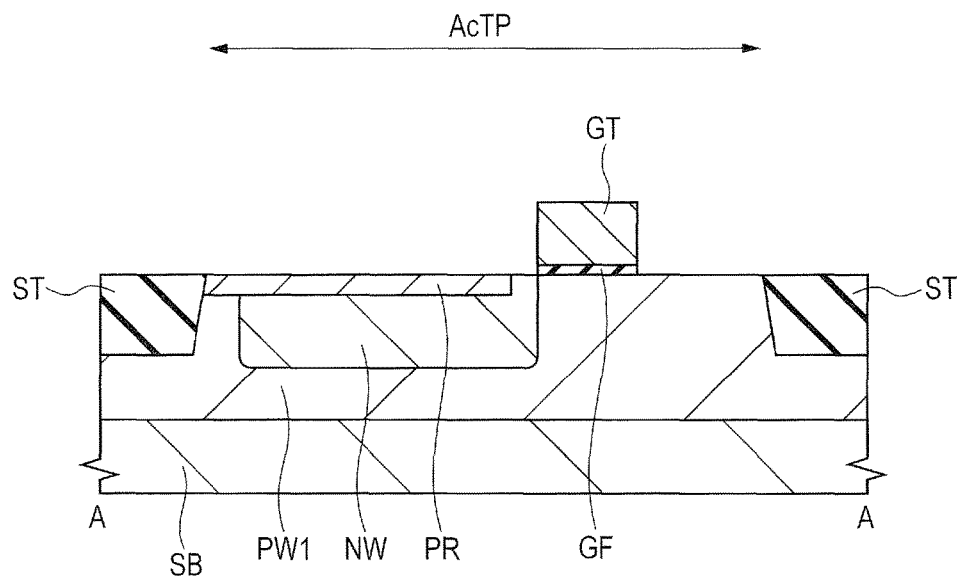
FIG. 23 is a main-portion cross-sectional view of the semiconductor device during the manufacturing process thereof, which is subsequent to FIG. 20.
Figure 24:
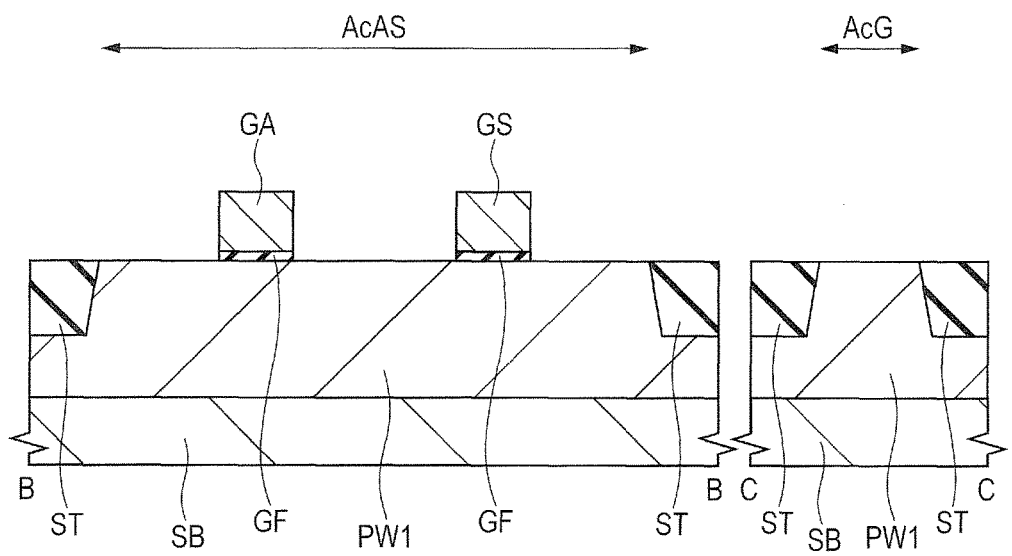
FIG. 24 is a main-portion cross-sectional view of the semiconductor device during the manufacturing process thereof, which is similar to FIG. 23.
Figure 25:
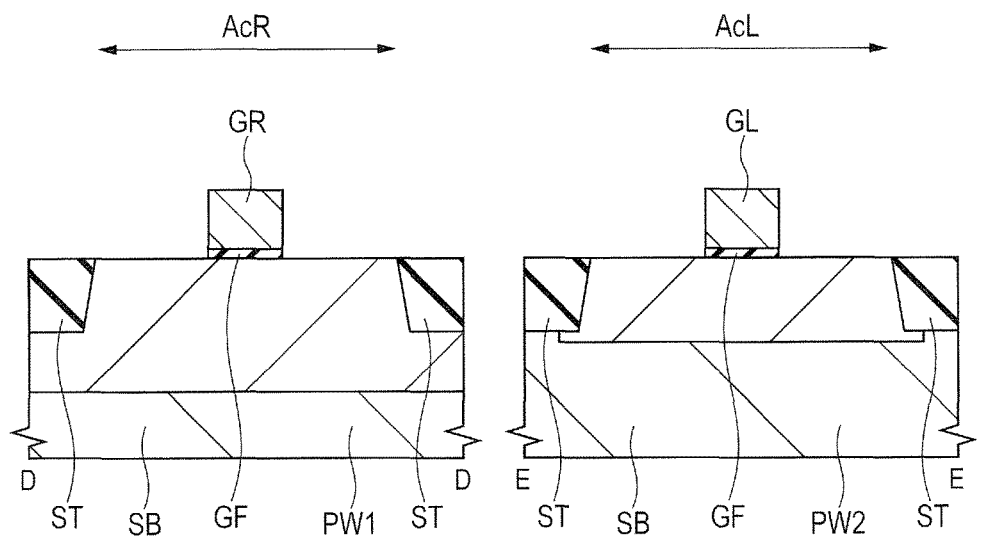
FIG. 25 is a main-portion cross-sectional view of the semiconductor device during the manufacturing process thereof, which is similar to FIG. 23.

Next, as shown in FIGS. 23 to 25, in the semiconductor substrate SB in the active region AcTP in the pixel region 1A, the n-type semiconductor region NW is formed by ion implantation. The n-type semiconductor region NW can be formed by ion-implanting an n-type impurity such as phosphorus (P) or arsenic (As) into the semiconductor substrate SB in the active region AcTP in the pixel region 1A.

The n-type semiconductor region NW is intended to form the photodiode PD and is formed to have a depth (of the bottom surface thereof) shallower than the depth (of the bottom surface) of the p-type well PW1 and be included in the p-type well PW1. Consequently, the bottom and side surfaces of the n-type semiconductor region NW are in contact with the p-type well PW1. Also, the n-type semiconductor region NW is formed not in the entire active region AcTP in the pixel region 1A. The n-type semiconductor region NW is formed on the one (source-side region) of the regions of the semiconductor substrate SB in the active region AcTP which are located on both sides of the gate electrode GT, but is not formed on the other region (drain-side region). In ion implantation for forming the n-type semiconductor region NW, the semiconductor substrate SB except for the region thereof where the n-type semiconductor region NW is to be formed is covered with a photoresist pattern (not shown) so that an n-type impurity is selectively ion-implanted into the region where the n-type semiconductor region NW is to be formed.

The description has been given herein of the case where the n-type semiconductor region NW is formed by ion implantation after the formation of the gate electrode GT. However, in another form, the n-type semiconductor region NW can also be formed by ion implantation before the formation of the gate electrode GT. For example, it is also possible to form the n-type semiconductor region NW by ion implantation in the state where the semiconductor substrate SB except for the region thereof where the n-type semiconductor region NW is to be formed is covered with a photoresist pattern (accordingly, in the state where the region of the semiconductor substrate SB where the gate electrode GT is to be formed and the like are also covered with the photoresist pattern) and subsequently perform the step of forming the gate electrode. In the case where the n-type semiconductor region NW is formed by ion implantation before the formation of the gate electrode GT, an advantage is obtained in that, irrespective of the structure (thickness) of the gate electrode GT, the n-type semiconductor region NW can be formed deep.

Next, in the semiconductor substrate SB in the active region AcTP in the pixel region 1A, the $p^+$-type semiconductor region PR is formed by ion implantation.

The $p^+$-type semiconductor region PR is a p-type semiconductor region where a p-type impurity is introduced (which is doped with a p-type impurity) at a high concentration. The impurity concentration (p-type impurity concentration) of the $p^+$-type semiconductor region PR is higher than the impurity concentration (p-type impurity concentration) of the p-type well PW1. The depth of the $p^+$-type semiconductor region PR (the bottom surface thereof) is shallower than the depth of the n-type semiconductor region NW (the bottom surface thereof). The $p^+$-type semiconductor region PR is formed mainly in the top layer portion (top surface region) of the n-type semiconductor region NW. In ion implantation for forming the $p^+$-type semiconductor region PR, the semiconductor substrate SB except for the region thereof where the $p^+$-type semiconductor region PR is to be formed is covered with a photoresist pattern (not shown) so that a p-type impurity is selectively ion-implanted into the region where the $p^+$-type semiconductor region PR is to be formed.

After the $p^+$-type semiconductor region PR is formed by ion implantation, anneal treatment for removing a crystal defect (crystal defect resulting mainly from the ion implantation), i.e., heat treatment can also be performed.

Figure 26:
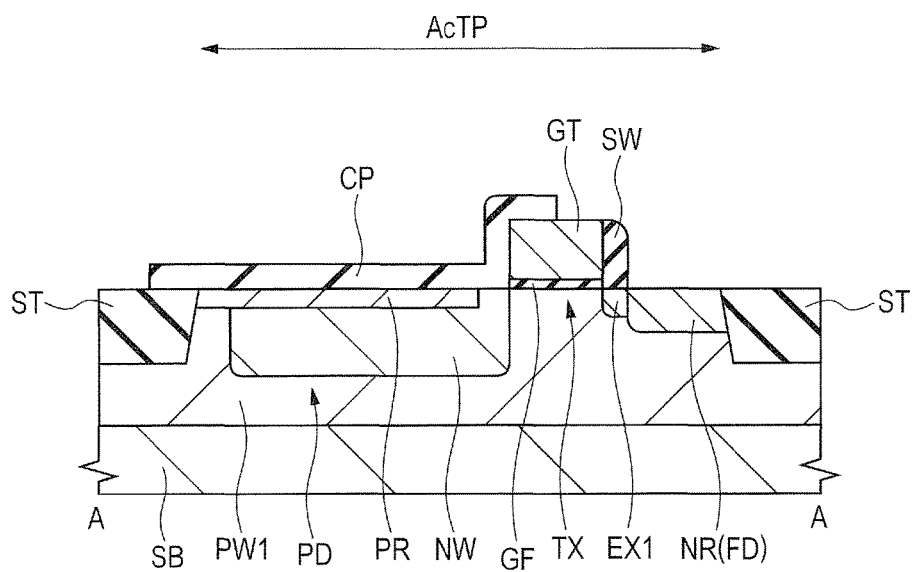
FIG. 26 is a main-portion cross-sectional view of the semiconductor device during the manufacturing process thereof, which is subsequent to FIG. 23.
Figure 27:
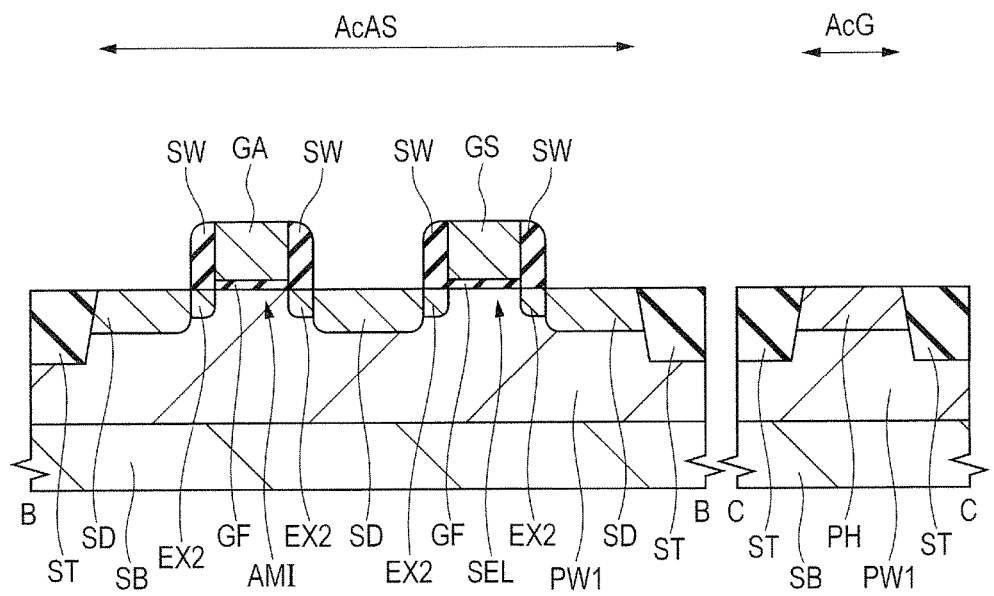
FIG. 27 is a main-portion cross-sectional view of the semiconductor device during the manufacturing process thereof, which is similar to FIG. 26.
Figure 28:
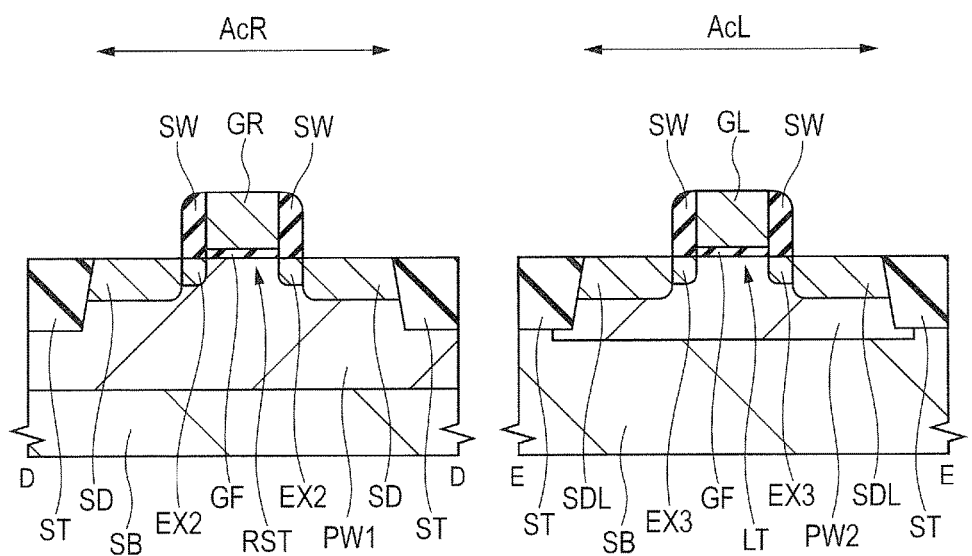
FIG. 28 is a main-portion cross-sectional view of the semiconductor device during the manufacturing process thereof, which is similar to FIG. 26.

Next, as shown in FIGS. 26 to 28, in the pixel region 1A, an $n^-$-type semiconductor region (source/drain extension region) EX1 is formed by ion implantation in the drain-side one of the regions of the semiconductor substrate SB in the active region AcTP which are located on both sides of the gate electrode GT. The $n^-$-type semiconductor region is formed in the semiconductor substrate SB (p-type well PW1) located on the drain side as one of both sides of the gate electrode GT which is adjacent to the drain. Note that the drain side corresponds to the side opposite to the side where the n-type semiconductor region NW is formed. In ion implantation for forming the n⁻-type semiconductor region EX1, the region (source-side region) where the n-type semiconductor region NW and the p⁺-type semiconductor region PR are formed is covered with a photoresist pattern (not shown). Accordingly, the n⁻-type semiconductor region EX1 is not formed in the region (source-side region) where the n-type semiconductor region NW and the p⁺-type semiconductor region PR are formed.

Also, in the pixel region 1A, in the semiconductor substrate SB (p-type well PW1) located on both sides of each of the gate electrodes GA, GS, and GR in the semiconductor substrate SB in the active regions AcAS and AcR, n⁻-type semiconductor regions (source/drain extension regions) EX2 are formed by ion implantation. On the other hand, in the peripheral circuit region 2A, in the semiconductor substrate SB (p-type well PW2) located on both sides of the gate electrode GL, n⁻-type semiconductor regions (source/drain extension regions) EX3 are formed by ion implantation.

The n⁻-type semiconductor regions EX1, EX2, and EX3 may be formed either by the same ion implantation step or by different ion implantation steps. In either case, the n⁻-type semiconductor regions EX1, EX2, and EX3 are formed by ion-implanting an n-type impurity into the semiconductor substrate SB.

Next, an insulating film (insulating film for forming the sidewall spacers SW) is formed over the entire main surface of the semiconductor substrate SB so as to cover the gate electrodes GT, GA, GS, GR, ad GL. Then, the insulating film is etched back using an anisotropic etching technique to be selectively left over the respective side walls of the gate electrodes GT, GA, GS, GR, and GL and form the sidewall spacers SW. In the etch-back process, a photoresist pattern (not shown) is formed over the insulating film for forming the sidewall spacers SW and the insulating film for forming the sidewall spacers SW is left under the photoresist pattern to be able to form the cap insulating film CP. The cap insulating film CP is formed so as to cover the n-type semiconductor region NW and the p⁺-type semiconductor region PR. It is also possible for a portion (end portion) of the cap insulating film CP to lie over the gate electrode GT. In this case, over the drain-side side wall as one of the both side walls (source- and drain-side side walls) of the gate electrode GT, the sidewall spacer SW is formed. However, over the source-side side wall, the sidewall spacer SW is not formed so that the source-side side wall is covered with the cap insulating film CP.

Next, in the pixel region 1A, in the drain-side one of the regions of the semiconductor substrate SB in the active region AcTP which are located on both sides of the gate electrode GT, the n-type semiconductor region NR is formed by ion implantation. The n-type semiconductor region NR is formed in the semiconductor substrate SB (p-type well PW1) located on the drain side as one of both sides of the gate electrode GT. During the ion implantation for forming the n-type semiconductor region NR, the region (source-side region) where the n-type semiconductor region NW and the p⁺-type semiconductor region PR are formed is covered with a photoresist pattern (not shown). Consequently, the n-type semiconductor region NR is not formed in the region (source-side region) where the n-type semiconductor region NW and the p⁺-type semiconductor region PR are formed.

In the pixel region 1A, in the semiconductor substrate SB (p-type well PW1) located on both sides of each of the gate electrodes GA, GS, and GR in the active regions AcAS and AcR, the source/drain regions SD are formed by ion implantation. On the other hand, in the peripheral circuit region 2A, in the semiconductor substrate SB (p-type well PW2) located on both sides of the gate electrode GL, the source/drain regions SDL are formed by ion implantation.

The n-type semiconductor region NR and the source/drain regions SD and SDL may be formed either by the same ion implantation step or by different ion implantation steps. In either case, the n-type semiconductor region NR and the source/drain regions SD and SDL are formed by ion-implanting an n-type impurity into the semiconductor substrate SB.

Note that, during the ion implantation for forming the n⁻-type semiconductor region EX1, the gate electrode GT may function as an ion implantation blocking mask. On the other hand, during the ion implantation for forming the n-type semiconductor region NR, the gate electrode GT and the sidewall spacer SW over the side wall thereof may function as an ion implantation blocking mask. Accordingly, the n⁻-type semiconductor region EX1 is formed in self-alignment with the drain-side side wall of the gate electrode GT, while the n-type semiconductor region NR is formed in self-alignment with the sidewall spacer SW over the side wall of the gate electrode GT. Consequently, in the semiconductor substrate SB in the active region AcTP, the n⁻-type semiconductor region EX1 is formed to be located under the sidewall spacer SW and adjacent to a channel formation region (portion of the substrate region which is located immediately under the gate electrode CT). On the other hand, the n-type semiconductor region NR is formed at a position away from the channel formation region by a distance corresponding to the n⁻-type semiconductor region EX1 and adjacent to the n⁻-type semiconductor region EX1. The n-type semiconductor region NR has an impurity concentration (n-type impurity concentration) higher than that of the n⁻-type semiconductor region EX1 and a bottom surface at a position deeper than that of the bottom surface of the n⁻-type semiconductor region EX1.

Also, during the ion implantation for forming the n⁻-type semiconductor regions EX2, the gate electrodes GA, GS, and GR may function as an ion implantation blocking mask. On the other hand, during the ion implantation for forming the source/drain regions SD, the gate electrodes CA, GS, and GR and the sidewall spacers SW over the respective side walls thereof may function as an ion implantation blocking mask. Accordingly, the n⁻-type semiconductor regions EX2 are formed in self-alignment with the respective side walls of the gate electrodes GA, GS, and GR, while the source/drain regions SD are formed in self-alignment with the sidewall spacers SW over the respective side walls of the gate electrodes GA, GS, and GR. Consequently, in the semiconductor substrate SB in the active regions AcAS and AcR, the n⁻-type semiconductor regions EX2 are formed to be located under the respective sidewall spacers SW and adjacent to the channel formation region (portion of the substrate region which is located immediately under the gate electrode GT). On the other hand, each of the source/drain regions SD is formed at a position away from the channel formation region by a distance corresponding to the n⁻-type semiconductor region EX2 and adjacent to the n⁻-type semiconductor region EX2. Each of the source/drain regions has an impurity concentration (n-type impurity concentration) higher than that of the n⁻-type semiconductor region EX2 and a bottom surface at a position deeper than that of the bottom surface of the n⁻-type semiconductor region EX2.

Also, during the ion implantation for forming the n⁻-type semiconductor regions EX3, the gate electrode GL may function as an ion implantation blocking mask. On the other hand, during the ion implantation for forming the source/drain regions SDL, the gate electrode GL and the sidewall spacers SW over the respective side walls thereof may function as an ion implantation blocking mask. Accordingly, the n⁻-type semiconductor regions EX3 are formed in self-alignment with the respective side walls of the gate electrode GL, while the source/drain regions SDL are formed in self-alignment with the sidewall spacers SW over the respective side walls of the gate electrode GL. Consequently, in the semiconductor substrate SB in the active region AcL, the n⁻-type semiconductor regions EX3 are formed to be located under the respective sidewall spacers SW and adjacent to a channel formation region (portion of the substrate region which is located immediately under the gate electrode GL). On the other hand, each of the source/drain regions SDL is formed at a position away from the channel formation region by a distance corresponding to the n⁻-type semiconductor region EX3 and adjacent to the n⁻-type semiconductor region EX3. Each of the source/drain regions has an impurity concentration (n-type impurity concentration) higher than that of the n⁻-type semiconductor region EX3 and a bottom surface at a position deeper than that of the bottom surface of the n⁻-type semiconductor region EX3.

Next, in the pixel region 1A, the p-type semiconductor region PH is formed by ion implantation in the semiconductor substrate SB in the active region AcG. The p-type semiconductor region PH has an impurity concentration (p-type impurity concentration) higher than that of the p-type well PW1. On the other hand, the bottom surface of the p-type semiconductor region PH is shallower than the p-type well PW1. Accordingly, in the semiconductor substrate SB in the active region AcG, the p-type well PH is formed in the upper portion of the p-type well PW1 to be in contact with and electrically coupled to the p-type well PW1.

Note that the p-type semiconductor region PH is preferably formed but, in another form, the formation of the p-type semiconductor region PH can also be omitted. In the case of omitting the formation of the p-type semiconductor region PH, in a salicide step described later, the active region AcG is formed in the upper portion (top layer portion) of the p-type well PW1.

During the ion implantation for forming the p-type semiconductor region PH, the active regions AcTP, AcAS, AcR, and AcL are covered with a photoresist pattern (not shown) such that a p-type impurity is not implanted therein. In the case of forming a p-channel MISFET in the peripheral circuit region 2A, the p-type semiconductor region PH can also be formed together with the source/drain regions (not shown) of the p-channel MISFET in the ion implantation step for forming the source/drain regions (not shown) of the p-channel MISFET. In either case, the p-type semiconductor region PH is formed by ion-implanting a p-type impurity into the semiconductor substrate SB.

Figure 29:
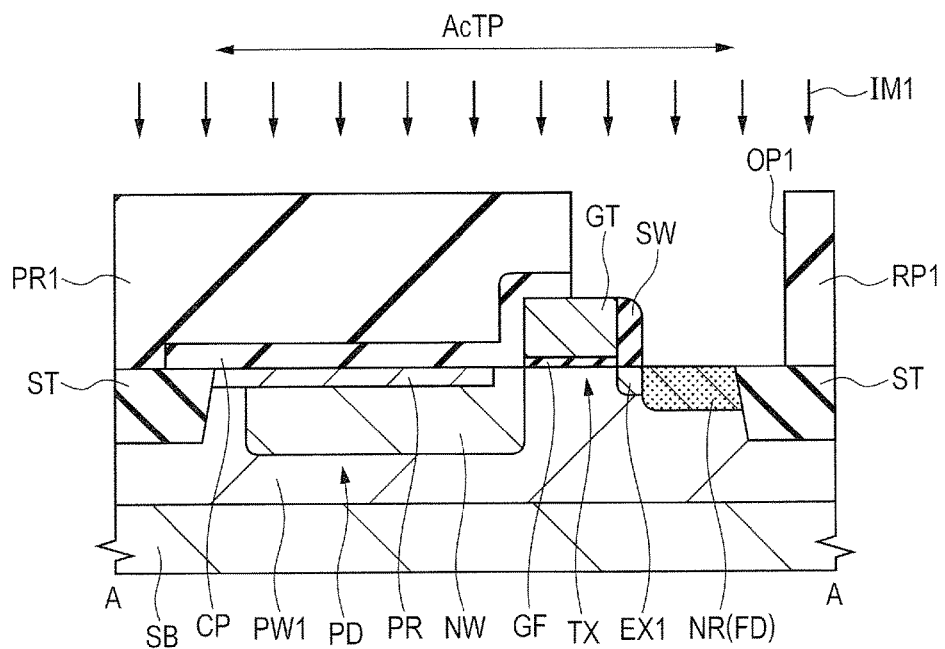
FIG. 29 is a main-portion cross-sectional view of the semiconductor device during the manufacturing process thereof, which is subsequent to FIG. 26.
Figure 30:
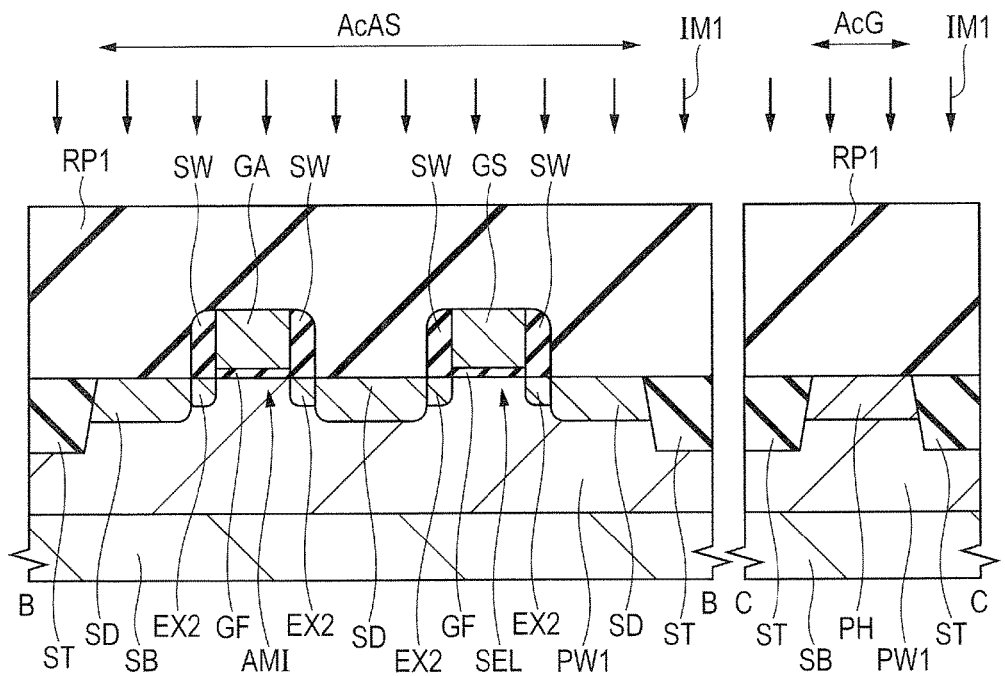
FIG. 30 is a main-portion cross-sectional view of the semiconductor device during the manufacturing process thereof, which is similar to FIG. 29.
Figure 31:
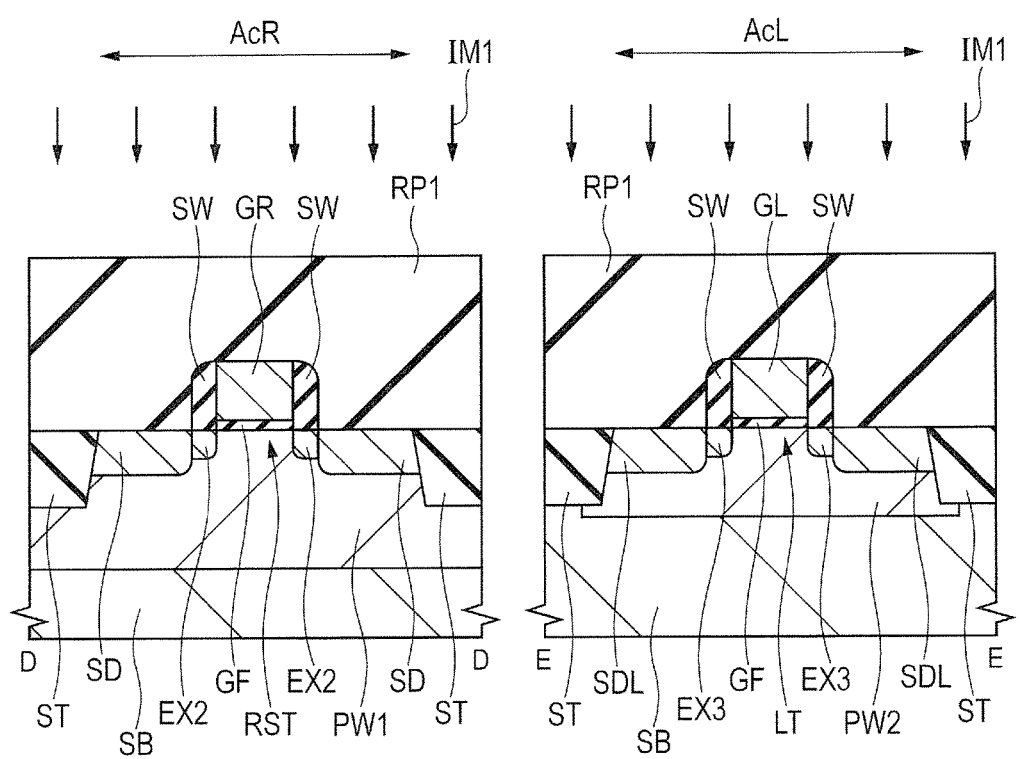
FIG. 31 is a main-portion cross-sectional view of the semiconductor device during the manufacturing process thereof, which is similar to FIG. 29.

Next, as shown in FIGS. 29 to 31, the step of implanting a gettering element (ion implantation IM1) is performed. The step of implanting a gettering element is specifically performed as follows.

That is, first, over the main surface of the semiconductor substrate SB, a resist pattern (photoresist pattern) RP1 is formed using a photolithographic technique. Note that the photolithographic technique is a technique which forms a resist film (photoresist film) over the entire main surface of the semiconductor substrate by a coating method or the like and exposes/develops the resist film to pattern the resist film and thus obtain an intended resist pattern (photoresist pattern). The resist pattern RP1 has an opening OP1 which exposes a portion of the active region AcTP in the pixel region 1A. The opening OP1 includes the n-type semiconductor region NR formed in the active region AcTP in plan view. However, in plan view, the opening OP1 overlaps neither the n-type semiconductor region NW nor the p⁺-type semiconductor region PR. The n-type semiconductor region NW and the p⁺-type semiconductor region PR are covered with the resist pattern RP1. That is, in the active region AcTP, the source-side region (region where the photodiode PD is formed) as one of the regions on both sides of the gate electrode GT is covered with the resist pattern RP1, while the drain-side region (region where the n-type semiconductor region NR is formed) as the other of the regions on both sides of the gate electrode GT is not covered with the resist pattern RP1 but is exposed from the opening OP1. Consequently, the side surface of the opening OP1 has a portion located over the gate electrode GT. Also, the active regions AcAS, AcR, and AcG in the pixel region 1A are covered with the resist pattern RP1. In addition, since the entire peripheral circuit region 2A is covered with the resist pattern RP1, the active region AcL is also covered with the resist pattern RP1.

Then, using the resist pattern RP1 as an ion implantation blocking mask, a gettering element is ion-implanted into the semiconductor substrate SB. In FIGS. 29 to 31, the ion implantation IM1 for implanting a gettering element is schematically shown by the arrows. Also, in FIGS. 29 to 31, the region of the semiconductor substrate SB where the gettering element is implanted by the ion implantation IM1 is hatched with dots. A gettering element is preferably carbon (C). In the ion implantation IM1, carbon (C) or a carbon compound, e.g., a carbon cluster (such as $C_{16}Hx^+$ or $C_7Hx^+$) can be ion-implanted.

The depth reached by the implanted gettering element can be set to, e.g., about 30 to 70 nm. Note that the depth reached by the implanted gettering element corresponds to the distance (distance in a direction generally perpendicular to the main surface of the semiconductor substrate SB) from the top surface of the semiconductor substrate SB in the active region to the bottom surface of the region where the gettering element is implanted. In the case where the depth reached by the implanted gettering element is set to, e.g., about 50 nm, in the region of the semiconductor substrate SB where the gettering element is implanted, the gettering element is introduced to a depth of about 50 nm from the top surface of the semiconductor substrate SB. The depth reached by the implanted gettering element can be set substantially the same as the depth of the n-type semiconductor region NR (or each of the source/drain regions SD in the case shown in Embodiment 3 described later), but may also be larger or smaller than the depth of the n-type semiconductor region NR (or each of the source/drain regions SD in the case shown in Embodiment 3 described later). However, when the depth reached by the implanted gettering element is excessively large, the effect of gettering contaminant metal in a shallower region may deteriorate. Accordingly, it is more preferable that the depth reached by the implanted gettering element is not excessively increased and is set to be not more than 100 nm. The concentration of the gettering element (preferably carbon) in the region of the semiconductor substrate SB where the gettering element is implanted can be set to, e.g., about $2\times10^{20}/cm^3$ to $1\times10^{21}/cm^3$.

Since the n-type semiconductor region NR is included in the opening OP1 in plan view, when the ion implantation IM1 is performed, as can be seen also from FIG. 29, the gettering element is implanted (introduced) into the n-type semiconductor region NR. On the other hand, into the region of the semiconductor substrate SB in the active region AcTP in the pixel region 1A where the photodiode PD is formed (region where the n-type semiconductor region NW and the p+-type semiconductor region PR are formed), the gettering element is not implanted. That is, in the active region AcTP, into the source-side region (region where the photodiode PD is formed) located on one of both sides of the gate electrode GT, the gettering element is not implanted, but is implanted into the drain-side region (region where the n-type semiconductor region NR is formed) located on the other side of the gate electrode GT. In addition, since the gate electrode GT and the sidewall spacer SW may also function as an ion implantation blocking mask, the gettering element is implanted neither into the region of the semiconductor substrate SB in the active region AcTP which is immediately under the gate electrode GT nor into the region of the semiconductor substrate SB in the active region AcTP which is immediately under the sidewall spacer SW.

Also, in the ion implantation IM1, the resist pattern RP1 functions as an ion implantation blocking mask. Accordingly, as can be seen also from FIGS. 30 and 31, even when the ion implantation IM1 is performed, the gettering element is implanted (introduced) neither into the semiconductor substrate SB in the active regions AcAS, AcR, and AcG in the pixel region 1A nor into the semiconductor substrate SB in the peripheral circuit region 2A (including the active region AcL).

As a result, in the ion implantation IM1, the gettering element is selectively implanted (introduced) into the n-type semiconductor region NR.

After the ion implantation IM1, the resist pattern RP1 is removed by ashing or the like.

The description has been given herein of the case where, after the n-type semiconductor region NR or the like is formed by ion implantation, the ion implantation IM1 is performed. In another form, it is also possible to perform the ion implantation IM1 first and then form the n-type semiconductor region NR or the like by ion implantation. In this case, it is appropriate to perform the step (step of implanting the gettering element) in FIGS. 29 to 31 described above after the sidewall spacers SW and the cap insulating film CP are formed and then form the n-type semiconductor region NR, the source/drain regions SD, the source/drain regions SDL, and the p-type semiconductor region PH.

Next, anneal treatment (heat treatment) for activating the impurities introduced in the previous ion implantation steps is performed.

The region (including the region where the gettering element is implanted) subjected to the ion implantation has been amorphized by the ion implantation, but can be recrystallized during the activation anneal treatment. In the region where the gettering element is implanted, the introduced gettering element may cause a strain during the crystallization, which may form a defect. In the region where the gettering element is implanted, the defect (gettering site) thus formed captures contaminant metal to be able to have a gettering function.

By the foregoing process steps, in the semiconductor substrate SB located in the pixel region 1A, the photodiode PD, the transfer transistor TX, the reset transistor RST, the selection transistor SEL, and the amplification transistor AMI are formed while, in the semiconductor substrate SB located in the peripheral circuit region 2A, the peripheral transistor LT is formed as the MISFET.

Figure 32:
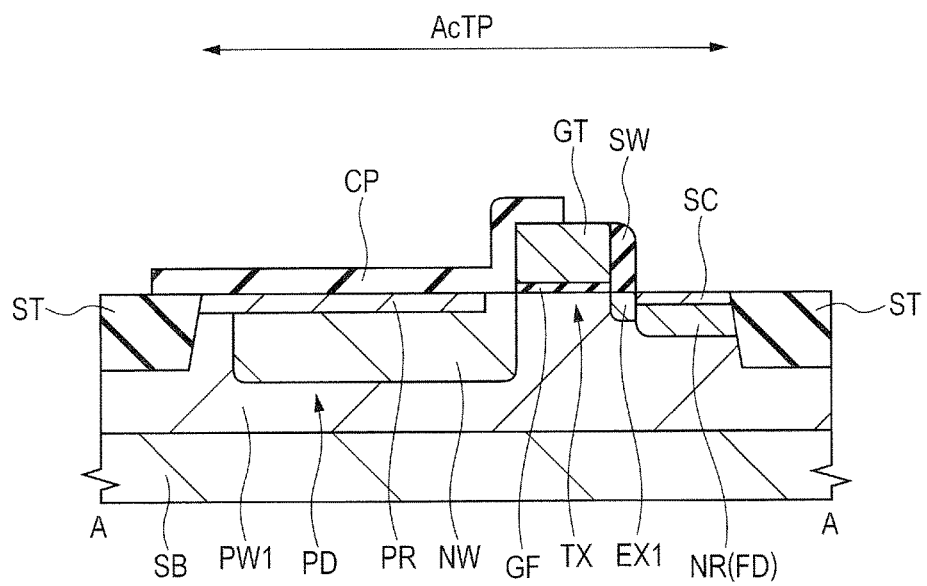
FIG. 32 is a main-portion cross-sectional view of the semiconductor device during the manufacturing process thereof, which is subsequent to FIG. 29.
Figure 33:
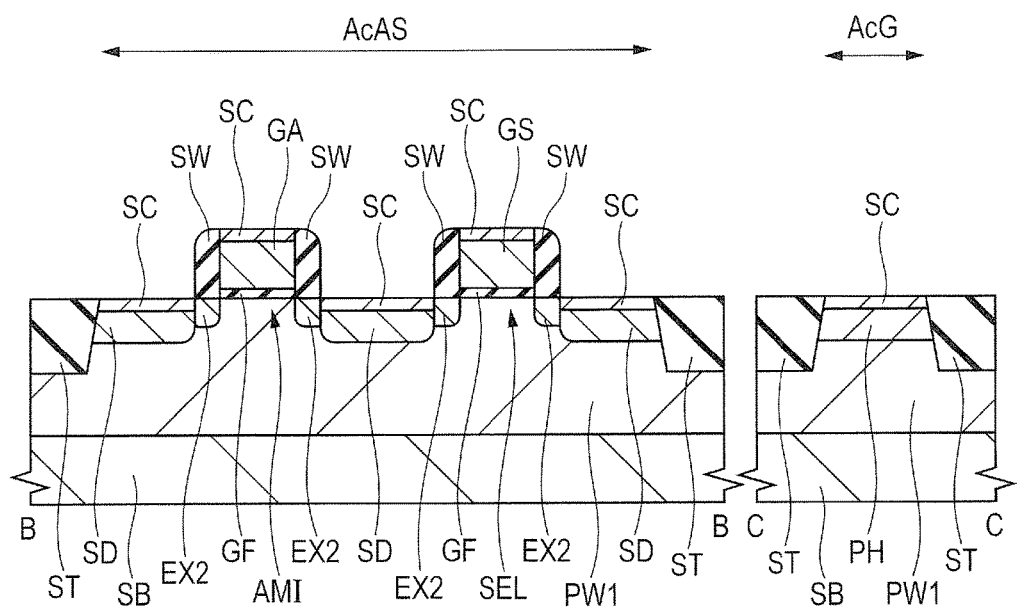
FIG. 33 is a main-portion cross-sectional view of the semiconductor device during the manufacturing process thereof, which is similar to FIG. 32.
Figure 34:
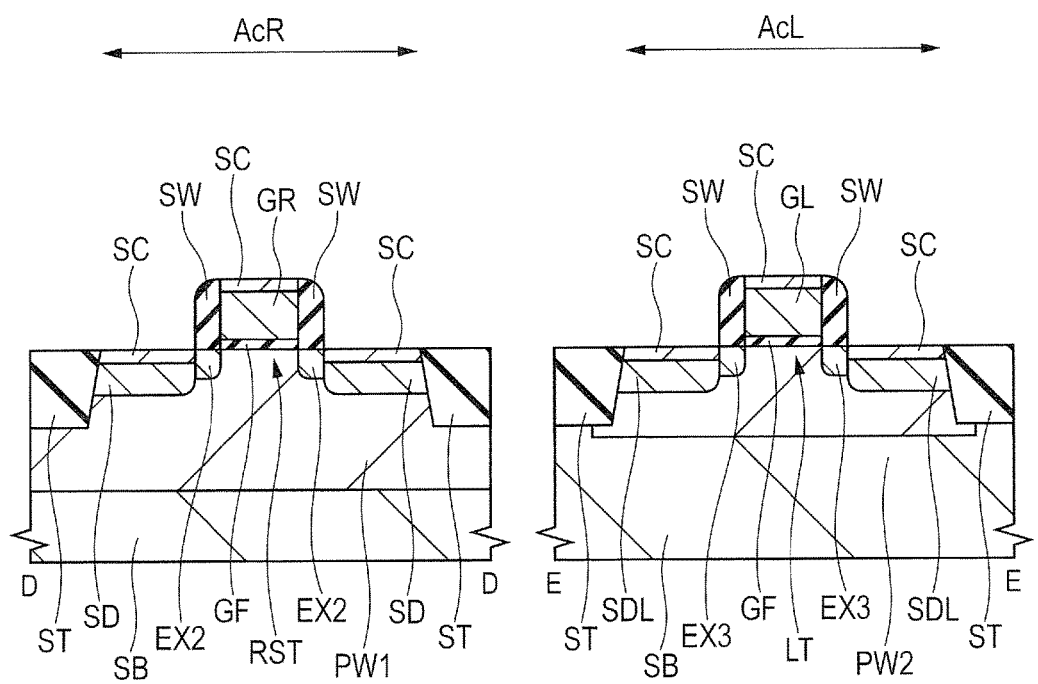
FIG. 34 is a main-portion cross-sectional view of the semiconductor device during the manufacturing process thereof, which is similar to FIG. 32.

Next, as shown in FIGS. 32 to 34, using a salicide (Self Aligned Silicide) technique, the metal silicide layers SC are formed in the respective upper portions (top layer portions) of the p-type semiconductor region PH, the n-type semiconductor region NR, and the source drain regions SD and SDL, the respective upper portions (top layer portions) of the gate electrodes GA, GS, GR, and GL, and the like. The metal silicide layer SC may also be formed in the upper portion (top layer portion) of the gate electrode GT, though not shown in FIG. 32.

To form the metal silicide layers SC, e.g., a metal film for forming the metal silicide layers is formed over the semiconductor substrate SB so as to cover the gate electrodes GT, GA, GS, GR, and GL, the sidewall spacers SW, and the cap insulating film CP. Then, by performing heat treatment, the metal film is caused to react with the respective top layer portions of the p-type semiconductor region PH, the n-type semiconductor region NR, and the source/drain regions SD and SDL and with the respective top layer portions of the gate electrodes GT, GA, GS, GR, and CL to form the metal silicide layers (metal silicide films) SC as metal-semiconductor reaction layers. Then, the unreacted portion of the metal film is removed by wet etching or the like. After the unreacted metal film is removed, the semiconductor substrate SB can also be subjected to heat treatment as necessary. In this manner, the metal silicide layers SC can be formed. By forming the metal silicide layers SC, diffusion resistance, contact resistance, and the like can be reduced. The metal silicide layers SC are a cobalt silicide layer, a nickel silicide layer, or a nickel platinum silicide layer (nickel silicide layer doped with platinum).

Before the metal film for forming the metal silicide layer is formed, such an insulating film (silicide block film) as covering a silicon substrate region and gate electrodes which need not be silicidized may also be formed. This prevents the metal film for forming the metal silicide layers from coming into contact with the silicon substrate region and the gate electrodes which are covered with the insulating film so that the metal silicide layers SC are not formed. For example, after such an insulating film (silicide block film) as covering the gate electrode GT and the cap insulating film CP and exposing the p-type semiconductor region PH, the n-type semiconductor region NR, the source/drain regions SD and SDL, and the gate electrodes GA, GS, GR, and GL is formed, the metal film for forming the metal silicide layers is formed and subjected to heat treatment. As a result, the metal silicide layer SC is formed in the upper portion of each of the p-type semiconductor region PH, the n-type semiconductor region NR, the source/drain regions SD and SDL, and the gate electrodes GA, GS, GR, and GL, but is not formed over the gate electrode GT.

Figure 35:
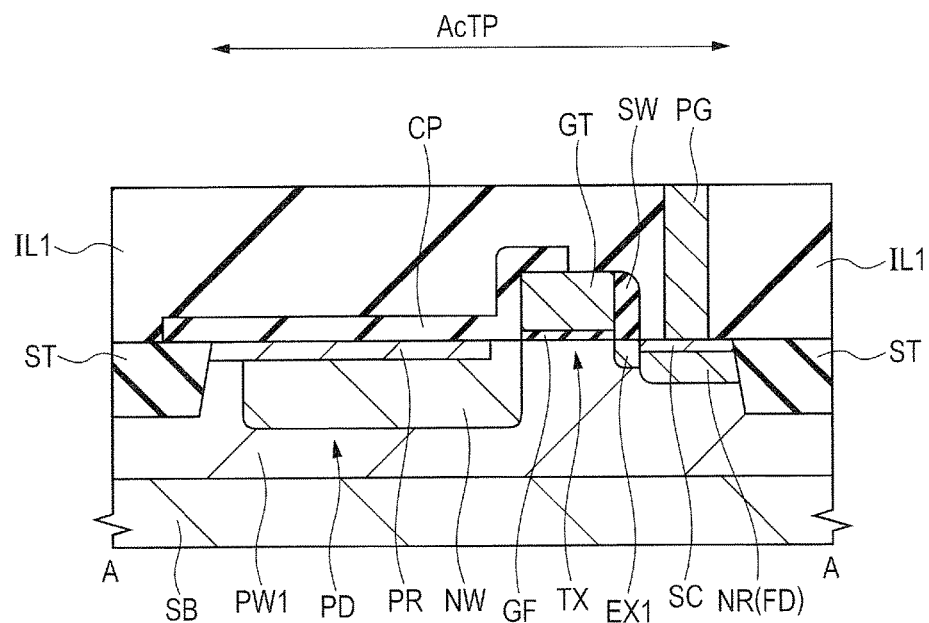
FIG. 35 is a main-portion cross-sectional view of the semiconductor device during the manufacturing process thereof, which is subsequent to FIG. 32.
Figure 36:
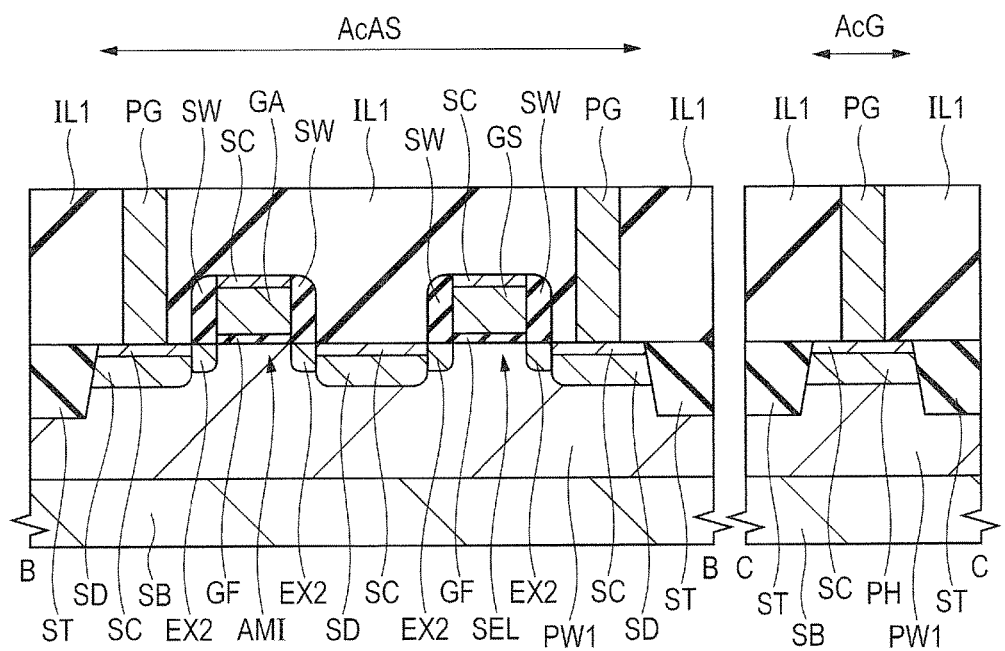
FIG. 36 is a main-portion cross-sectional view of the semiconductor device during the manufacturing process thereof, which is similar to FIG. 35.
Figure 37:
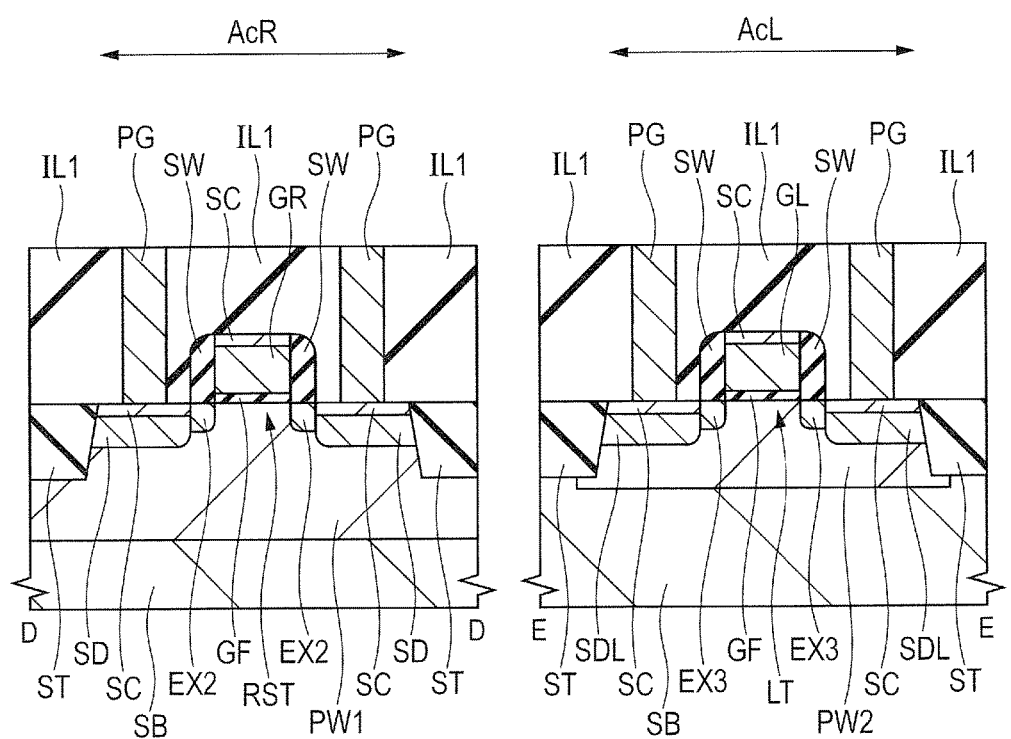
FIG. 37 is a main-portion cross-sectional view of the semiconductor device during the manufacturing process thereof, which is similar to FIG. 35.

Next, as shown in FIGS. 35 to 37, over the main surface (entire main surface) of the semiconductor substrate SB, the interlayer insulating film IL1 is formed so as to cover the gate electrodes GT, GA, GS, GR, and GL, the sidewall spacers SW, and the cap insulating film CP. The interlayer insulating film IL1 is made of, e.g., a single-layer silicon dioxide film, a multi-layer film including a silicon nitride film and a silicon dioxide film over the silicon nitride film, or the like. The interlayer insulating film IL1 can be formed using a CVD method or the like. After the deposition of the interlayer insulating film IL1, the upper surface of the interlayer insulating film IL1 can also be polished as necessary by a CMP method to be planarized.

Next, using a photoresist pattern (not shown) formed over the interlayer insulating film IL1 as an etching mask, the interlayer insulating film IL1 is dry-etched to be formed with the contact holes. The contact holes are formed so as to extend through the interlayer insulating film IL1.

Next, in the contact holes of the interlayer insulating film IL1, the conductive plugs PG made of tungsten (W) or the like are formed as coupling conductor portions. For example, the plugs PG can be formed as follows.

To form the plugs PG, first, a barrier conductor film is formed over the interlayer insulating film IL4 including the bottom surfaces and the inner walls of the contact holes. The barrier conductor film is made of a multi-layer film including, e.g., a titanium film and a titanium nitride film formed over the titanium film and can be formed using a sputtering method or the like. Then, a main conductor film made of a tungsten film or the like is formed over the barrier conductor film by a CVD method or the like so as to be embedded in each of the contact holes. Then, the unneeded main conductor film and the unneeded barrier conductor film which are located outside the contact holes (over the interlayer insulating film IL1) are removed by a CMP method, an etch-back method, or the like. As a result, the upper surface of the interlayer insulating film IL1 is exposed and the barrier conductor film and the main conductor film which are left embedded in the contact holes of the interlayer insulating film IL1 form the plugs PG. Note that, for the sake of simpler illustration in FIGS. 35 to 37, the barrier conductor film and the main conductor film which are included in each of the plugs PG are integrally shown. The plugs PG include the foregoing plugs Pr1, Pr2, Pg1, Pfd, Pa, Ps, Prg, Ptg, Pag, Psg, Pt1, and Pt2.

Figure 38:
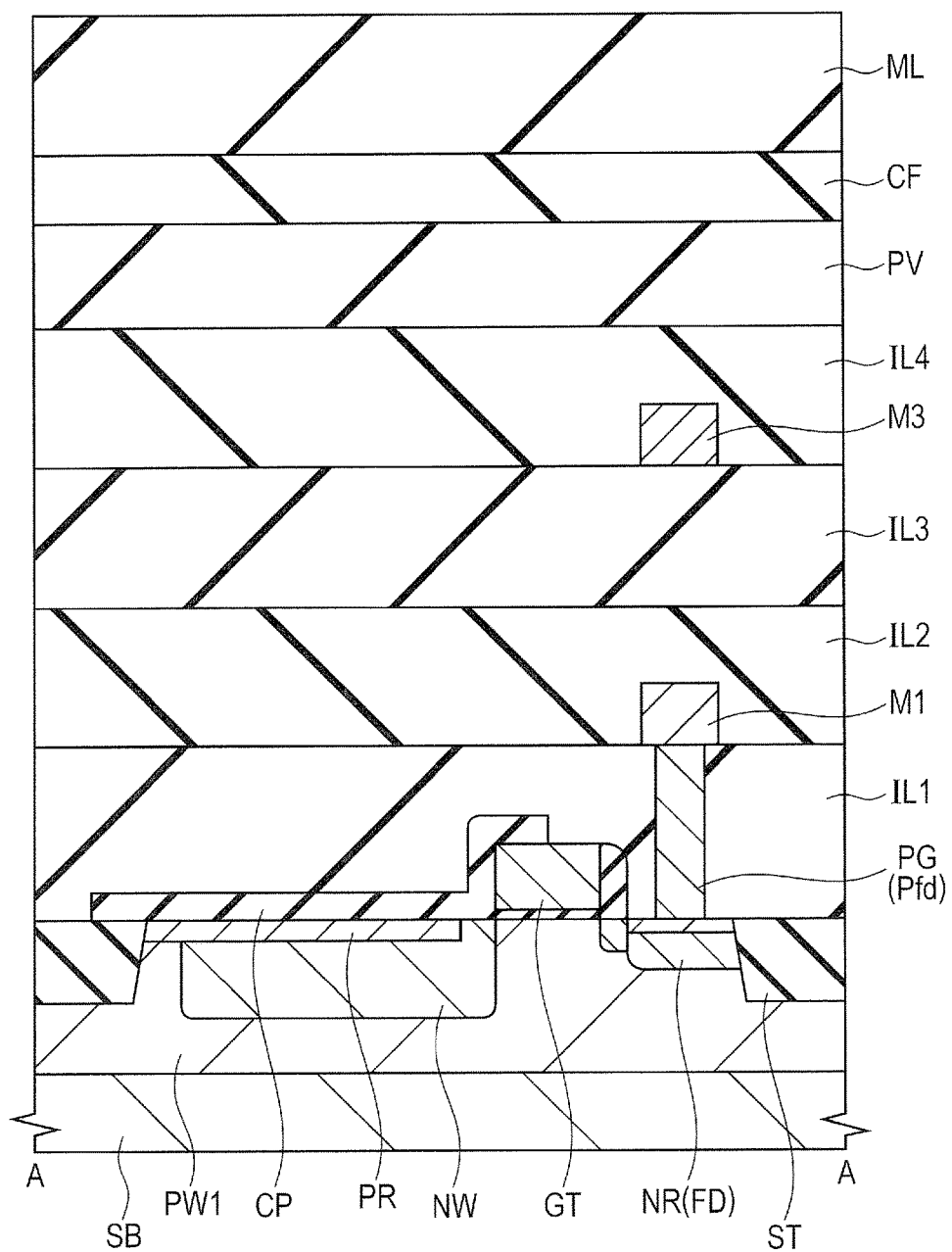
FIG. 38 is a main-portion cross-sectional view of the semiconductor device during the manufacturing process thereof, which is subsequent to FIG. 35.
Figure 39:
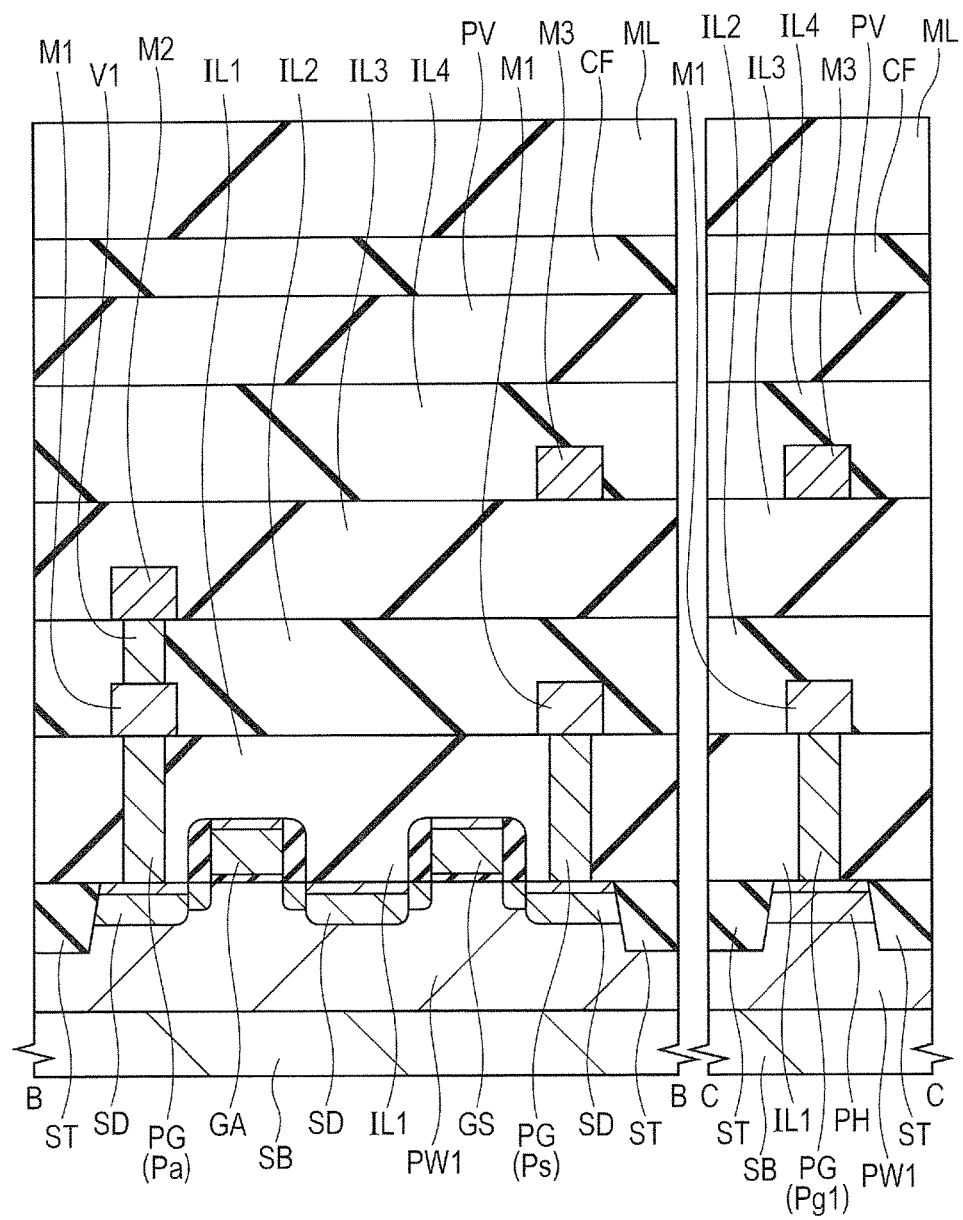
FIG. 39 is a main-portion cross-sectional view of the semiconductor device during the manufacturing process thereof, which is similar to FIG. 38.
Figure 40:
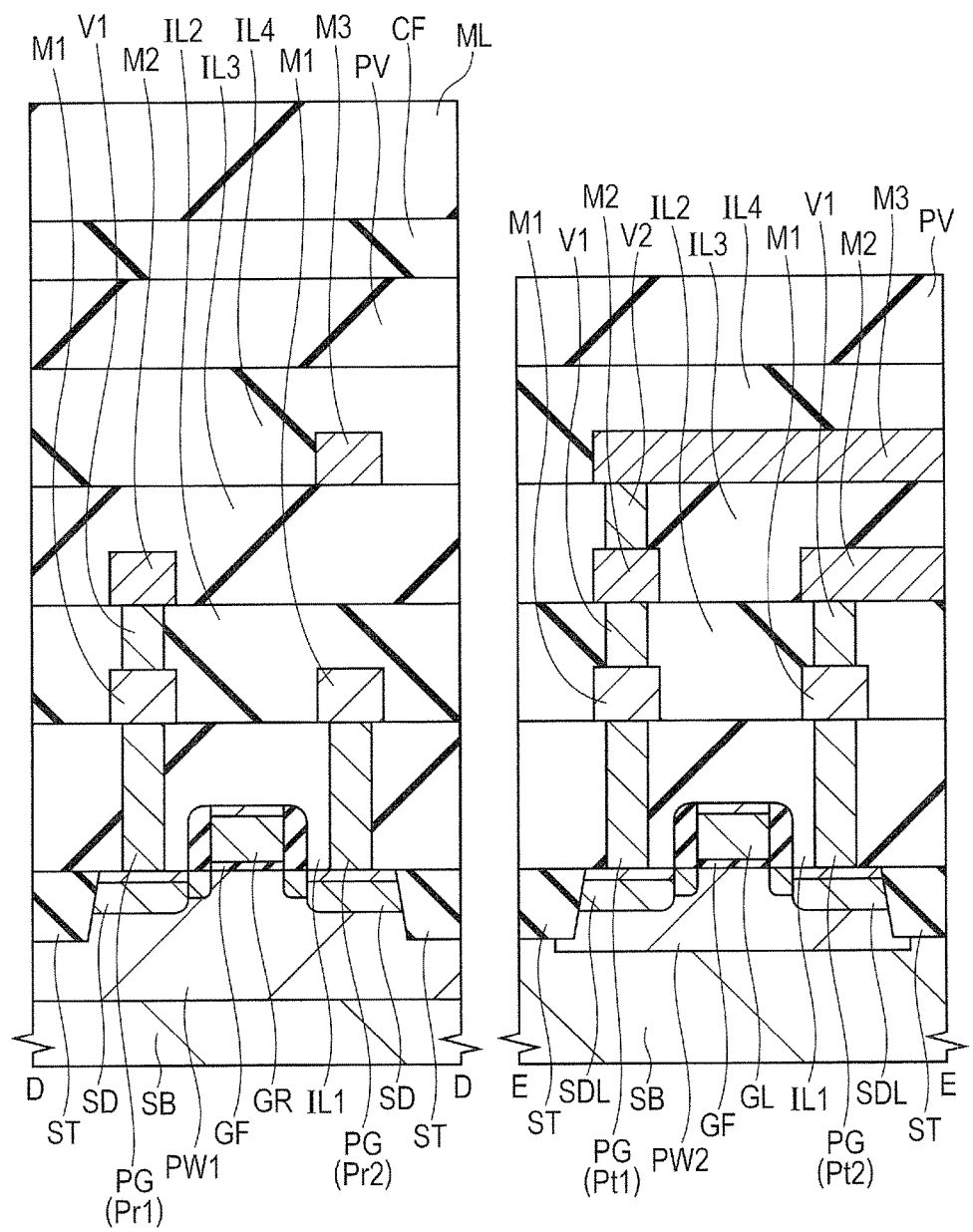
FIG. 40 is a main-portion cross-sectional view of the semiconductor device during the manufacturing process thereof, which is similar to FIG. 38.

Next, as shown in FIGS. 38 to 40, over the interlayer insulating film IL1 in which the plugs PG are embedded, interlayer insulating films IL2 to IL4 and the wires M1 to M3 are formed.

For example, over the interlayer insulating film IL1 in which the plugs PG are embedded, a conductive film for wires (e.g., aluminum film) is formed and then patterned using a photolithographic technique and an etching technique to form the wires M1. The plugs PG have the respective upper surfaces thereof in contact with the respective lower surfaces of the wires M1 to be thus electrically coupled to the wires M1. Then, over the interlayer insulating film IL1, the interlayer insulating film IL2 is formed so as to cover the wires M1. Then, through holes are formed in the interlayer insulating film IL2 and, in the through holes, conductive via portions (plugs) V1 are formed using the same method as used to form the plugs PG. Then, over the interlayer insulating film IL2, the wires M2 are formed using the same method as used to form the wires M1. The wires M2 are wires in a second wiring layer. As necessary, the wires M1 and M2 are electrically coupled to each other via the via portions V1 disposed between the wires M1 and M2. Then, over the interlayer insulating film IL2, the interlayer insulating film IL3 is formed so as to cover the wires M2. Then, through holes are formed in the interlayer insulating film IL3 and, in the through holes, conductive via portions (plugs) V2 are formed using the same method as used to form the plugs PG. Then, over the interlayer insulating film IL3, the wires M3 are formed using the same method as used to form the wires M1. The wires M3 are wires in a third wiring layer. As necessary, the wires M2 and M3 are electrically coupled to each other via the via portions V2 disposed between the wires M2 and M3. Then, over the interlayer insulating film IL3, the interlayer insulating film IL4 is formed so as to cover the wires M3.

The wires M1, M2, and M3 are not limited to aluminum wires. For example, damascene wires (embedded wires) can also be used as the wires M1, M2, and M3. Also, the case where the three wiring layers are formed over the semiconductor substrate SB has been illustrated and described, but the number of the wiring layers is not limited to 3.

The wires M1, M2 and M3 are formed so as not to overlap the photodiode PD in plan view. This is intended to prevent the light incident on the photodiode PD from being blocked by the wires M1, M2, and M3.

Next, over the interlayer insulating film IL4, pads (pad electrodes or bonding pads) are formed. In the manufactured semiconductor device (semiconductor chip), the plurality of pads are arranged along the outer periphery of the semiconductor device (semiconductor chip) in plan view. Accordingly, in the cross-sectional views of FIGS. 38 to 40, the pads are not illustrated.

Next, over the interlayer insulating film IL4, a passivation film (protective film or insulating film) PV is formed so as to cover the pads. Note that the center portions of the foregoing pads are exposed from openings (not shown) provided in the passivation film PV.

Next, onto the passivation film PV, microlenses ML as on-chip lenses are attached so as to overlap the n-type semiconductor region NW included in the photodiode PD in plan view. Note that, between each of the microlenses ML and the passivation film PV, a color filter CF may also be provided. Alternatively, the attachment of the color filter CF and the microlens ML can also be omitted as unnecessary.

By the foregoing process steps, the semiconductor device in Embodiment 1 can be manufactured.

Figure 41:
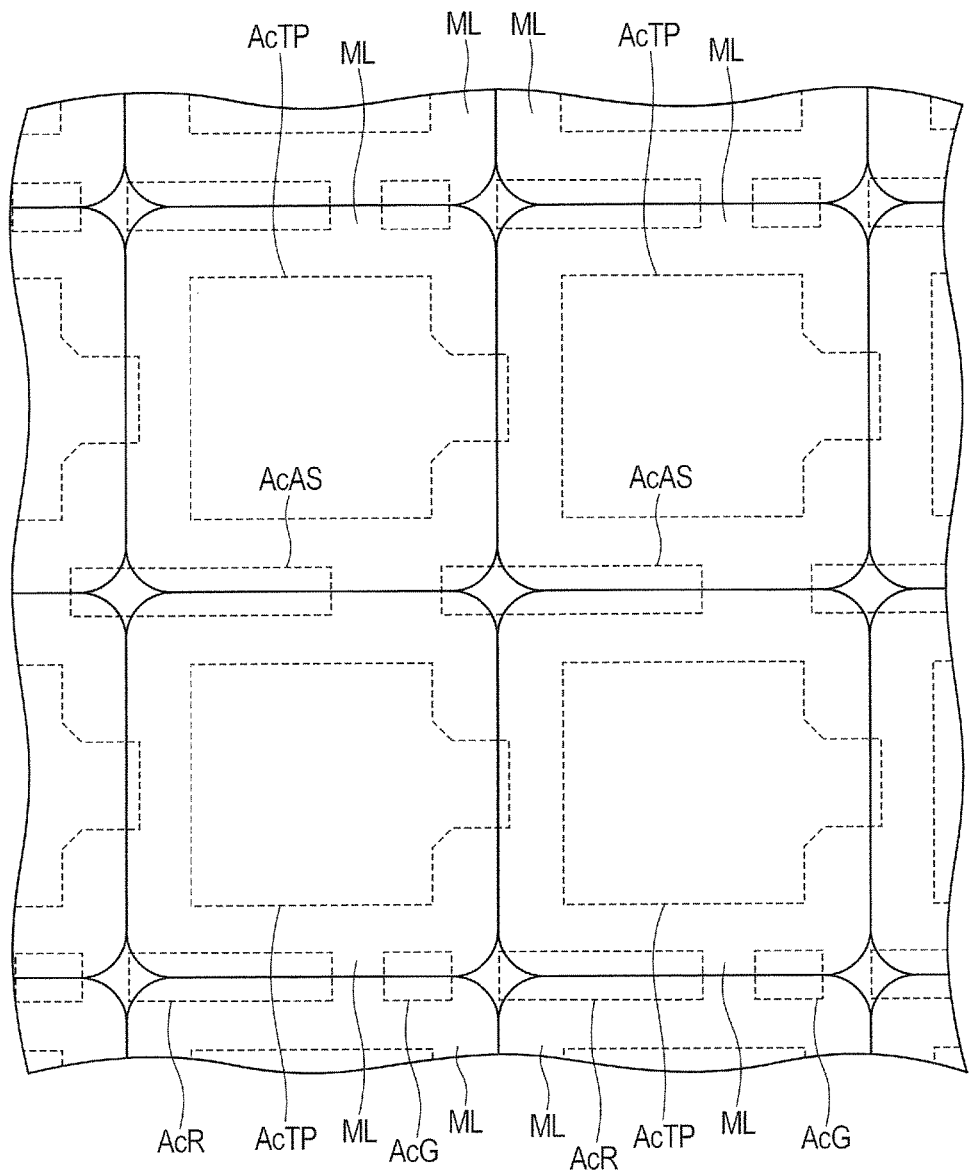
FIG. 41 is a main-portion plan view of the semiconductor device in the embodiment.

FIG. 41 is a main-portion plan view of the semiconductor device in Embodiment 1 and shows the same two-dimensional region as shown in FIG. 9 described above. In FIG. 41, the dotted lines show the active regions AcTP, AcR, AcG, and AcAS shown in FIG. 9 described above, while the solid lines show the microlenses ML. In the case shown in FIG. 41, the microlenses ML are provided on a per pixel basis.

When light illuminates the pixel PU (see FIG. 1), the incident light successively passes through the microlenses ML, the passivation film PV transparent to visible light, and the interlayer insulating films IL4 to IL1 to be subsequently incident on the cap insulating film CP. In the cap insulating film CP, the reflection of the incident light is suppressed so that a sufficient amount of the incident light is incident on the photodiode PD (n-type semiconductor region NW). In the photodiode PD, the energy of the incident light is larger than the band gap of silicon so that the incident light is absorbed by photoelectric conversion to generate hole-electron pairs. The electrons generated at this time are accumulated in the n-type semiconductor region NW. Then, with appropriate timing, the transfer transistor TX is turned ON. Specifically, a voltage of not less than a threshold voltage is applied to the gate electrode GT of the transfer transistor TX. As a result, a channel region (inversion layer) is formed in the channel formation region immediately under the gate insulating film GF under the gate electrode GT of the transfer transistor TX. This provides electric conduction between the n-type semiconductor region NW serving as the source region of the transfer transistor TX and the n-type semiconductor region NR (floating diffusion FD) serving as the drain region of the transfer transistor TX. Consequently, the electrons accumulated in the n-type semiconductor region NW pass through the channel region to reach the drain region (n-type semiconductor region PR) and propagate from the drain region (n-type semiconductor region NR) through the plugs PG and the wires to be input to the gate electrode GA of the amplification transistor AMI.

In Embodiment 1, a description has been given of an example in which the semiconductor device is a top-illuminated image sensor in which light is incident on the top surface of the semiconductor substrate. However, Embodiment 1 is also applicable to a back-illuminated image sensor in which light is incident on the back surface of the semiconductor substrate. The same applies also to Embodiments 2 and 3 shown below.

<About Study by Present Inventors>

Defects in a solid-state image sensing element (image sensor) include a so-called dark-time white spot (white-spot defect). One of the main factors causing the dark-time white spot is contaminant metal which enters a semiconductor substrate (semiconductor wafer) during the manufacturing process. When the contaminant metal that has entered the semiconductor substrate during the manufacturing process is mixed in the photodiode included in a pixel, a light emission level may be formed due to the contaminant metal. Such a light emission level is located between a valance band and a conduction band. Even in the absence of light illumination, hole-electron pairs are formed via the light emission level so that the generated electrons form a dark current. When such a dark current increases, despite no light illumination, erroneous lighting (white spot) occurs on the basis of a signal (noise). Such erroneous lighting is referred to as the dark-time white spot (white-spot defect). The occurrence of the dark-time white spot leads to degradation of the performance of the semiconductor device. Accordingly, it is desirable to maximally prevent the occurrence of the dark-time white spot. To suppress or prevent the dark-time white spot, it is necessary to prevent metal contamination of the semiconductor substrate during the manufacturing process or prevent the contaminant metal that has entered the semiconductor substrate during the manufacturing process from being mixed in the photodiode included in the pixel.

However, it is difficult to completely prevent metal contamination of the semiconductor substrate during the manufacturing process. To completely prevent metal contamination of the semiconductor substrate during the manufacturing process, it is necessary to strictly control the manufacturing process. In addition, the degree of freedom of the manufacturing process is significantly reduced to increase the manufacturing cost of the semiconductor device. Accordingly, to suppress or prevent the dark-time white spot, it is effective to keep the contaminant metal that has entered the semiconductor substrate during the manufacturing process from being mixed in the photodiode included in the pixel.

Main process steps in which metal contamination of the semiconductor substrate occurs include an ion implantation step. In the ion implantation step, a predetermined ion species is accelerated and implanted into the semiconductor substrate. At this time, not only the ion species to be implanted, but also another ion species may be implanted into the semiconductor substrate. Specifically, in the case of ion-implanting a given monovalent ion species into the semiconductor substrate, when there is a divalent ion species having a mass number which is about double the mass number of the monovalent ion species, the divalent ion species is difficult to be removed from an ion implantation device and may be implanted into the semiconductor substrate. Likewise, in the case of ion-implanting a given monovalent ion species into the semiconductor substrate, when there is a trivalent ion species having a mass number which is about triple the mass number of the monovalent ion species, the trivalent ion species is difficult to be removed from the ion implantation device and may be implanted into the semiconductor substrate. Specifically, in the case of ion-implanting, e.g., As ions (arsenic ions), a tungsten fluoride (such as $WF_x$) having a mass number which is close to an integral multiple of the mass number of As (arsenic) may also be implanted into the semiconductor substrate.

Thus, in an ion implantation step, a predetermined ion species is accelerated and implanted into the semiconductor substrate. However, at this time, not only the ion species to be implanted, but also an unneeded metal or metal compound may also be implanted into the semiconductor substrate. Thus, ion implantation tends to cause metal contamination of the semiconductor substrate.

In addition, as a dose in an ion implantation step is higher, the metal contamination caused thereby tends to be more serious. This is because, as the amount (dose) of the ion species to be implanted is larger, the amount of the contaminant metal which is simultaneously but unintentionally implanted is larger.

Accordingly, in a high-dose ion implantation step, i.e., ion implantation step for forming a high-impurity-concentration semiconductor region, the amount of the contaminant metal which is simultaneously but unintentionally implanted may also increase. Since the source/drain regions of a transistor have relatively high impurity concentrations, in the ion implantation step for forming the source/drain regions, the dose is relatively high so that the amount of the unintentionally implanted contaminant metal tends to increase.

Such a BMD (bulk micro defect) technique which performs doping with carbon (C) to provide a gettering layer and then forms an epitaxial a layer for element formation is less effective on contaminant metal having a small diffusion coefficient such as tungsten (W) and is therefore unsatisfactory as countermeasures against metal contamination. Hence, the foregoing BMD technique is not so effective against the contaminant metal implanted in the source/drain regions and the like of a transistor.

In view of this, the present inventors have conducted study to find a way to prevent the contaminant metal introduced in the semiconductor substrate in an ion implantation step from being diffused into a photodiode. The present inventors have found that, to prevent the contaminant metal introduced in the semiconductor substrate in the ion implantation step from being diffused into the photodiode, it is effective to introduce a gettering element into the region where the contaminant metal is introduced in the ion implantation. As the gettering element, carbon (C) is preferred.

In the region of the semiconductor substrate where the gettering element is introduced, it is possible to capture a contaminant metal such as tungsten (W) and prevent the diffusion of the contaminant metal. For example, in the region where the gettering element is introduced, a crystal defect, distortion, or the like occurs in the semiconductor substrate as a result of ion-implanting the gettering element. By causing the crystal defect, distortion, or the like (gettering site) to capture the contaminant metal, the contaminant metal can be fixed. In the region where the gettering element is introduced, through the formation of a complex by the gettering element and the contaminant metal also, it is possible to capture the contaminant metal and prevent the diffusion of the contaminant metal.

However, as a result of conducting the study, the present inventors have found that, in the case of forming a metal silicide layer (corresponding to the foregoing metal silicide layer SC) over a semiconductor region where a gettering element such as carbon (C) is introduced, due to the gettering element contained in the semiconductor region, the resistance (sheet resistance) of the formed metal silicide layer increases (see FIGS. 59 and 60 described later). It follows therefore that the introduction of a gettering element is useful in preventing the diffusion of the contaminant metal, but is disadvantageous in terms of increasing the resistance of the metal silicide layer. An increase in the resistance of the metal silicide layer leads to the degradation of the performance of the semiconductor device and is therefore preferably avoided as practically as possible. Accordingly, in the substrate region over which the metal silicide layer is to be formed, when the useful effect achieved by introducing the gettering element cannot be expected, it is desirable not to introduce the gettering element and to avoid an increase in the resistance of the metal silicide layer due to the introduction of the gettering element.

Therefore, the present inventors have conducted study to find the region where introducing the gettering element is particularly effective in terms of preventing the diffusion of the contaminant metal into the photodiode and preventing the dark-time white spot. As a result, the present inventors have found that, in terms of preventing the diffusion of the contaminant metal into the photodiode PD and preventing the dark-time white spot, it is most effective to introduce the gettering element into the region of the semiconductor substrate SB in the active region AcTP where the n-type semiconductor region NR (floating diffusion FD) is formed. The reason for this is as follows.

That is, since the n-type impurity concentration in the n-type semiconductor region NR (floating diffusion FD) is relatively high, the amount of the contaminant metal introduced into the n-type semiconductor region NR during the formation of the n-type semiconductor region NR also tends to be larger. The n-type semiconductor region NR (floating diffusion FD) and the n-type semiconductor region NW face each other with the channel formation region (corresponding to the substrate region immediately under the gate electrode GT) of the transfer transistor TX being interposed therebetween. Between the n-type semiconductor regions NR and NW, the isolation region ST is not formed. That is, between the n-type semiconductor regions NR and NW, the channel formation region of the transfer transistor TX is present and, in the channel formation region, the isolation region ST is not formed. The n-type semiconductor regions NR and NW are connected to each other by the channel formation region. As a result, when the n-type semiconductor region NR is formed, the contaminant metal introduced in the n-type semiconductor region NR tends to be subsequently diffused into the n-type semiconductor region NW included in the photodiode PD through the channel formation region of the transfer transistor TX without being interrupted by the isolation region ST. Accordingly, to prevent the diffusion of the contaminant metal into the photodiode PD and prevent the dark-time white spot, it is effective to introduce the gettering element into the n-type semiconductor region NR (floating diffusion FD). This can suppress or prevent the diffusion of the contaminant metal introduced in the n-type semiconductor region NR into the photodiode PD.

The contaminant metal captured (gettered) in the floating diffusion FD (n-type semiconductor region NR), such as tungsten (W), may possibly form a level (light emission level) and cause a dark current in the same manner as in the case where the contaminant metal is present in the photodiode PD. However, in a reading operation in the image sensor, the potential of the floating diffusion FD is read immediately before the transfer transistor TX is turned ON. Consequently, a dark current component resulting from the contaminant metal (such as tungsten) in the floating diffusion FD is cancelled out as an output signal. This prevents the contaminant metal captured (gettered) in the floating diffusion FD (n-type semiconductor region NR), such as tungsten (W), from causing the dark-time white spot.

The present inventors have also found that, in terms of preventing the diffusion of the contaminant metal into the photodiode PD and preventing the dark-time white spot, it is also effective to introduce the gettering element into the regions of the semiconductor substrate SB in the active region AcAS and AcR where the source/drain regions SD are formed. The reason for this is as follows.

That is, since the n-type impurity concentrations of the source/drain regions DS are relatively high, the amount of the contaminant metal introduced into the source/drain regions SD during the formation of the source/drain regions SD also tends to be larger. However, between each of the active regions AcAS and AcR and the active region AcTP, the isolation region ST is present. Consequently, the diffusion of the contaminant metal from the source/drain regions SD into the photodiode PD is interrupted to a degree by the isolation region ST interposed therebetween. Therefore, it can be considered that the diffusion of the contaminant metal from the source/drain regions SD into the photodiode PD is less likely to occur than the diffusion of the contaminant metal from the n-type semiconductor region NR (floating diffusion FD) into the photodiode PD. However, the space between each of the active regions AcAS and AcR and the active region AcTP is relatively small. Accordingly, even when the isolation region ST is present therebetween, the diffusion of the contaminant metal from the source/drain regions SD into the photodiode PD occurs to a degree. Therefore, to prevent the diffusion of the contaminant metal into the photodiode PD and prevent the dark-time white spot, it is effective to introduce the gettering element into the source/drain regions SD. This can suppress or prevent the diffusion of the contaminant metal introduced in the source/drain regions SD into the photodiode PD.

However, the effect of preventing the diffusion of the contaminant metal into the photodiode PD and preventing the dark-time white spot is more significantly enhanced by introducing the gettering element into the n-type semiconductor region NR (floating diffusion FD) than by introducing the gettering element into the source/drain regions SD. This is because, since the isolation region ST is present between each of the source/drain regions SD and the photodiode PD, but is not present between the n-type semiconductor region NR and the photodiode PD, the diffusion of the contaminant metal from the n-type semiconductor region NR into the photodiode PD is more likely to occur than the diffusion of the contaminant metal from the source/drain regions SD into the photodiode PD.

On the other hand, the peripheral transistors (LT) formed in the peripheral circuit region 2A is not formed in the pixel region (1A) where the pixels (PU) including the photodiodes PD are arranged in the form of an array and the active region (AcL) for the peripheral transistor (LT) is away from the photodiode PD. In other words, the distance between the active region (AcL) for the peripheral transistor (LT) and the photodiode PD is larger than the distances between the active regions AcR and AcAS and the photodiode PD. Consequently, the diffusion of the contaminant metal from the source/drain regions (SDL) for the peripheral transistor (LT) into the photodiode PD rarely occurs. Accordingly, regardless of whether or not the gettering element is introduced into the regions where the source/drain regions (SDL)

for the peripheral transistor (LT) are formed, the diffusion of the contaminant metal from the source/drain regions (SDL) for the peripheral transistor (LT) into the photodiode PD remains substantially unchanged to hardly affect the incidence rate of the dark-time white spot.

Also, as a result of conducting the study, the present inventors have found that, regardless of whether or not the gettering element is introduced into the semiconductor substrate SB in the active region AcG (p-type semiconductor region PH or the p-type well PW1), the incidence rate of the dark-time white spot is hardly affected (see FIG. 58 described later).

That is, in an n-type semiconductor region such as the n-type semiconductor region NR (floating diffusion FD) or the source/drain region SD, the introduction of a gettering element such as carbon (C) achieves the effect of suppressing or preventing the diffusion of the contaminant metal unintentionally introduced in the n-type semiconductor region into the photodiode PD and reducing the incidence rate of the dark-time white spot (see FIG. 58 described later). However, in a p-type semiconductor region, even when a gettering element such as carbon (C) is introduced, the effect of reducing the incidence rate of the dark-time white spot is hardly obtainable (see FIG. 58 described later).

A conceivable reason why the effect of reducing the incidence rate of the dark-time white spot is hardly obtainable even when a gettering element such as carbon (C) is introduced is that, e.g., during the ion implantation of a p-type impurity for forming a p-type semiconductor region, contaminant metal is less likely to be introduced than during the ion implantation of an n-type impurity for forming an n-type semiconductor region. In that case, in the p-type semiconductor region, the amount of the contaminant metal is small so that, regardless of whether or not a gettering element such as carbon (C) is introduced, the diffusion of the contaminant metal from the p-type semiconductor region into the photodiode PD remains substantially unchanged to hardly affect the incidence rate of the dark-white spot. Another conceivable reason is that a gettering element such as carbon (C) is combined with a p-type impurity such as boron (B) and consequently the contaminant metal is less likely to be captured. In that case, the effect of introducing a gettering element such as carbon (C) into the p-type semiconductor region decreases. Regardless of whether or not a gettering element is introduced, the diffusion of the contaminant metal from the p-type semiconductor region into the photodiode PD remains substantially unchanged to hardly affect the incidence rate of the dark-time white spot. In either case, the semiconductor substrate SB in the active region AcG (p-type semiconductor region PH or p-type well PW1) is a p-type semiconductor region and, even when a gettering element is introduced therein, the incidence rate of the dark-time white spot is hardly affected (see FIG. 58 described later).

On the basis of the findings made by the present inventors, in the semiconductor device in Embodiment 1, the regions where a gettering element is introduced are set as follows.

<About Main Characteristic Features>

One of the main characteristic features of Embodiment 1 is that a gettering element such as carbon (C) is introduced into the n-type semiconductor region NR (floating diffusion FD), but is not introduced into the semiconductor substrate SB in the active region AcG.

Since the photodiode PD and the transfer transistor TX are formed in the same active region AcTP, in plan view, the n-type semiconductor region NR (floating diffusion FD) and the photodiode PD are connected to each other through the region (corresponding to the channel formation region) where the isolation region ST is not formed. Accordingly, as described above, the contaminant metal introduced in the n-type semiconductor region NR during the formation of the n-type semiconductor region NR tends to be diffused into the n-type semiconductor region NW included in the photodiode PD without being interrupted by the isolation region ST.

By contrast, in Embodiment 1, a gettering element such as carbon (C) is introduced into the n-type semiconductor region NR (floating diffusion FD) which is most likely to contribute to the diffusion of contaminant metal into the photodiode PD. Accordingly, it is possible to suppress or prevent the diffusion of contaminant metal (e.g., tungsten) introduced in the n-type semiconductor region NR into the photodiode PD. This can prevent the diffusion of the contaminant metal into the photodiode PD and thus reduce the probability of the occurrence of the dark-time white spot as well as the incidence rate of the dark-time white spot. Therefore, it is possible to improve the performance of the semiconductor device.

As also described above, regardless of whether or not a gettering element is introduced into the semiconductor substrate SIB in the active region AcG (p-type semiconductor region PH or p-type well PW1), the incidence rate of the dark-time white spot is substantially unaffected. In addition, as described above, in the case of forming the metal silicide layer (SC) over the substrate region where a gettering element is introduced, the introduction of a gettering element such as carbon (C) leads to an increase in the resistance of the metal silicide layer (SC). Accordingly, in Embodiment 1, in the semiconductor substrate SB (p-type semiconductor region PH and p-type well PW1) in the active region AcG, a gettering element such as carbon (C) is not introduced.

Unlike in Embodiment 1, in the case where a gettering element is introduced into the semiconductor substrate SB in the active region AcG, although a reduction in the incidence rate of the dark-time white spot cannot be expected, the resistance of the metal silicide layer SC formed over the semiconductor substrate SB in the active region AcG is increased. In Embodiment 1, by not introducing a gettering element such as carbon (C) into the semiconductor substrate SB in the active region AcG, it is possible to avoid an increase in the resistance (resistance increase resulting from the introduction of a gettering element) of the metal silicide layer SC formed over the semiconductor substrate SB in the active region AcG. This can improve the performance of the semiconductor device.

Thus, in Embodiment 1, a gettering element such as carbon (C) is introduced into the n-type semiconductor region NR which is most likely to contribute to the diffusion of contaminant metal into the photodiode PD. On the other hand, a gettering element such as carbon (C) is not introduced into the semiconductor substrate SB in the active region AcG where a reduction in the incidence rate of the dark-time white spot can scarcely be expected even when a gettering element is introduced therein. This can reliably reduce the diffusion of contaminant metal into the photodiode PD and thus efficiently reduce the incidence rate of the dark-time white spot. This can also avoid an increase in the resistance of the metal silicide layer SC formed over the semiconductor substrate SB in the active region AcG. As a result, it is possible to effectively achieve a reduction in the incidence rate of the dark-time white spot and a reduction in the resistance of the metal silicide layer SC. Therefore, it is possible to improve the performance of the semiconductor device.

A further description will be given of the other characteristic features of Embodiment 1.

In Embodiment 1, in the region of the semiconductor substrate SB in the active region AcTP where the photodiode PD is formed, a gettering element such as carbon (C) is not introduced. This prevents the photodiode PD from being adversely affected by a gettering element such as carbon (C) and allows the photodiode PD to retain excellent properties. Therefore, it is possible to improve the performance of the semiconductor device and also improve the reliability of the semiconductor device.

Also, in Embodiment 1, in the respective source/drain regions SD of the amplification transistor AMI, the selection transistor SEL, and the reset transistor RST, a gettering element such as carbon (C) is not introduced. From another perspective, in the semiconductor substrate SB in the active region AcAS where the amplification transistor AMI and the selection transistor SEL are formed and in the semiconductor substrate SB in the active region AcR where the reset transistor RST is formed, a gettering element such as carbon (C) is not introduced. This can avoid an increase in the resistance (resistance increase resulting from the introduction of a gettering element) of the metal silicide layer SC formed over each of the source/drain regions SD. As a result, it is possible to improve the performance of the semiconductor device.

Also, in Embodiment 1, in the source/drain regions (SDL) of the peripheral transistor (LT) in the peripheral circuit region 2A, a gettering element such as carbon (C) is not introduced. From another perspective, in the semiconductor substrate SB in the active region (AcL) in the peripheral circuit region 2A where the peripheral transistor (LT) is formed, a gettering element such as carbon (C) is not introduced. This can avoid an increase in the resistance (resistance increase resulting from the introduction of a gettering element) of the metal silicide layer SC formed over each of the source/drain regions (SDL) of the peripheral transistor (LT) As a result, it is possible to improve the performance of the semiconductor device.

Note that the wording "a gettering element is introduced" means that "a gettering element is intentionally introduced (intentionally doped with a gettering element)" and the wording "a gettering element is not introduced" means that "a gettering element is not intentionally introduced (not intentionally doped with a gettering element)". Accordingly, in the region of the semiconductor substrate SB where a gettering element is not introduced, the gettering element is not contained at all or, even when the gettering element is unintentionally contained, the amount of the gettering element is extremely small and less than $1 \times 10^{15}/cm^3$. On the other hand, in the semiconductor substrate SB, the concentration (concentration of a gettering element) in the region where the gettering element is introduced is sufficiently larger than the concentration (concentration of a gettering element) in the region where the gettering element is not introduced. Specifically (Preferably), the concentration (concentration of the gettering element) in the region where the gettering element is introduced is not less than $1 \times 10^{20}/cm^3$ and, more preferably, about $2 \times 10^{20}/cm^3$ to $1 \times 10^{21}/cm^3$.

Embodiment 2

Figure 42:
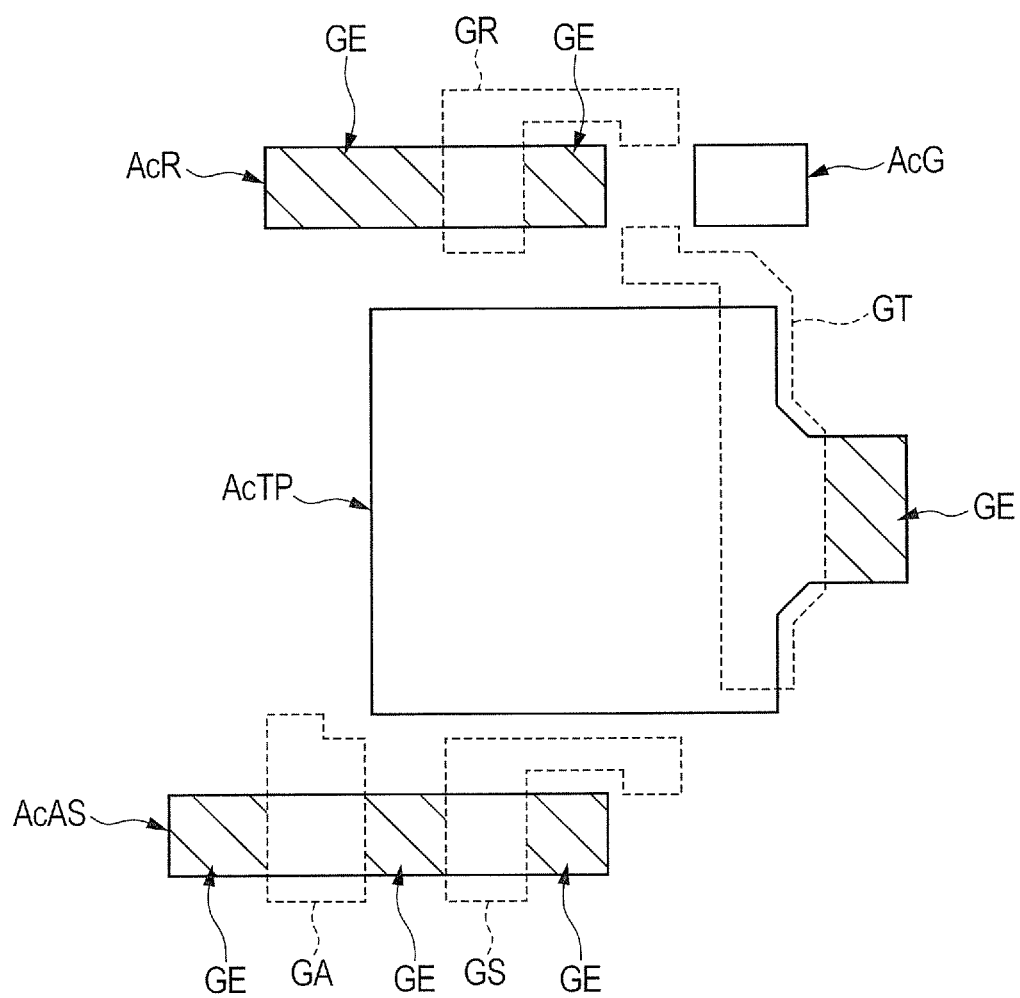
FIG. 42 is a main-portion plan view of a semiconductor device in another embodiment.
Figure 43:
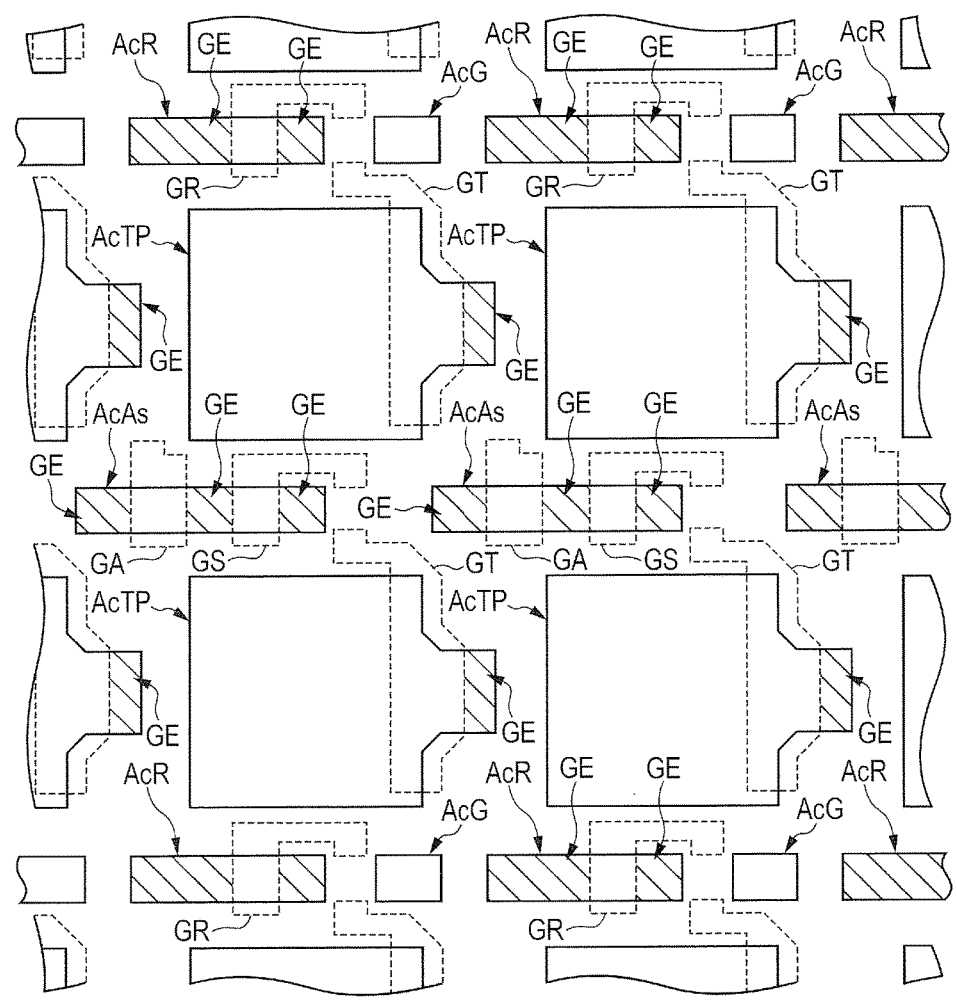
FIG. 43 is a main-portion plan view of the semiconductor device in the other embodiment.
Figure 44:
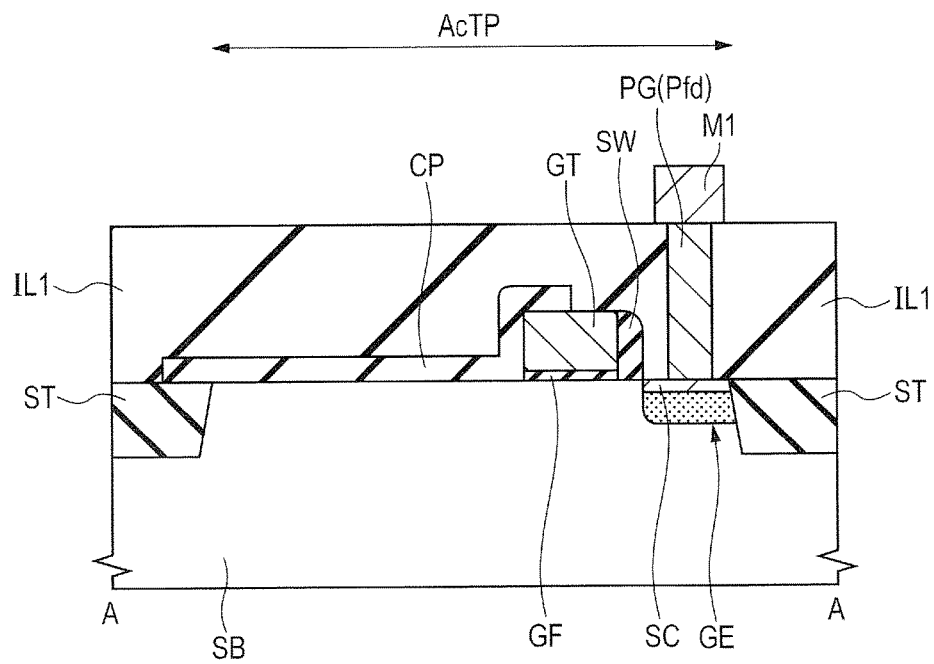
FIG. 44 is a main-portion cross-sectional view of the semiconductor device in the other embodiment.
Figure 45:
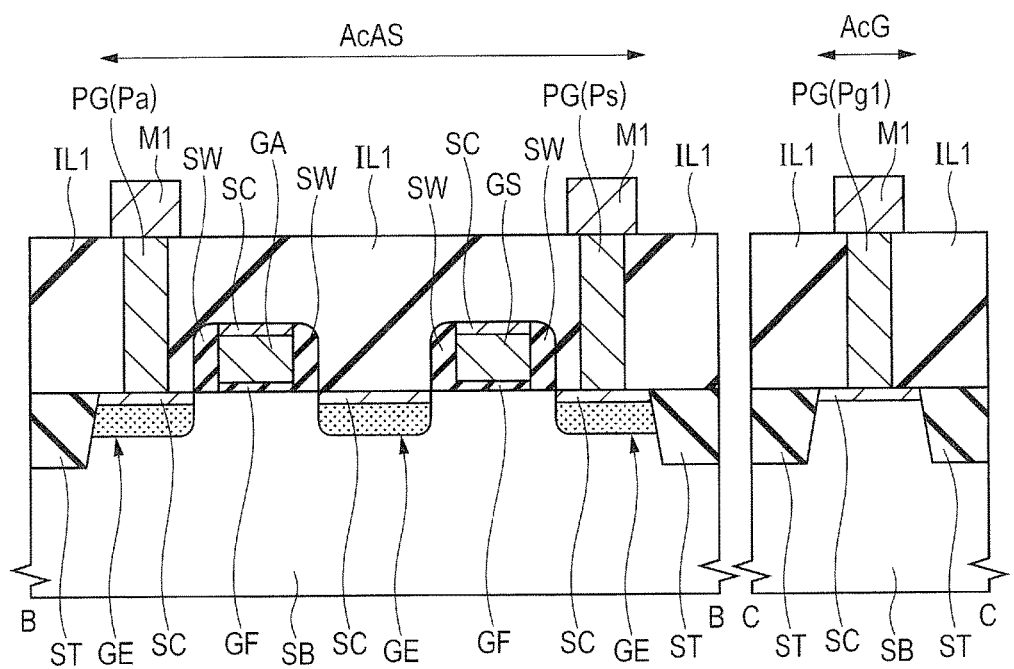
FIG. 45 is a main-portion cross-sectional view of the semiconductor device in the other embodiment.
Figure 46:
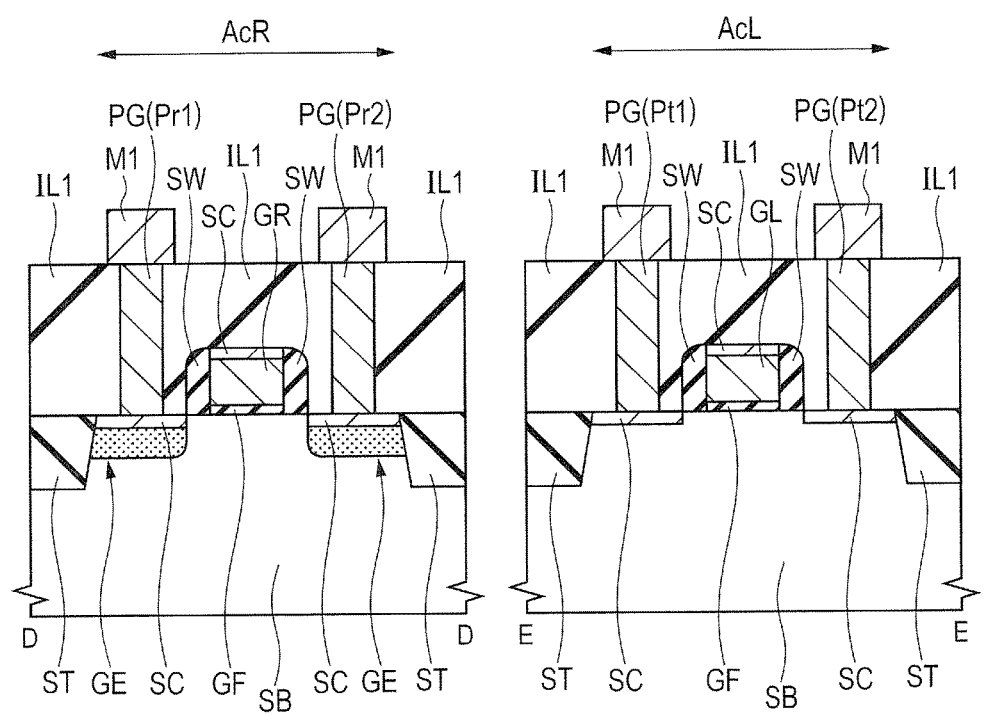
FIG. 46 is a main-portion cross-sectional view of the semiconductor device in the other embodiment.

FIGS. 42 and 43 are main-portion plan views of a semiconductor device in Embodiment 2. FIGS. 44 to 46 are main-portion cross-sectional views of the semiconductor device in Embodiment 2. FIG. 42 corresponds to FIG. 6 described above. FIG. 43 corresponds to FIG. 10 described above. FIG. 44 corresponds to FIG. 14 described above. FIG. 45 corresponds to FIG. 15 described above. FIG. 46 corresponds to FIG. 16 described above. Note that the plan views of FIGS. 4, 5, 8, and 9 described above and the cross-sectional views of FIGS. 11 to 13 described above are used also in Embodiment 2.

In the same manner as in FIGS. 6 and 10 described above, in FIGS. 42 and 43 also, the solid lines show the respective outer peripheral positions of the active regions (AcR, AcG, AcTP, and AcAS), hatching shows the region (corresponding to the region denoted by the reference mark GE) where a gettering element is introduced, and the dotted lines show the respective positions of the gate electrodes (GR, GT, GA, and GS).

The semiconductor device in Embodiment 2 has the cross-sectional structure shown in FIGS. 11 to 13 described above and FIGS. 44 to 46. In the same manner as in FIGS. 14 to 16 described above, in FIGS. 44 to 46 also, oblique-line hatching in each of the semiconductor substrate SB and the semiconductor regions formed in the semiconductor substrate SB shown in FIGS. 11 to 13 described above is omitted, while the region (corresponding to the region denoted by the reference mark GE) where a gettering element is introduced is hatched with dots. By referring to FIGS. 11 to 13 described above and FIGS. 44 to 46 in combination, it is possible to easily recognize the region of the semiconductor substrate SB where a gettering element is introduced.

The semiconductor device in Embodiment 2 is different from the semiconductor device in Embodiment 1 described above in that a gettering element such as carbon (C) is introduced in the source/drain regions SD.

That is, in Embodiment 1 described above, a gettering element such as carbon (C) is introduced neither in the semiconductor substrate SB in the active region AcAS where the amplification transistor AMI and the selection transistor SEL are formed nor in the semiconductor substrate SB in the active region AcR where the reset transistor RST is formed. Accordingly, in Embodiment 1 described above, a gettering element such as carbon (C) is not introduced in the respective source/drain regions SD of the amplification transistor AMI, the selection transistor SEL, and the reset transistor RST.

By contrast, in Embodiment 2, as can be seen from FIGS. 42 to 46 and FIGS. 4, 5, 8, 9, and 11 to 13 described above, a gettering element such as carbon (C) is introduced in the respective source/drain regions SD of the amplification transistor AMI, the selection transistor SEL, and the reset transistor RST.

The semiconductor device in Embodiment 2 is otherwise substantially the same as the semiconductor device in Embodiment 1 described above.

Accordingly, in the same manner as in Embodiment 1 described above, in Embodiment 2 also, a gettering element such as carbon (C) is introduced in the n-type semiconductor region NR (floating diffusion FD) of the semiconductor substrate SB in the active region AcTP. In the same manner as in Embodiment 1 described above, in Embodiment 2 also, a gettering element such as carbon (C) is not introduced in the region of the n-type semiconductor substrate SB in the active region AcTP where the photodiode PD is formed. In the same manner as in Embodiment 1 described above, in Embodiment also, a gettering element such as carbon (C) is not introduced in the semiconductor substrate SB in the active region AcG for supplying the ground potential (GND). In the same manner as in Embodiment 1 described above, in Embodiment 2 also, a gettering element such as carbon (C) is not introduced in the source/drain regions (SDL) of the peripheral transistor (LT) in the peripheral circuit region 2A. From another perspective, in the semiconductor substrate SB in the active region (AcL) in the peripheral circuit region 2A where the peripheral transistor (LT) is formed, a gettering element such as carbon (C) is not introduced.

Figure 47:
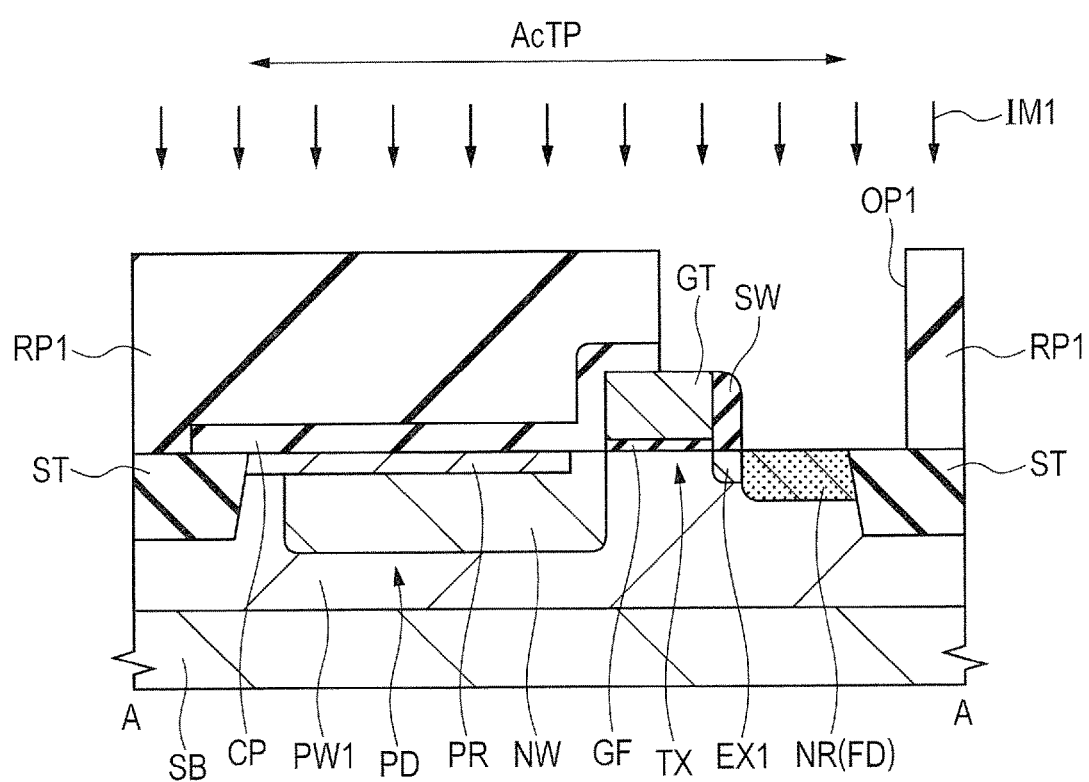
FIG. 47 is a main-portion cross-sectional view of the semiconductor device in the other embodiment during the manufacturing process thereof.
Figure 48:
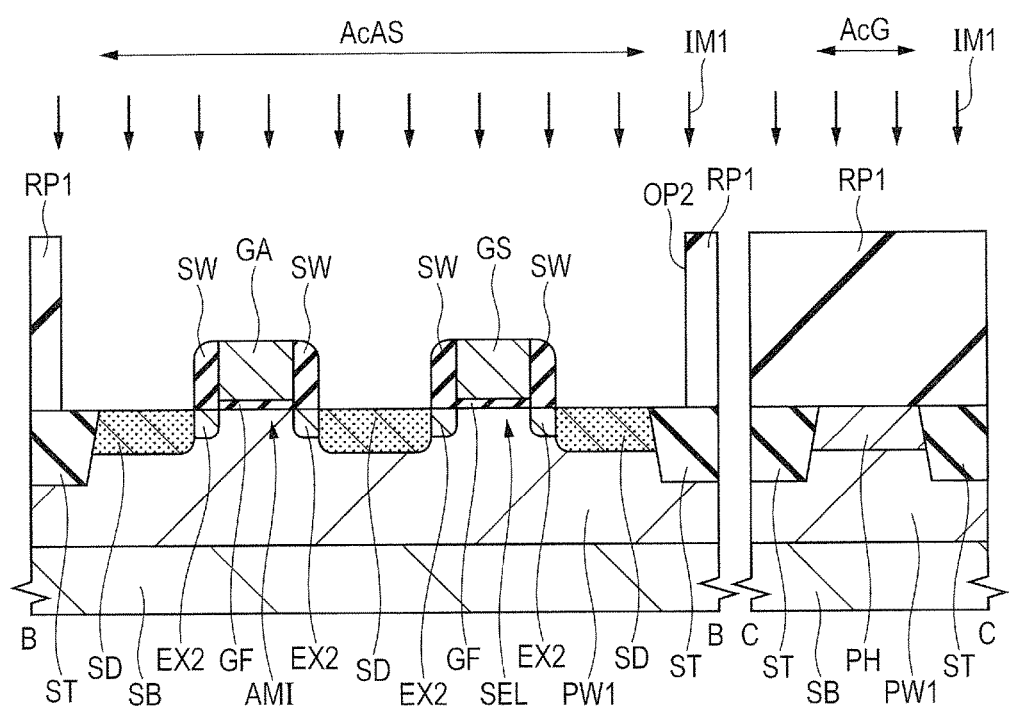
FIG. 48 is a main-portion cross-sectional view of the semiconductor device during the manufacturing process thereof, which is similar to FIG. 47.
Figure 49:
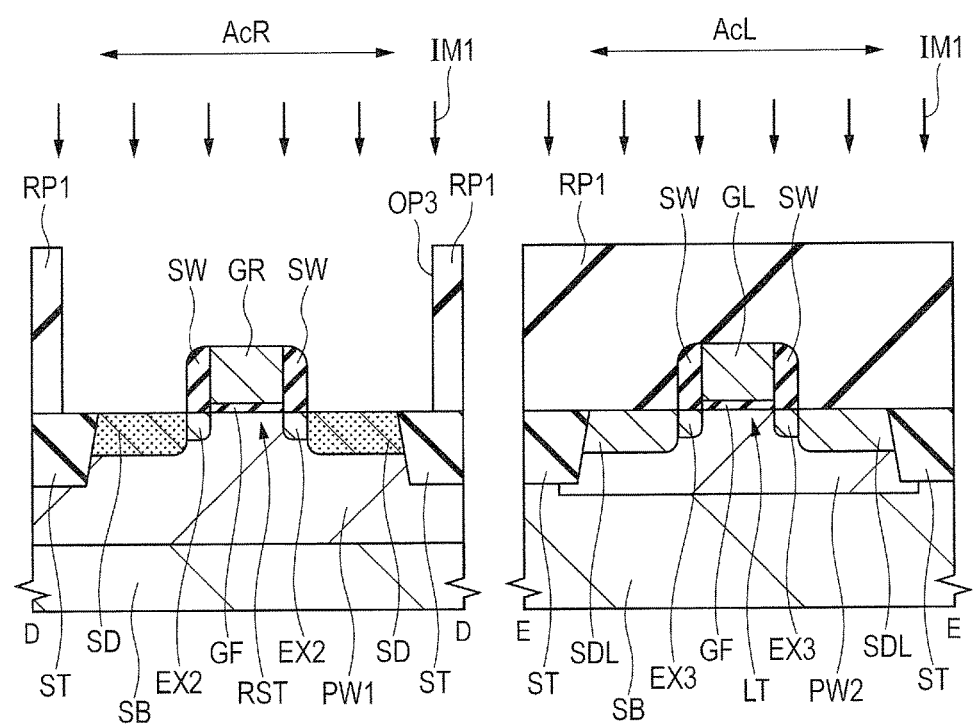
FIG. 49 is a main-portion cross-sectional view of the semiconductor device during the manufacturing process thereof, which is similar to FIG. 47.

FIGS. 47 to 49 are main-portion cross-sectional views of the semiconductor device in Embodiment 2 during the manufacturing process thereof. FIGS. 47 to 49 respectively correspond to FIGS. 29 to 31 described above and correspond to the same process stages as in FIGS. 29 to 31 described above.

The manufacturing process of the semiconductor device in Embodiment 2 is different from the manufacturing process of the semiconductor device in Embodiment 1 described above in the layout of the resist pattern RP1 used as the ion implantation blocking mask when the foregoing ion implantation IM1 is performed.

That is, in Embodiment 1 described above, the active regions AcAS and AcR in the pixel region 1A are covered with the resist pattern RP1. By contrast, in Embodiment 2, the active regions AcAS and AcR in the pixel region 1A are not covered with the resist pattern RP1. That is, in Embodiment 2, the resist pattern RP1 is provided with an opening OP2 including the active region AcAS in plan view and an opening OP3 including the active region AcR in plan view. Embodiment 2 is the same as Embodiment 1 described above in that the resist pattern RP1 has the foregoing opening OP1. Embodiment 2 is also the same as Embodiment 1 described above in that the active region AcG is covered with the resist pattern RP1 and the peripheral circuit region 2A (including the active region AcL) is covered with the resist pattern RP1.

In Embodiment 2 also, using the resist pattern RP1 as the ion implantation blocking mask, the ion implantation IM1 is performed in the same manner as in Embodiment 1 described above. In the same manner as in FIGS. 29 to 31 described above, in FIGS. 47 to 49 also, the regions where a gettering element is introduced are hatched with dots.

Embodiment 2 is different from Embodiment 1 described above with regard to the ion implantation IM1 in that, since the resist pattern RP1 has not only the opening OP1, but also the openings OP2 and OP3, when the ion implantation IM1 is performed, a gettering element is implanted (introduced) not only into the n-type semiconductor region NR in the active region AcTP, but also into the source/drain regions SD in the active regions AcAS and AcR. Note that, since the gate electrodes GA, GS, and GR and the sidewall spacers SW over the respective side walls thereof may also function as an ion implantation blocking mask, a gettering element is implanted neither into the regions of the semiconductor substrate SB in the active regions AcAS and AcR which are located immediately under the gate electrodes GA, GS, and GR nor into the regions of the semiconductor substrate SB in the active regions AcAS and AcR which are located immediately under the sidewall spacers SW. Consequently, in the ion implantation IM1 in Embodiment 2, a gettering element is selectively implanted (introduced) into the n-type semiconductor region NR and the source/drain regions SD.

The manufacturing process of the semiconductor device in Embodiment 2 is otherwise substantially the same as the manufacturing process of the semiconductor device in Embodiment 1 described above. Accordingly, a repeated description thereof is omitted herein.

In Embodiment 2 also, such effects as described above in Embodiment 1 can be obtained. However, depending on whether or not a gettering element is introduced in the source/drain regions SD, the effects obtained in Embodiment 2 are different from those obtained in Embodiment 1 described above, as shown below.

That is, as described above in Embodiment 1, it can be considered that the effect of preventing the diffusion of contaminant metal into the photodiode PD and preventing the dark-time white spot is reduced to be lower by introducing a gettering element into the source/drain regions SD than by introducing a gettering element into the n-type semiconductor region NR (floating diffusion FD). This is because, since the isolation region ST is not present between the n-type semiconductor region NR and the photodiode PD, but is present between each of the source/drain regions SD and the photodiode PD, the diffusion of contaminant metal from the source/drain regions SD into the photodiode PD is less likely to occur than the diffusion of contaminant metal from the n-type semiconductor region NR into the photodiode PD.

Accordingly, in Embodiment 1 described above, a gettering element is selectively introduced into the n-type semiconductor region NR where the effect of preventing the dark-time white spot can most probably be expected, but is not introduced into the semiconductor substrate SB in the active regions AcAS, AcR, AcG, and AcL. This can avoid an increase in the resistance of the metal silicide layer SC formed over the semiconductor substrate SB in the active regions AcAS, AcR, AcG, and AcL. As a result, it is possible to reduce the resistance of each of the metal silicide layers SC other than the metal silicide layer SC formed over the n-type semiconductor region NR, i.e., the metal silicide layers SC formed over the semiconductor substrate SB in the active regions AcAS, AcR, AcG, and AcL which are among the metal silicide layers formed over the semiconductor substrate SB in the active regions AcTP, AcAS, AcR, AcG, and AcL. Accordingly, the case shown in Embodiment 1 described above is advantageous in terms of minimizing (reducing) the resistance of the metal silicide layer SC, while reducing the diffusion of contaminant metal into the photodiode PD and efficiently reducing the incidence rate of the dark-time white spot. Therefore, when the resistance of the metal silicide layer SC is to be minimized (reduced), Embodiment 1 described above is advantageous over Embodiment 2.

On the other hand, in Embodiment 2, a gettering element is selectively introduced not only in the n-type semiconductor region NR (floating diffusion FD) where the effect of preventing the dark-time white spot can most probably be expected, but also in the source/drain regions SD where the effect of preventing the dark-time white spot can also be expected. Accordingly, the resistance of the metal silicide layer SC formed over each of the source/drain regions SD is higher in Embodiment 2 than in Embodiment 1 described above. However, the effect of reducing the diffusion of contaminant metal into the photodiode PD and reducing the incidence rate of the dark-time white spot is larger in Embodiment 2 than in Embodiment 1 described above. Therefore, when the incidence rate of the dark-time white spot is to be minimized, Embodiment 2 is advantageous over Embodiment 1 described above.

Accordingly, when the incidence rate of the white spot is to be minimized, Embodiment 2 is used appropriately. On the other hand, when it is intended to simultaneously achieve a reduction in the incidence rate of the dark-time white spot and a reduction in the resistance of the metal silicide layer SC as practically as possible, Embodiment 1 described above is used appropriately.

Embodiment 3

Figure 50:
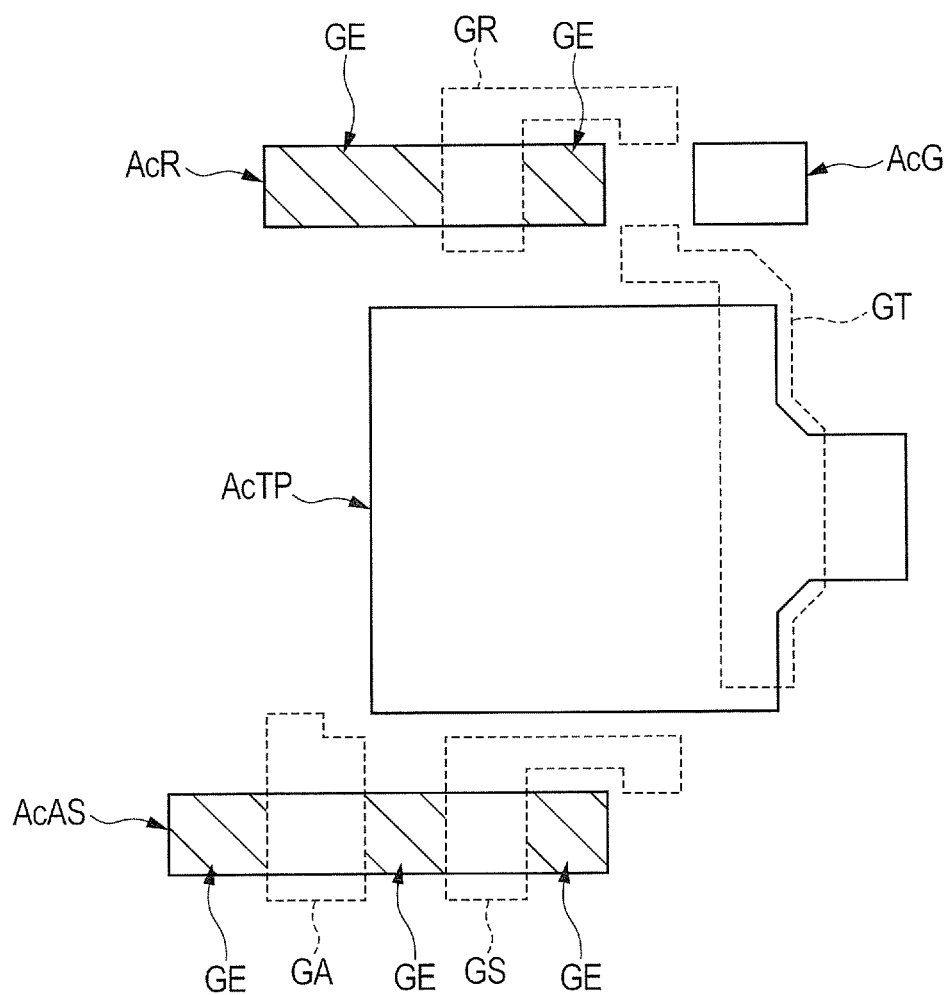
FIG. 50 is a main-portion plan view of a semiconductor device in still another embodiment.
Figure 51:
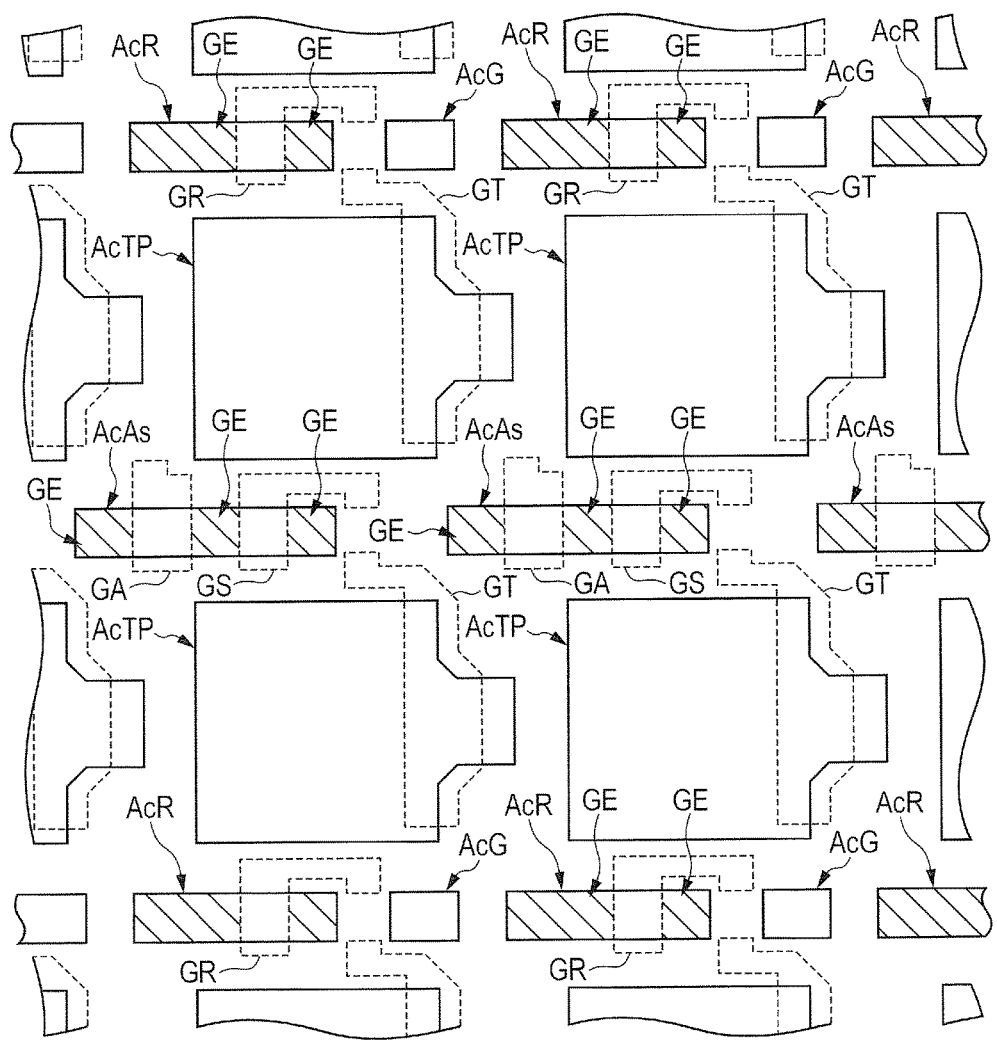
FIG. 51 is a main-portion plan view of the semiconductor device in the still other embodiment.
Figure 52:
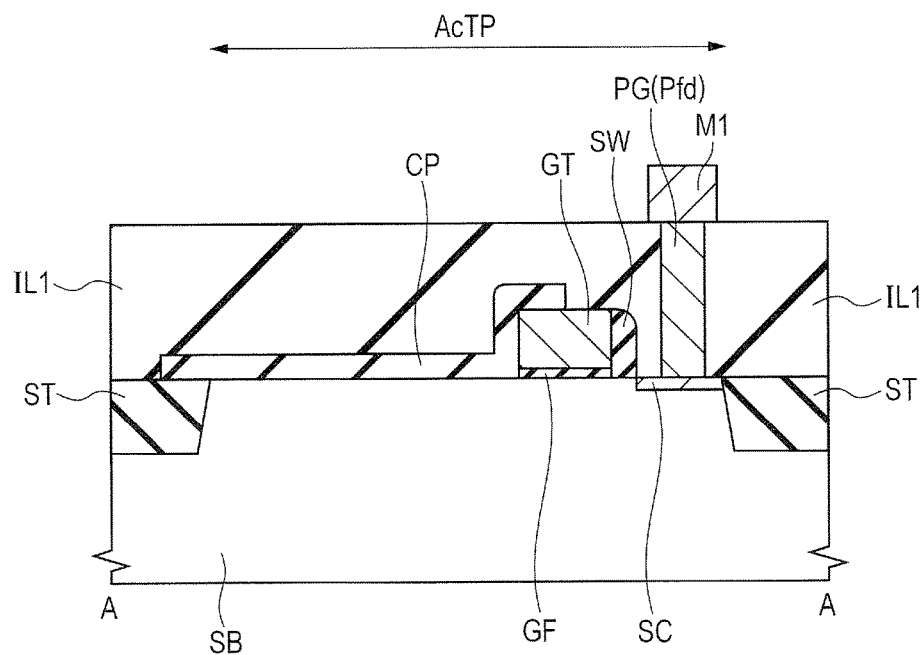
FIG. 52 is a main-portion cross-sectional view of the semiconductor device in the still other embodiment.
Figure 53:
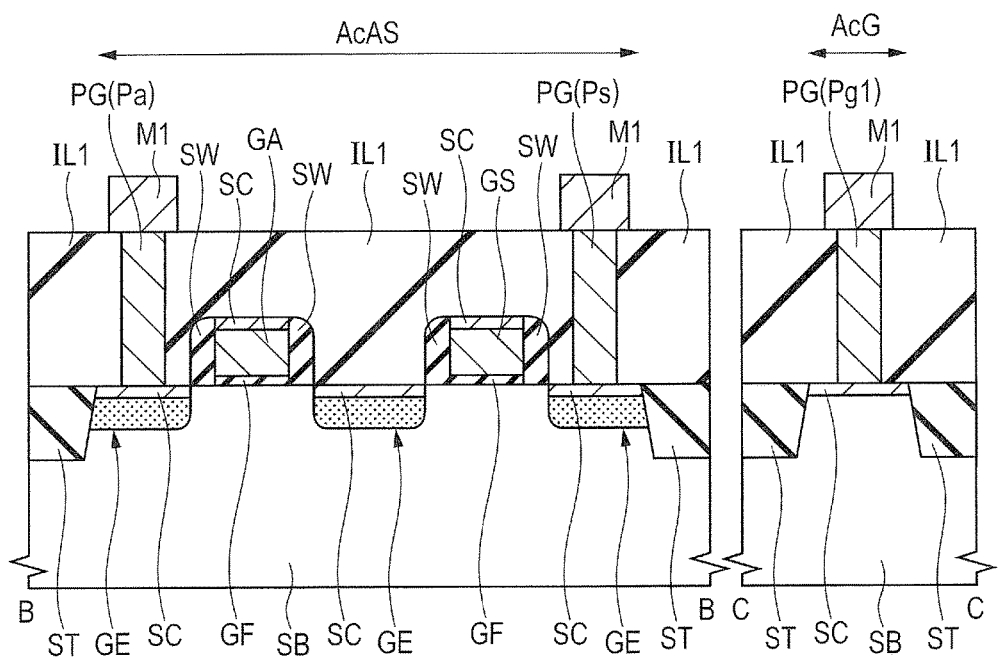
FIG. 53 is a main-portion cross-sectional view of the semiconductor device in the still other embodiment.
Figure 54:
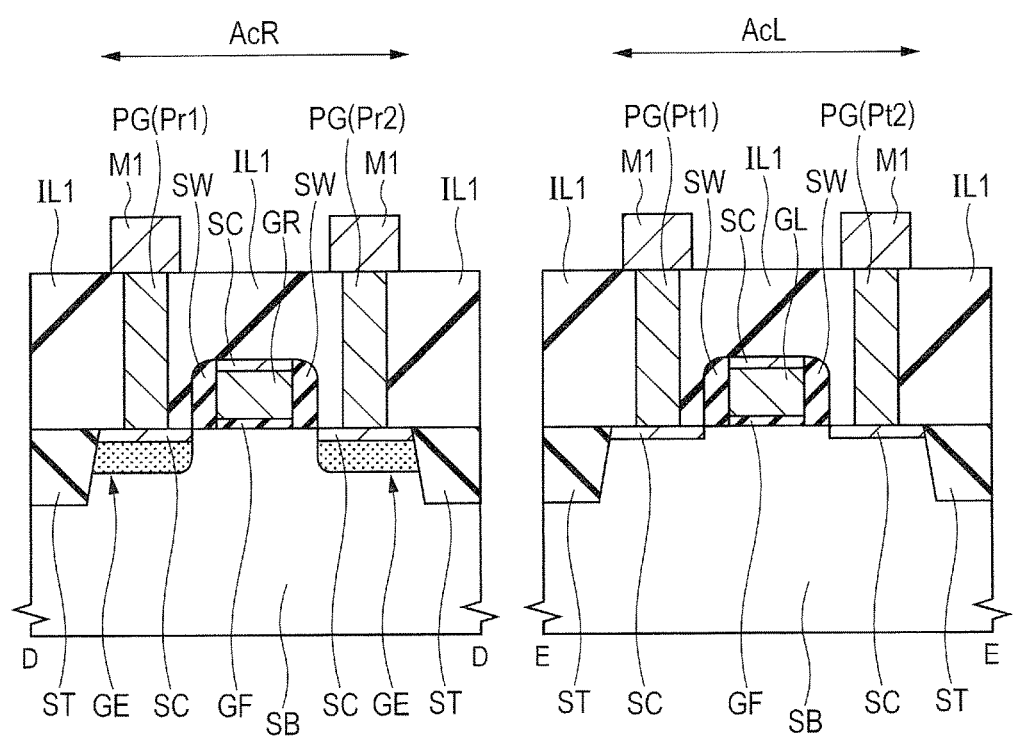
FIG. 54 is a main-portion cross-sectional view of the semiconductor device in the still other embodiment.

FIGS. 50 an 51 are main-portion plan views of a semiconductor device in Embodiment 3. FIGS. 52 to 54 are main-portion cross-sectional views of the semiconductor device in Embodiment 3. FIG. 50 corresponds to FIGS. 6 and 42 described above. FIG. 51 corresponds to FIGS. 10 and 43 described above. FIG. 52 corresponds to FIGS. 14 and 44 described above. FIG. 53 corresponds to FIGS. 15 and 45 described above. FIG. 54 corresponds to FIGS. 16 and 46 described above. Note that the plan views of FIGS. 4, 5, 8, and 9 described above and the cross-sectional views of FIGS. 11 to 13 described above are used also in Embodiment 3.

In the same manner as in FIGS. 6, 10, 42, and 43 described above, in FIGS. 50 and 51 also, the solid lines show the respective outer peripheral positions of the active regions (AcR, AcG, AcTP, and AcAS), hatching shows the region (corresponding to the region denoted by the reference mark GE) where a gettering element is introduced, and the dotted lines show the respective positions of the gate electrodes (GR, GT, GA, and GS).

The semiconductor device in Embodiment 3 has the cross-sectional structure shown in FIGS. 11 to 13 described above and FIGS. 52 to 54. In the same manner as in FIGS. 14 to 16 and 47 to 49 described above, in FIGS. 52 to 54 also, oblique-line hatching in each of the semiconductor substrate SB and the semiconductor regions formed in the semiconductor substrate SB shown in FIGS. 11 to 13 described above is omitted, while the region (corresponding to the region denoted by the reference mark GE) where a gettering element is introduced is hatched with dots. By referring to FIGS. 11 to 13 described above and FIGS. 52 to 54 in combination, it is possible to easily recognize the region of the semiconductor substrate SB where a gettering element is introduced.

The semiconductor device in Embodiment 3 is different from the semiconductor device in Embodiment 2 described in that a gettering element such as carbon (C) is not introduced in the n-type semiconductor region NR (floating diffusion FD).

That is, in Embodiments 1 and 2 described above, in the n-type semiconductor region NR (floating diffusion FD), a gettering element such as carbon (C) is introduced. By contrast, in Embodiment 3, as can be seen from FIGS. 50 to 54 and FIGS. 4, 5, 8, 9, and 11 to 13 described above, in the n-type semiconductor region NR (floating diffusion FD), a gettering element such as carbon (C) is not introduced. From another perspective, in Embodiment 3, in the semiconductor substrate SB in the active region AcTP, a gettering element such as carbon (C) is not introduced.

The semiconductor device in Embodiment 3 is otherwise substantially the same as the semiconductor device in Embodiment 2 described above.

Accordingly, in the same manner as in Embodiment 2 described above, in Embodiment 3 also, a gettering element such as carbon (C) is introduced in the respective source/drain regions SD of the amplification transistor AMI, the selection transistor SEL, and the reset transistor RST. In the same manner as in Embodiment 2 described above, in Embodiment 3 also, a gettering element such as carbon (C) is not introduced in the semiconductor substrate SB in the active region AcG for supplying the ground potential (GND) In the same manner as in Embodiment 2 described above, in Embodiment 3 also, a gettering element such as carbon (C) is not introduced in the source/drain regions (SDL) of the peripheral transistor (LT) in the peripheral circuit region 2A.

From another perspective, in the semiconductor substrate SB in the active region (AcL) in the peripheral circuit region 2A where the peripheral transistor (LT) is formed, a gettering element such as carbon (C) is not introduced.

Figure 55:
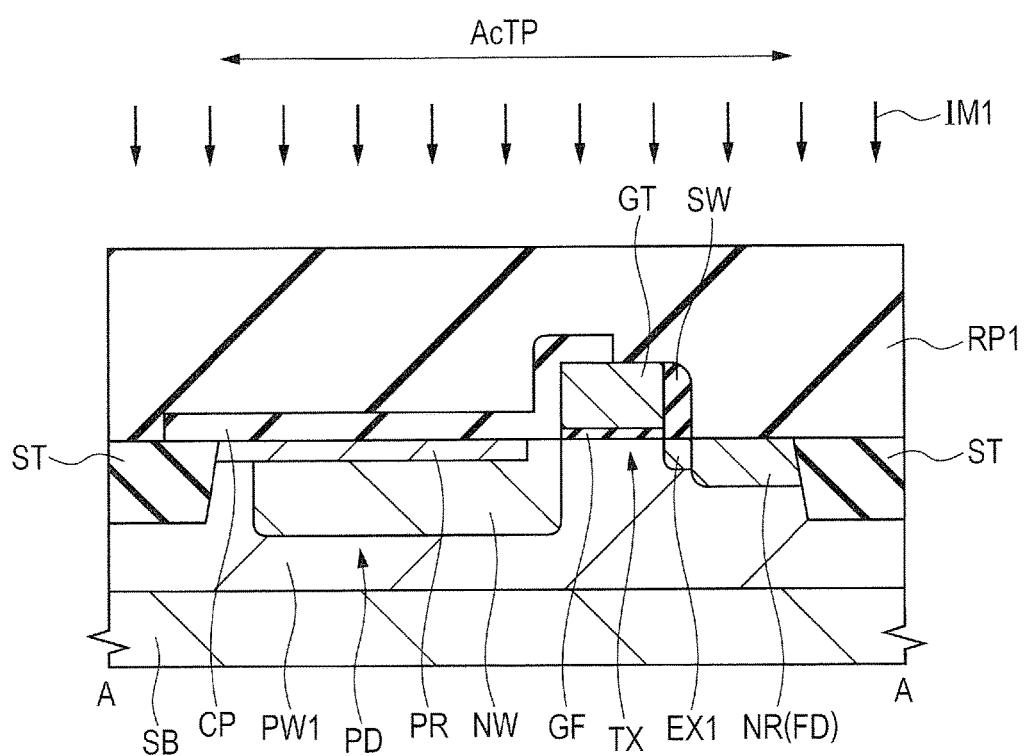
FIG. 55 is a main-portion cross-sectional view of the semiconductor device in the still other embodiment during the manufacturing process thereof.
Figure 56:
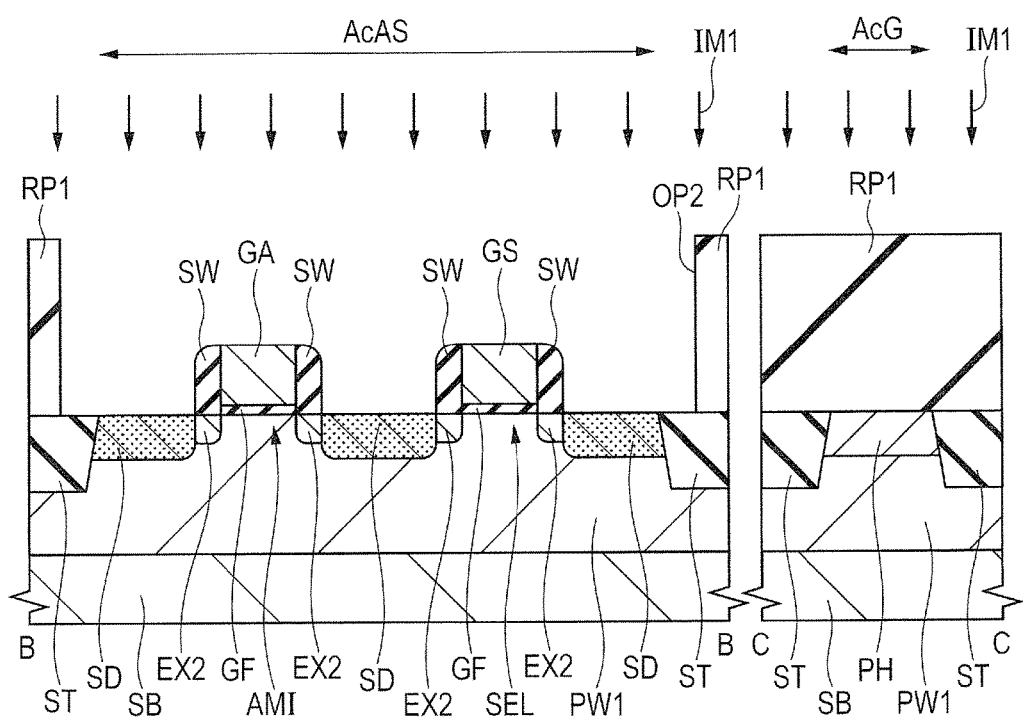
FIG. 56 is a main-portion cross-sectional view of the semiconductor device during the manufacturing process thereof, which is similar to FIG. 55.
Figure 57:
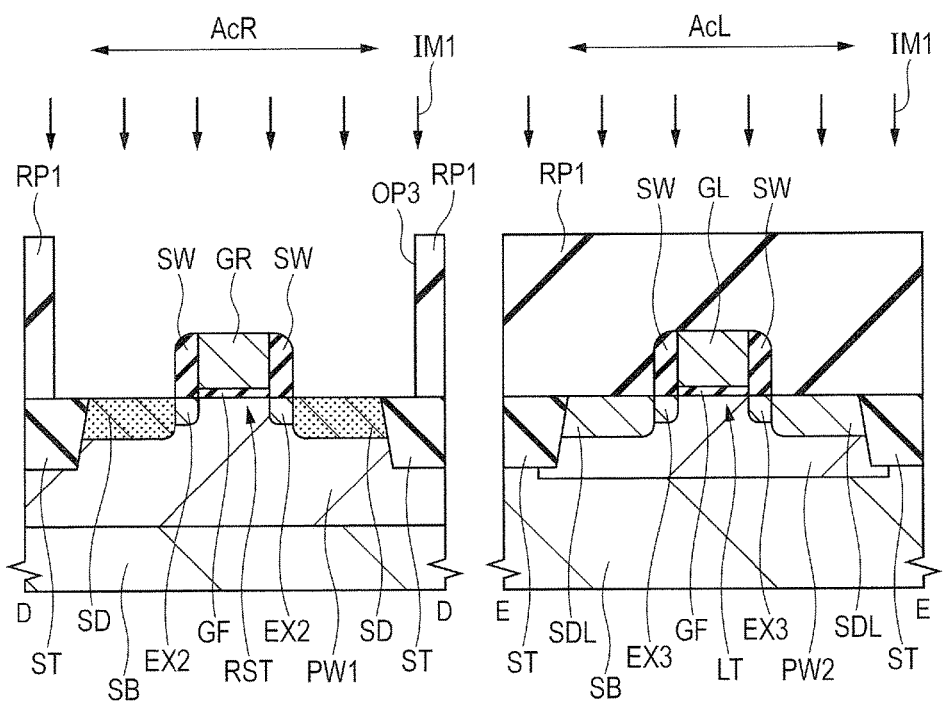
FIG. 57 is a main-portion cross-sectional view of the semiconductor device during the manufacturing process thereof, which is similar to FIG. 55.

FIGS. 55 to 57 are main-portion cross-sectional views of the semiconductor device in Embodiment 3 during the manufacturing process thereof. FIGS. 55 to 57 respectively correspond to FIGS. 29 to 31 described above (or to FIGS. 47 to 49 described above) and correspond to the same process stages as in FIGS. 29 to 31 described above (or FIGS. 47 to 49 described above).

The manufacturing process of the semiconductor device in Embodiment 3 is different from the manufacturing process in each of Embodiments 1 and 2 described above in the layout of the resist pattern RP1 used as the ion implantation blocking mask when the foregoing ion implantation IM1 is performed.

That is, in Embodiment 1 described above, the resist pattern RP1 has the opening OP1 while, in Embodiment 2 described above, the resist pattern RP1 has the openings OP1, OP2, and OP3. However, in Embodiment 3, the resist pattern RP1 has the openings OP2 and OP3, but does not have the opening OP1. Consequently, in Embodiment 3, the active region AcTP in the pixel region 1A is covered with the resist pattern RP1. The resist pattern RP1 in Embodiment 3 is the same as the resist pattern RP1 in Embodiment 2 described above except that the resist pattern RP1 in Embodiment 3 does not have the opening OP1.

In Embodiment 3 also, using the resist pattern RP1 as an ion implantation blocking mask, the ion implantation IM1 is performed in the same manner as in Embodiments 1 and 2 described above. In the same manner as in FIGS. 29 to 31 and 47 to 49 described above, in FIGS. 55 to 57 also, the regions of the semiconductor substrate SB where a gettering element is implanted by the ion implantation 1M1 are hatched with dots.

Embodiment 3 is different from Embodiment 2 described above with regard to the ion implantation IM1 in that, since the resist pattern RP1 does not have the opening OP1 in Embodiment 3, a gettering element is not implanted (introduced) into the n-type semiconductor region NR in the active region AcTP. Embodiment 3 is otherwise the same as Embodiment 2 described above. Accordingly, in the same manner as in Embodiment 2 described above, in Embodiment 3 also, the resist pattern RP1 has the openings OP2 and OP3. Therefore, when the ion implantation IM1 is performed, as can be seen also from FIGS. 55 to 57, a gettering element is implanted (introduced) into the source/drain regions SD of the active regions AcAS and AcR. As a result, in Embodiment 3, in the ion implantation IM1, a gettering element is selectively implanted (introduced) into the source/drain regions SD.

The manufacturing process of the semiconductor device in Embodiment 3 is also otherwise substantially the same as the manufacturing process of the semiconductor device in Embodiment 2 described above. Accordingly, a repeated description thereof is omitted herein.

In Embodiment 3 also, such effects as described above in Embodiments 1 and 2 can be obtained. However, since a gettering element such as carbon (C) is not introduced in the n-type semiconductor region NR (floating diffusion FD), but is introduced in the source/drain regions SD, the effects obtained in Embodiment 3 are different from those obtained in Embodiments 1 and 2 described above, as shown below.

That is, as described above in Embodiments 1 and 2, it can be considered that the effect of preventing the diffusion of contaminant metal into the photodiode PD and preventing the dark-time white spot is reduced to be lower by introducing a gettering element into the source/drain regions SD than by introducing a gettering element into the n-type semiconductor region NR (floating diffusion FD). Accordingly, in Embodiment 3, the effect of reducing the diffusion of contaminant metal into the photodiode PD and reducing the incidence rate of the dark-time white spot can be obtained by introducing a gettering element into the source/drain regions SD. However, the effect is considerably lower than in Embodiment 2 described above and is slightly lower than in Embodiment 1 described above.

In addition, in Embodiment 3, by introducing a gettering element into the source/drain regions SD, the resistance of the metal silicide layer SC formed over each of the source/drain regions SD is increased. On the other hand, in Embodiment 1 described above, by introducing a gettering element into the n-type semiconductor region NR, the resistance of the metal silicide layer SC formed over the n-type semiconductor region NR is increased. Accordingly, the number of the spots where the metal silicide layers SC having increased resistances due to the introduction of a gettering element are present is larger in Embodiment 3 than in Embodiment 1 described above. Consequently, the influence of the increased resistances of the metal silicide layers SC (increased resistances due to the introduction of a gettering element) is larger in Embodiment 3 than in Embodiment 1 described above.

Therefore, in the case where the incidence rate of the dark-time white spot is to be minimized, Embodiment 2 described above is advantageous over Embodiment 1 described above and Embodiment 3. On the other hand, in the case where it is intended to efficiently reduce the incidence rate of the dark-time white spot while minimizing (reducing) the resistance of the metal silicide layer SC, Embodiment 1 described above is advantageous over Embodiment 2 described above and Embodiment 3.

Figure 58:
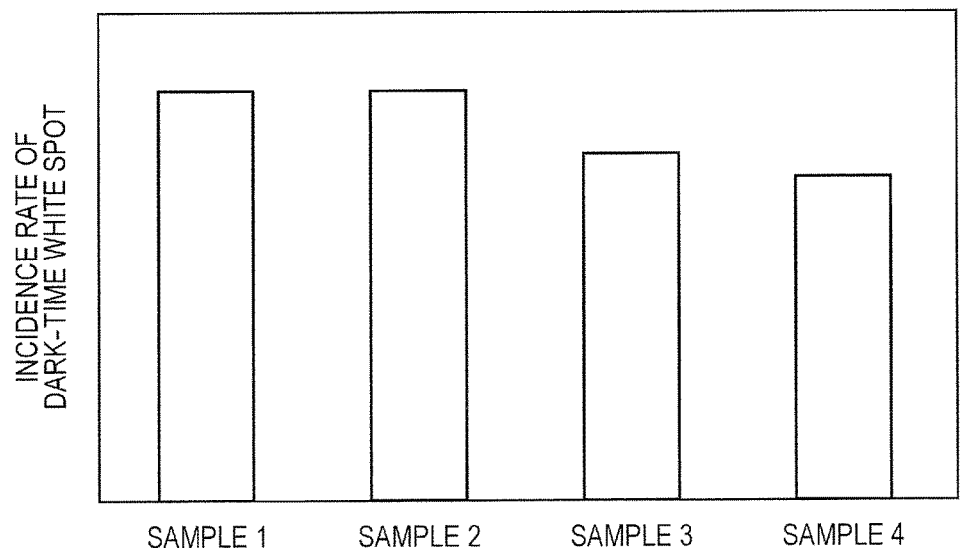
FIG. 58 is a graph showing the incidence rate of a dark-time white spot.
Figure 59:
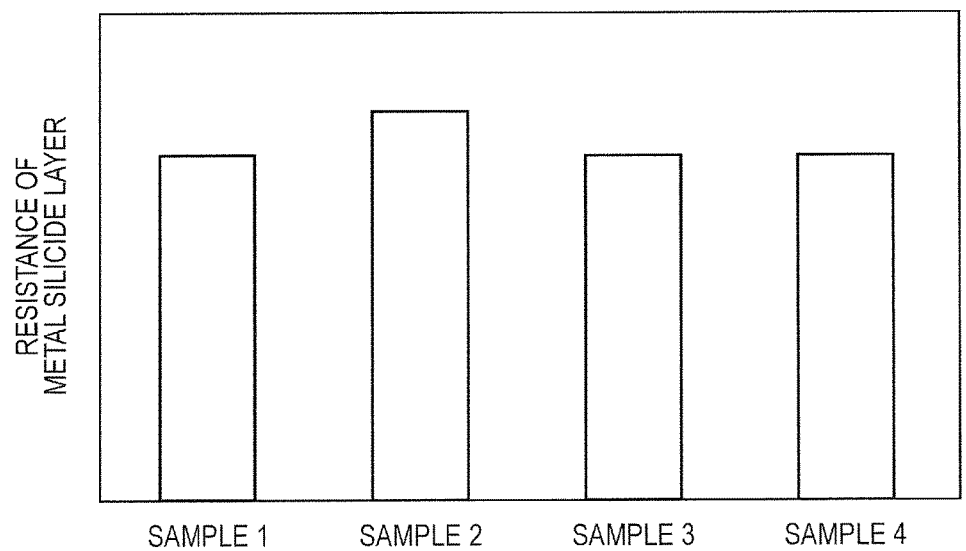
FIG. 59 is a graph showing the resistance of a metal silicide layer.
Figure 60:
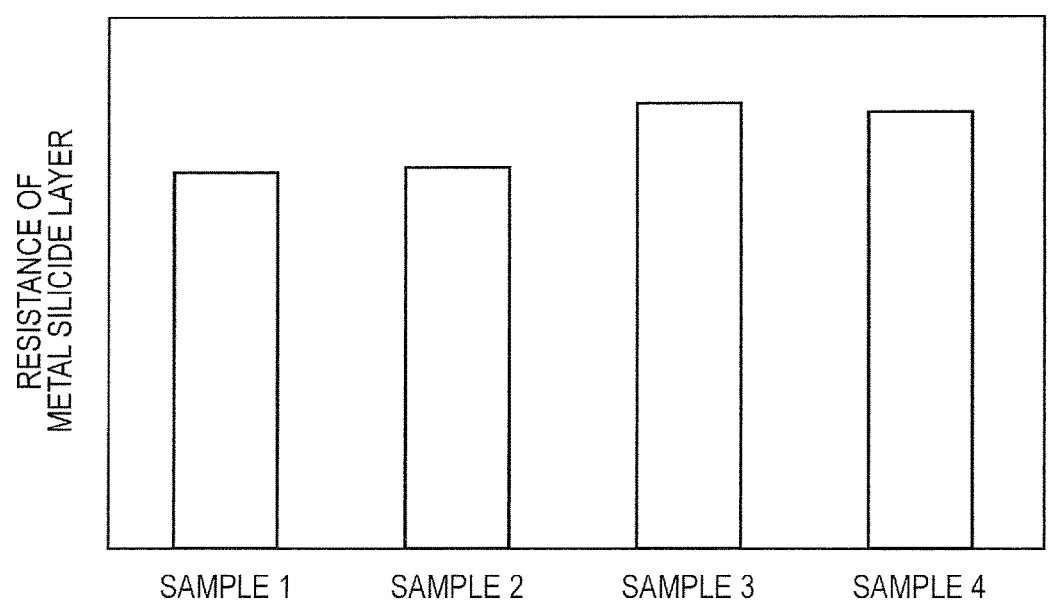
FIG. 60 is a graph showing the resistance of the metal silicide layer.

FIGS. 58 to 60 show the result of the experiment performed by the present inventors.

FIG. 58 is a graph showing the result of examining the incidence rates of the dark-time white spot in Samples 1 to 4. The ordinate axis in FIG. 58 corresponds to the incidence rates of the dark-time white spot, which have been normalized to the incidence rate of the dark-time white spot in Sample 1. FIG. 59 is a graph showing the respective resistances (sheet resistances) of the metal silicide layers (SC) formed over the semiconductor substrates SB (i.e., over the p-type semiconductor regions) in the active regions AcG in Samples 1 to 4. FIG. 60 is a graph showing the respective resistances (sheet resistances) of the metal silicide layers (SC) formed over the source/drain regions SD (i.e., over the n-type semiconductor regions) in Samples 1 to 4.

Sample 1 shown in FIGS. 58 to 60 corresponds to the case where a gettering element such as carbon (C) is introduced in none of the n-type semiconductor region NR (floating diffusion FD), the source/drain regions SD, and the semiconductor substrate SE in the active region AcG. Sample 1 corresponds to a first comparative example. Sample 2 shown in FIGS. 58 to 60 corresponds to the case where a gettering element such as carbon (C) is introduced neither in the n-type semiconductor region NR (floating diffusion FD) nor in the source/drain regions SD, but is introduced in the semiconductor substrate SB in the active region AcG. Sample 2 corresponds to a second comparative example. Sample 3 shown in FIGS. 58 to 60 corresponds to the case where a gettering element such as carbon (C) is introduced neither in the n-type semiconductor region NR (floating diffusion FD) nor in the semiconductor substrate SB in the active region AcG, but is introduced in the source/drain regions SD. Sample 3 corresponds to Embodiment 3. Sample 4 shown in FIGS. 58 to 60 corresponds to the case where a gettering element such as carbon (C) is not introduced in the semiconductor substrate SB in the active region AcG, but is introduced in each of the n-type semiconductor region NR (floating diffusion FD) and the source/drain regions SD. Sample 4 corresponds to Embodiment 2.

Referring to the graphs of FIGS. 59 and 60 leads to the following findings.

That is, in Samples 1 and 2, the incidence rate of the dark-time white spot is substantially the same. From the foregoing, it can be seen that, even when a gettering element such as carbon (C) is introduced into the semiconductor substrate SB in the active region AcG, the effect of reducing the incidence rate of the dark-time white spot can scarcely be obtained. In contrast to Samples 1 and 2, in Sample 3, the incidence rate of the dark-time white spot is significantly reduced while, in Sample 4, the incidence rate of the dark-time white spot is further reduced. From the foregoing, it can be seen that each of the introduction of a gettering element such as carbon (C) into the n-type semiconductor region NR (floating diffusion FD) and the introduction of a gettering element such as carbon (C) into the source/drain regions SD has the effect of reducing the incidence rate of the dark-time white spot.

Referring to the graphs of FIGS. 59 and 60 leads to the following finding.

That is, as shown in FIG. 59, in Sample 2 in which carbon (C) is introduced as a gettering element in the semiconductor substrate SB in the active region AcG, the resistance of the metal silicide layer (SC) formed over the semiconductor substrate SB in the active region AcG is significantly increased compared to that in each of Samples 1, 3, and 4 in which a gettering element such as carbon (C) is not introduced in the semiconductor substrate SB in the active region AcG. Also, as shown in FIG. 60, in Samples 3 and 4 in which carbon (C) is introduced as a gettering element in the source/drain regions SD, the resistance of the metal silicide layer (SC) formed over each of the source/drain regions SD is significantly increased compared to that in each of Samples 1 and 2 in which a gettering element such as carbon (C) is not introduced in the source/drain regions SD. From the foregoing, it can be seen that, in the case of forming the metal silicide layer (SC) over a semiconductor region where a gettering element such as carbon (C) is introduced, due to the gettering element contained in the semiconductor region, the resistance of the formed metal silicide layer increases.

On the basis of these findings, in Embodiments 1 to 3, into either or both of the n-type semiconductor regions NR (floating diffusion SD) and the source/drain regions SD where a reduction in the incidence rate of the dark-time white spot can be expected by introducing a gettering element, a gettering element such as carbon (C) is introduced to thus achieve a reduction in the incidence rate of the dark-time white spot. On the other hand, into the active region AcG where the introduction of a gettering element scarcely affects the incidence rate of the dark-time white spot, a gettering element such as carbon (C) is not introduced to thus avoid an increase in the resistance (resistance increase due to the introduction of a gettering element) of the metal silicide layer SC formed over the active region AcG. Thus, it is possible to simultaneously achieve a reduction in the incidence rate of the dark-time white spot and a reduction in the resistance of the metal silicide layer SC. Therefore, it is possible to improve the performance of the semiconductor device.

While the invention achieved by the present inventors has been specifically described heretofore on the basis of the embodiments thereof, the present invention is not limited to the foregoing embodiment. It will be appreciated that various changes and modifications can be made in the invention within the scope not departing from the gist thereof.

What is claimed is:

1. A semiconductor device, comprising:
a pixel which includes:
first and second active regions each formed in a first main surface of a semiconductor substrate and surrounded by an isolation region in plan view;
a photodiode formed in the first active region; and
a transfer transistor formed in the first active region to transfer charges generated by the photodiode,
wherein, in the semiconductor substrate, a p-type semiconductor region is formed so as to include the first and second active regions in plan view,
wherein, over the p-type semiconductor region in the second active region, a contact portion for supplying a grounding potential is formed and electrically coupled to the p-type semiconductor region,
wherein the photodiode has a first n-type semiconductor region which is formed in the p-type semiconductor region in the first active region,
wherein the transfer transistor has a second n-type semiconductor region which is formed in the p-type semiconductor region in the first active region to function as a drain region of the transfer transistor,
wherein the first n-type semiconductor region functions also as a source region of the transfer transistor, and
wherein, in the second n-type semiconductor region, a gettering element is introduced while, in the p-type semiconductor region in the second active region, the gettering element is not introduced.

2. The semiconductor device according to claim 1,
wherein, over the p-type semiconductor region in the second active region, a first metal silicide layer is formed,
wherein, over the first metal silicide layer, the contact portion is formed, and
wherein the contact portion is electrically coupled to the p-type semiconductor region via the first metal silicide layer.

3. The semiconductor device according to claim 1,
wherein the gettering element is carbon.

4. The semiconductor device according to claim 1,
wherein, in plan view, between the first and second n-type semiconductor regions, the isolation region is not interposed.

5. The semiconductor device according to claim 1,
wherein the pixel further includes:
a third active region formed in the first main surface of the semiconductor substrate and surrounded by the isolation region in plan view; and
a pixel transistor formed in the third active region,
wherein the p-type semiconductor region is formed in the semiconductor substrate so as to include the first, second, and third active regions in plan view,
wherein the pixel transistor has a third n-type semiconductor region formed in the p-type semiconductor region in the third active region to function as a source or drain region of the pixel transistor, and
wherein in the third n-type semiconductor region, the gettering element is not introduced.

6. The semiconductor device according to claim 5,
wherein, over the third n-type semiconductor region, a second metal silicide layer is formed.

7. The semiconductor device according to claim 1,
wherein the pixel further includes:
a third active region formed in the first main surface of the semiconductor substrate and surrounded by the isolation region in plan view; and
a pixel transistor formed in the third active region,
wherein the p-type semiconductor region is formed in the semiconductor substrate so as to include the first, second, and third active regions in plan view,
wherein the pixel transistor has a third n-type semiconductor region formed in the p-type semiconductor region in the third active region so as to function as a source or drain region of the pixel transistor, and
wherein, in the third n-type semiconductor region also, the gettering element is introduced.

8. The semiconductor device according to claim 7,
wherein, over the third n-type semiconductor region, a second metal silicide layer is formed.

9. The semiconductor device according to claim 1,
wherein, in the first n-type semiconductor region, the gettering element is not introduced.

10. The semiconductor device according to claim 1,
wherein, over the first main surface of the semiconductor substrate, a plurality of the pixels are arranged in the form of an array.

11. The semiconductor device according to claim 1,
wherein, over the first main surface of the semiconductor substrate, an interlayer insulating film is formed, and
wherein the contact portion is a conductive plug embedded in the interlayer insulating film.

12. A semiconductor device, comprising:
a pixel which includes:
first, second, and third active regions each formed in a first main surface of a semiconductor substrate and surrounded by an isolation region in plan view;
a photodiode formed in the first active region;
a transfer transistor formed in the first active region to transfer charges generated by the photodiode; and
a pixel transistor formed in the third active region,
wherein, in the semiconductor substrate, a p-type semiconductor region is formed so as to include the first, second, and third active regions in plan view,
wherein, over the p-type semiconductor region in the second active region, a contact portion for supplying a grounding potential is formed and electrically coupled to the p-type semiconductor region,
wherein the photodiode has a first n-type semiconductor region formed in the p-type semiconductor region in the first active region,
wherein the transfer transistor has a second n-type semiconductor region formed in the p-type semiconductor region in the first active region to function as a drain region of the transfer transistor,
wherein the pixel transistor has a third n-type semiconductor region formed in the p-type semiconductor region in the third active region to function as a source or drain region of the pixel transistor,
wherein the first n-type semiconductor region functions also as a source region of the transfer transistor, and
wherein, in the third n-type semiconductor region, a gettering element is introduced while, in the p-type semiconductor region in the second active region, the gettering element is not introduced.

13. The semiconductor device according to claim 12,
wherein, over the p-type semiconductor region in the second active region, a first metal silicide layer is formed,
wherein, over the first metal silicide layer, the contact portion is formed, and
wherein the contact portion is electrically coupled to the p-type semiconductor region via the first metal silicide layer.

14. The semiconductor device according to claim 12, wherein the gettering element is carbon.

15. The semiconductor device according to claim 12, wherein, in the second n-type semiconductor region also, the gettering element is introduced.

16. The semiconductor device according to claim 12, wherein, in the second n-type semiconductor region, the gettering element is not introduced.

17. The semiconductor device according to claim 12, wherein, over the third n-type semiconductor region, a second metal silicide layer is formed.

18. The semiconductor device according to claim 12, wherein, in the first n-type semiconductor region, the gettering element is not introduced.

19. The semiconductor device according to claim 1, wherein the gettering element is introduced in the form of carbon ions or carbon cluster ions by ion implantation.

20. A semiconductor device, comprising:
a pixel which includes:
first and second active regions each formed in a first main surface of a semiconductor substrate and surrounded by an isolation region in plan view;
a photodiode formed in the first active region; and
a transfer transistor formed in the first active region to transfer charges generated by the photodiode,
wherein, in the semiconductor substrate, a p-type semiconductor region is formed so as to include the first and second active regions in plan view,
wherein, over the p-type semiconductor region in the second active region, a contact portion for supplying a grounding potential is formed and electrically coupled to the p-type semiconductor region,
wherein the photodiode has a first n-type semiconductor region which is formed in the p-type semiconductor region in the first active region,
wherein the transfer transistor has a second n-type semiconductor region which is formed in the p-type semiconductor region in the first active region to function as a drain region of the transfer transistor,
wherein the transfer transistor has a third n-type semiconductor region which is formed in the p-type semiconductor region in the first active region to function as an extension region of the transfer transistor,
wherein the first n-type semiconductor region functions also as a source region of the transfer transistor,
wherein the second n-type semiconductor region is located adjacent to the third n-type semiconductor region, and
wherein, in the second n-type semiconductor region, a gettering element is introduced while, in the p-type semiconductor region in the second active region, the gettering element is not introduced.

* * * * *